(12) United States Patent
Ishimatsu

(10) Patent No.: US 12,052,014 B2
(45) Date of Patent: Jul. 30, 2024

(54) SEMICONDUCTOR DEVICE

(71) Applicant: ROHM CO., LTD., Kyoto (JP)

(72) Inventor: Yuji Ishimatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 119 days.

(21) Appl. No.: 17/846,856

(22) Filed: Jun. 22, 2022

(65) Prior Publication Data

US 2022/0321118 A1 Oct. 6, 2022

Related U.S. Application Data

(63) Continuation of application No. 17/042,649, filed as application No. PCT/JP2019/020747 on May 24, 2019, now Pat. No. 11,398,818.

(30) Foreign Application Priority Data

Jun. 4, 2018 (JP) .................................. 2018-106986

(51) Int. Cl.
 *H01L 25/07* (2006.01)
 *H02M 7/48* (2007.01)
 (Continued)

(52) U.S. Cl.
 CPC ......... *H03K 17/165* (2013.01); *H01L 25/071* (2013.01); *H02M 7/48* (2013.01); *H01L 23/49833* (2013.01); *H01L 23/49861* (2013.01)

(58) Field of Classification Search
 CPC ............... H02M 7/48; H01L 23/49833; H01L 23/49861; H01L 25/07; H01L 25/071; H03K 17/16; H03K 17/165
 See application file for complete search history.

(56) References Cited

U.S. PATENT DOCUMENTS

| 11,398,818 | B2 * | 7/2022 | Ishimatsu | ............... H01L 25/18 |
| 11,437,354 | B2 * | 9/2022 | Ishimatsu | ......... H01L 23/49575 |

(Continued)

FOREIGN PATENT DOCUMENTS

| JP | 2015002185 A | 1/2015 |
| JP | 2015220429 A | 12/2015 |

(Continued)

OTHER PUBLICATIONS

Notice of Reasons for Refusal issued for Japanese Patent Application No. 2022-149383, Dispatch Date: Jun. 20, 2023, 8 pages including English machine translation.

(Continued)

*Primary Examiner* — Adolf D Berhane
(74) *Attorney, Agent, or Firm* — HSML P.C.

(57) ABSTRACT

A semiconductor device includes an inverter circuit having a first switching element and a second switching element, a first control circuit, a second control circuit, and a limiting unit. The first switching element is supplied with a power supply voltage. The second switching element includes a first terminal connected to the first switching element, a second terminal connected to ground, and a control terminal. The first control circuit controls the first switching element. The second control circuit controls the second switching element. The limiting unit reduces fluctuation in voltage between the second terminal and the control terminal based on voltage fluctuation at the second terminal of the second switching element.

15 Claims, 36 Drawing Sheets

(51) Int. Cl.
*H03K 17/16* (2006.01)
*H01L 23/498* (2006.01)

(56) References Cited

U.S. PATENT DOCUMENTS

| | | | |
|---|---|---|---|
| 11,682,975 B2* | 6/2023 | Ishimatsu | H02M 7/537 363/16 |
| 2008/0002445 A1 | 1/2008 | Cho et al. | |
| 2014/0367846 A1 | 12/2014 | Nakagawa et al. | |
| 2014/0374889 A1 | 12/2014 | Denta et al. | |
| 2015/0222262 A1 | 8/2015 | Hanamura et al. | |
| 2015/0340350 A1 | 11/2015 | Koga | |
| 2015/0380393 A1 | 12/2015 | Nakamura et al. | |
| 2016/0105175 A1 | 4/2016 | Ishimatsu et al. | |
| 2016/0164413 A1 | 6/2016 | Akiyama | |
| 2017/0033035 A1 | 2/2017 | Sato et al. | |
| 2018/0331647 A1 | 11/2018 | Matsuzaki et al. | |

FOREIGN PATENT DOCUMENTS

| | | |
|---|---|---|
| JP | 2016082281 | 5/2016 |
| JP | 2017034079 A | 2/2017 |
| WO | 2013187120 A1 | 12/2013 |
| WO | 2014192298 | 12/2014 |
| WO | 2017086054 | 5/2017 |

OTHER PUBLICATIONS

International Search Report and Written Opinion issued for International Patent Application No. PCT/JP2019/020747, Date of mailing: Aug. 20, 2019, 10 pages including English translation of Search Report.

Office Action issued for Japanese Patent Application No. 2020-523636, Dispatch Date: Jun. 22, 2021, 6 pages Including English translation.

Office Action issued for Japanese Patent Application No. 2020-523636, Dispatch Date: Feb. 1, 2022, 4 pages Including English machine translation.

Office Action issued for Chinese Patent Application No. 201980037026.4, dated Oct. 30, 2023, 11 pages including partial English translation.

* cited by examiner

SEMICONDUCTOR DEVICE

TECHNICAL FIELD

The present invention relates to a semiconductor device.

BACKGROUND ART

A semiconductor device that is being developed is integrated into a single package by mounting an inverter circuit and a control circuit on a lead frame. The inverter circuit includes a first switching element, which is supplied with a power supply voltage, and a second switching element, which is connected in series with the first switching element. The control circuit controls ON/OFF of each switching element (see e.g., Patent Document 1).

PRIOR ART DOCUMENT

Patent Document

Patent Document 1: Japanese Laid-Open Patent Publication No. 2016-82281

SUMMARY OF INVENTION

Technical Problems

In the semiconductor device described above, the second switching element and the lead frame are electrically connected by a bonding wire. The electrical characteristics of the second switching element may fluctuate due to the negative bias applied by the influence of the inductance of the bonding wire.

It is an object of the present invention is to provide a semiconductor device capable of reducing fluctuations in electrical characteristics.

Solutions to Problems

A semiconductor device that solves the above problem includes an inverter circuit, which has a first switching element and a second switching element, a first control circuit, a second control circuit, and a limiting unit. The first switching element is supplied with a power supply voltage. The second switching element includes a first terminal connected to the first switching element, a second terminal connected to ground, and a control terminal. The first control circuit controls the first switching element. The second control circuit controls the second switching element. The limiting unit reduces fluctuation in voltage between the second terminal and the control terminal based on voltage fluctuation at the second terminal of the second switching element.

The semiconductor device that solves the problem described above includes a inverter circuit, which has a first switching element and a second switching element, and a limiting unit. The first switching element is supplied with a power supply voltage. The second switching element includes a first terminal connected to the first switching element, a second terminal connected to ground, and a control terminal. The limiting unit reduces fluctuation in the potential at the second terminal of the second switching element when the first switching element is turned on.

Advantageous Effects of Invention

According to the semiconductor device described above, fluctuation in the electrical characteristics can be reduced.

DESCRIPTION OF EMBODIMENTS

Hereinafter, embodiments of a semiconductor device will now be described with reference to the drawings. The embodiments described below exemplify configurations and methods embodying technical concepts and are not intended to limit the material, shape, structure, arrangement, dimension, and the like of each component. Various modifications can be made to the following embodiments.

In the present description, "a state in which a member A is connected to a member B" includes a case where the member A and the member B are physically and directly connected in addition to a case where the member A and the member B are indirectly connected through another member that does not affect the electrical connection state.

Similarly, "a state in which a member C is provided between the member A and the member B" includes a case where the member A and the member C or the member B and the member C are directly connected in addition to a case where the member A and the member C, or the member B and the member C are indirectly connected through another member that does not affect the electrical connection state.

First Embodiment

Figure 1:
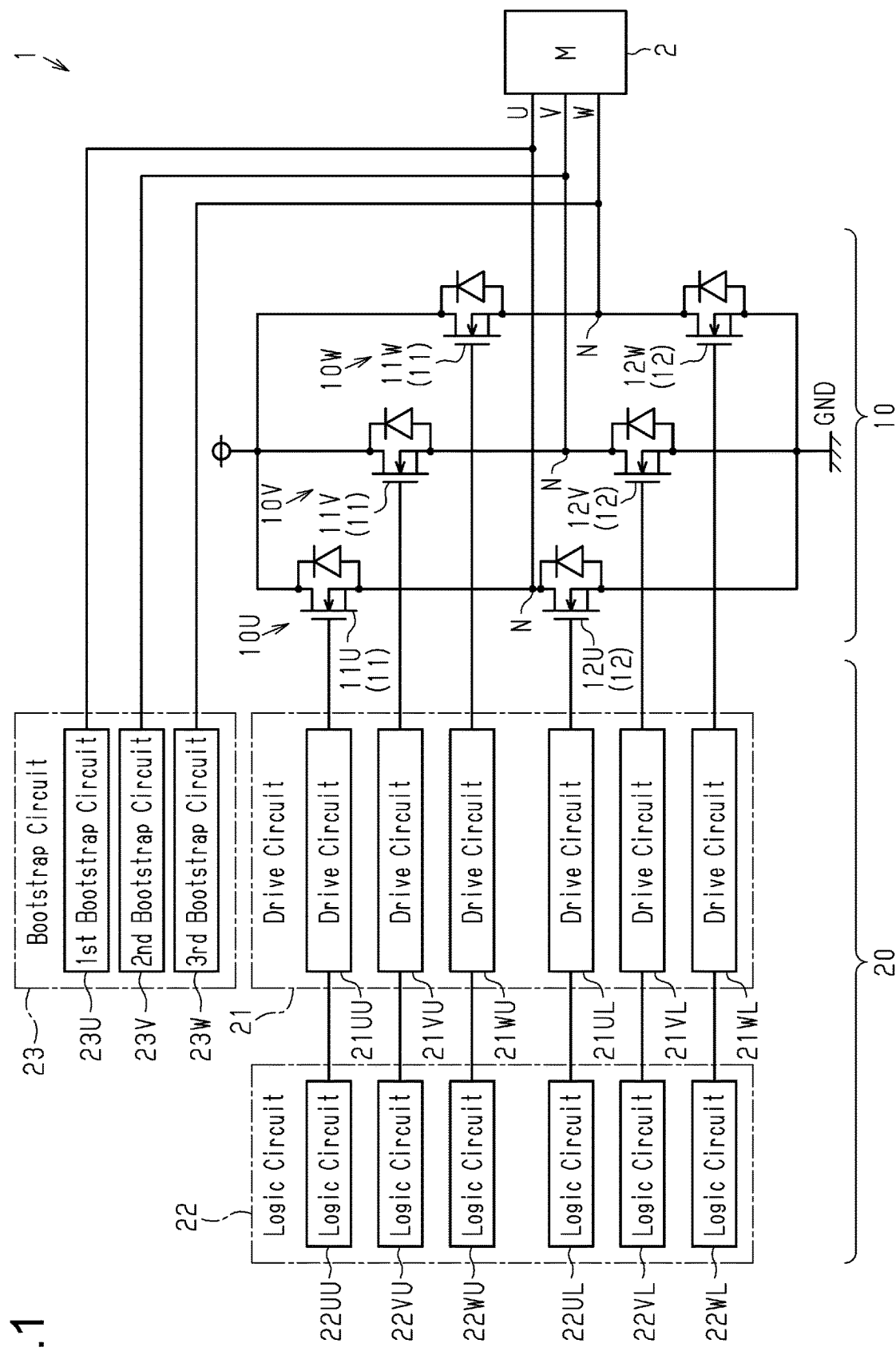
FIG. 1 is a block diagram showing the electrical configuration of a semiconductor device in accordance with a first embodiment.

As shown in FIG. 1, the semiconductor device 1 forms an inverter circuit for driving the motor 2 and includes a drive unit 10 having three inverter circuits, namely, a first inverter circuit 10U, a second inverter circuit 10V, and a third inverter circuit 10W. The semiconductor device 1 further includes a control circuit 20 that controls the drive unit 10. The inverter circuits 10U, 10V, and 10W are connected in parallel to one another. One example of the motor 2 is a three-phase brushless motor.

Each inverter circuit 10U, 10V, 10W includes a first switching element 11 and a second switching element 12. The first switching element 11 and the second switching element 12 are connected in series. The first switching element 11 includes a first terminal supplied with a power supply voltage, a second terminal connected to the second switching element 12, and a control terminal. The second switching element 12 includes a first terminal connected to the second terminal of the first switching element 11, a second terminal connected to ground, and a control terminal. One example of the first switching element 11 and the second switching element 12 is a metal-oxide-semiconductor field-effect transistor (MOSFET). Hereinafter, the first switching element 11 of the first inverter circuit 10U will be described as a MOSFET 11U, the first switching element 11 of the second inverter circuit 10V as a MOSFET 11V, and the first switching element 11 of the third inverter circuit 10W as a MOSFET 11W. The second switching element 12 of the first inverter circuit 10U will be described as a MOSFET 12U, the second switching element 12 of the second inverter circuit 10V as a MOSFET 12V, and the second switching element 12 of the third inverter circuit 10W as a MOSFET 12W. In the present embodiment, N-channel MOSFETs are used as the MOSFETs 11U to 11W and 12U to 12W. The drain of each of the MOSFETs 11U to 11W is an example of the first terminal of the first switching element 11, the source of each of the MOSFETs 11U to 11W is an example of the second terminal of the first switching element 11, and the gate of each of the MOSFETs 11U to 11W is an example of the control terminal of the first switching element 11. The drain of each of the MOSFETs 12U to 12W is an example of the first terminal of the second switching element 12, the source of each of the MOSFETs 12U to 12W is an example of the second terminal of the second switching element 12, and the gate of each of the MOSFETs 12U to 12W is an example of the control terminal of the second switching element 12.

The MOSFET 11U and the MOSFET 12U are connected in series with each other. That is, the source of the MOSFET 11U and the drain of the MOSFET 12U are connected to each other. A node N between the source of the MOSFET 11U and the drain of the MOSFET 12U is electrically connected to a U-phase coil (not shown) of the motor 2.

The MOSFET 11V and the MOSFET 12V are connected in series with each other. That is, the source of the MOSFET 11V and the drain of the MOSFET 12V are connected to each other. A node N between the source of the MOSFET 11V and the drain of the MOSFET 12V is electrically connected to a V-phase coil (not shown) of the motor 2.

The MOSFET 11W and the MOSFET 12W are connected in series with each other. That is, the source of the MOSFET 11W and the drain of the MOSFET 12W are connected to each other. A node N between the source of the MOSFET 11W and the drain of the MOSFET 12W is electrically connected to a W-phase coil (not shown) of the motor 2.

The drains of the MOSFETs 11U to 11W are connected to each other. The drains of the MOSFETs 11U to 11W are electrically connected to an external power supply. The sources of the MOSFETs 12U to 12W are connected to each other. The sources of the MOSFETs 12U to 12W are connected to ground GND. The gates of the MOSFETs 11U to 11W and the gates of the MOSFETs 12U to 12W are electrically connected to the control circuit 20, respectively.

The current flowing through each of the MOSFETs 11U to 11W and the MOSFETs 12U to 12W is preferably less than 30 A. In the present embodiment, the current flowing through each of the MOSFETs 11U to 11W and the MOSFETs 12U to 12W is about 15 A.

The control circuit 20 includes a drive circuit 21 serving as an example of a drive signal output circuit that outputs drive signals to the gates of the MOSFETs 11U to 11W and the gates of the MOSFETs 12U to 12W, a logic circuit 22 that controls the drive circuit 21, and a bootstrap circuit 23 that generates a drive power for the high potential block of the drive circuit 21 and the logic circuit 22. The control circuit 20 includes a drive circuit 21, a logic circuit 22, and a bootstrap circuit 23 corresponding to each of the MOSFETs 11U to 11W and the MOSFETs 12U to 12W.

The drive circuit 21 includes drive circuits 21UU, 21VU, and 21WU for controlling the gates of the high potential side MOSFETs 11U to 11W, and drive circuits 21UL, 21VL, and 21WL for controlling the gates of the low potential side MOSFETs 12U to 12W.

The drive circuit 21UU is electrically connected to the gate of the MOSFET 11U and outputs a drive signal to the gate. The drive circuit 21VU is electrically connected to the gate of the MOSFET 11V and outputs a drive signal to the gate. The drive circuit 21WU is electrically connected to the gate of the MOSFET 11W, and outputs a drive signal to the gate.

The drive circuit 21UL is electrically connected to the gate of MOSFET 12U and outputs a drive signal to the gate. The drive circuit 21VL is electrically connected to the gate of the MOSFET 12V and outputs a drive signal to the gate. The drive circuit 21WL is electrically connected to the gate of MOSFET 12W and outputs a drive signal to the gate.

The logic circuit 22 includes logic circuits 22UU, 22VU, 22WU that control the drive circuits 21UU, 21VU, and 21WU for controlling the gates of the high potential side MOSFETs 11U to 11W, and logic circuits 22UL, 22VL, 22WL that control the drive circuits 21UL, 21VL and 21WL for controlling the gates of the low potential side MOSFETs 12U to 12W.

The logic circuit 22UU is electrically connected to the drive circuit 21UU and outputs a signal to the drive circuit 21UU so that the drive circuit 21UU generates a drive signal output to the gate of the MOSFET 11U. The logic circuit 22VU is electrically connected to the drive circuit 21VU and outputs a signal to the drive circuit 21VU so that the drive circuit 21VU generates a drive signal output to the gate of the MOSFET 11V. The logic circuit 22WU is electrically connected to the drive circuit 21WU and outputs a signal to the drive circuit 21WU so that the drive circuit 21WU generates a drive signal output to the gate of the MOSFET 11W.

The logic circuit 22UL is electrically connected to the drive circuit 21UL and outputs a signal to the drive circuit 21UL so that the drive circuit 21UL generates a drive signal output to the gate of the MOSFET 12U. The logic circuit 22VL is electrically connected to the drive circuit 21VL and outputs a signal to the drive circuit 21VL so that the drive circuit 21VL generates a drive signal output to the gate of the MOSFET 12V. The logic circuit 22WL is electrically connected to the drive circuit 21WL and outputs a signal to the drive circuit 21WL so that the drive circuit 21WL generates a drive signal output to the gate of the MOSFET 12W.

The bootstrap circuit 23 includes a first bootstrap circuit 23U, a second bootstrap circuit 23V, and a third bootstrap circuit 23W. The bootstrap circuits 23U, 23V, 23W have the same configuration in which a boot diode and a boot capacitor are connected in series.

The first bootstrap circuit 23U is electrically connected to the source of the MOSFET 11U, the drive circuit 21UU, and the logic circuit 22UU. The first bootstrap circuit 23U generates a drive voltage for the drive circuit 21UU and the logic circuit 22UU.

The second bootstrap circuit 23V is electrically connected to the source of the MOSFET 11V, the drive circuit 21VU, and the logic circuit 22VU. The second bootstrap circuit 23V generates a drive voltage for the drive circuit 21VU and the logic circuit 22VU.

The third bootstrap circuit 23W is electrically connected to the source of the MOSFET 11W, the drive circuit 21WU, and the logic circuit 22WU. The third bootstrap circuit 23W generates a drive voltage for the drive circuit 21WU and the logic circuit 22WU.

In the present embodiment, the drive circuits 21UU, 21VU, 21WU and the logic circuits 22UU, 22VU, 22WU are an example of a first control circuit that controls the first switching element 11. The drive circuits 21UL, 21VL, 21WL and the logic circuits 22UL, 22VL, 22WL are an example of a second control circuit that controls the second switching element 12. Furthermore, the drive circuit 21UL and the logic circuit 22UL are an example of a third control circuit that controls the second switching element 12 (MOSFET 12U) of the first inverter circuit. The drive circuit 21VL and the logic circuit 22VL are an example of a fourth control circuit that controls the second switching element 12 (MOSFET 12V) of the second inverter circuit. The drive circuit 21WL and the logic circuit 22WL are an example of a fifth control circuit that controls the second switching element 12 (MOSFET 12W) of the third inverter circuit.

One example of the configuration of the semiconductor device 1 will now be described with reference to FIGS. 2 to 6.

Figure 2:
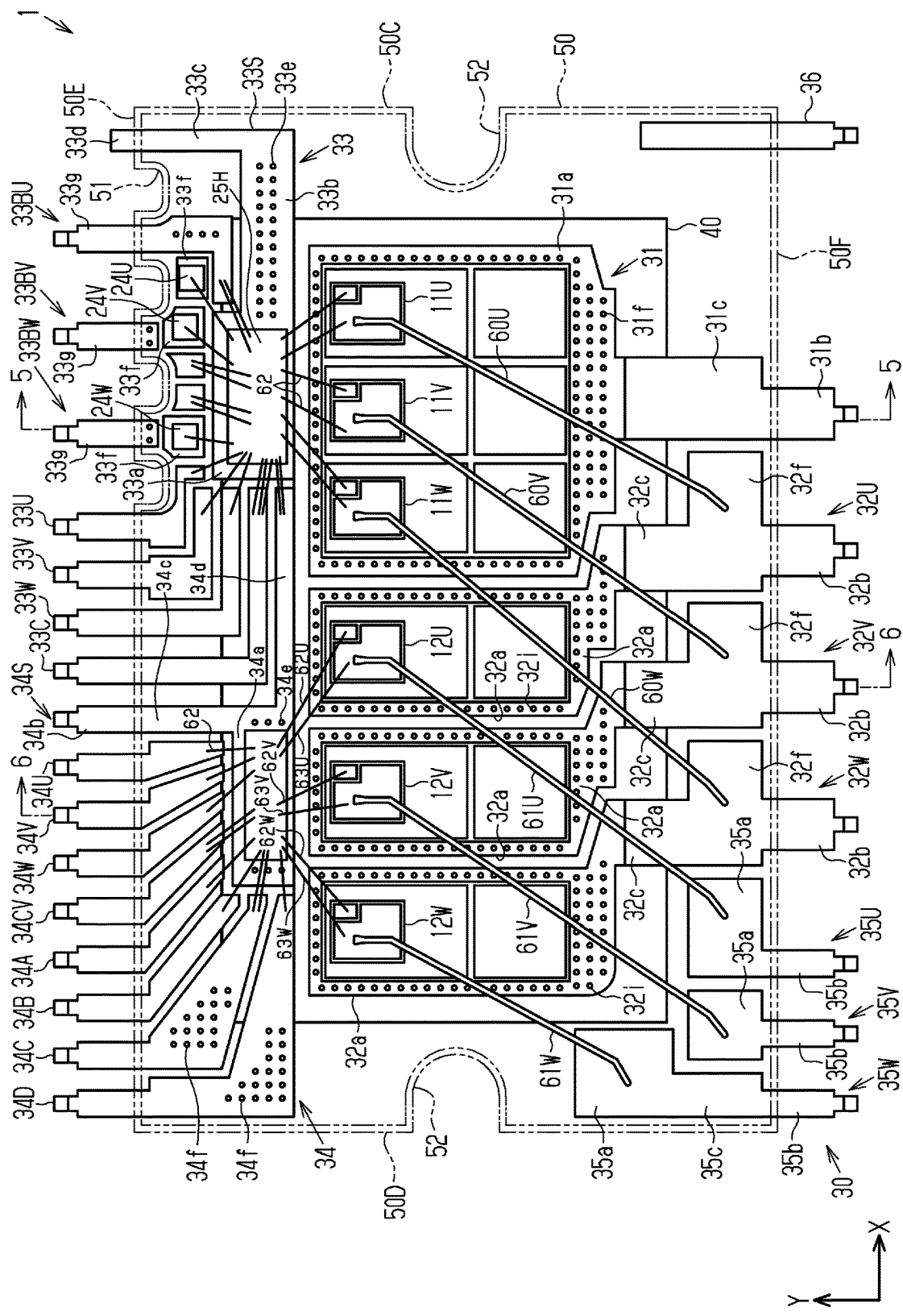
FIG. 2 is a plan view showing the layout inside a semiconductor device.

The semiconductor device 1 further includes a lead 30, a heat dissipation member 40, and an encapsulation resin 50 (double-dashed line in FIG. 2). The semiconductor device 1 is a single package formed by encapsulating the drive unit 10 and the control circuit 20 (both shown in FIG. 1) with the encapsulation resin 50. The semiconductor device 1 is rectangular in a plan view. In the following description, a longitudinal direction of the semiconductor device 1 is defined as a first direction X, a direction orthogonal to the first direction X in a plan view of the semiconductor device 1 is defined as a second direction Y, and a direction orthogonal to both of the first direction X and the second direction Y is defined as a third direction Z. The third direction Z can also be referred to as the thickness direction of the semiconductor device 1.

Figure 3:
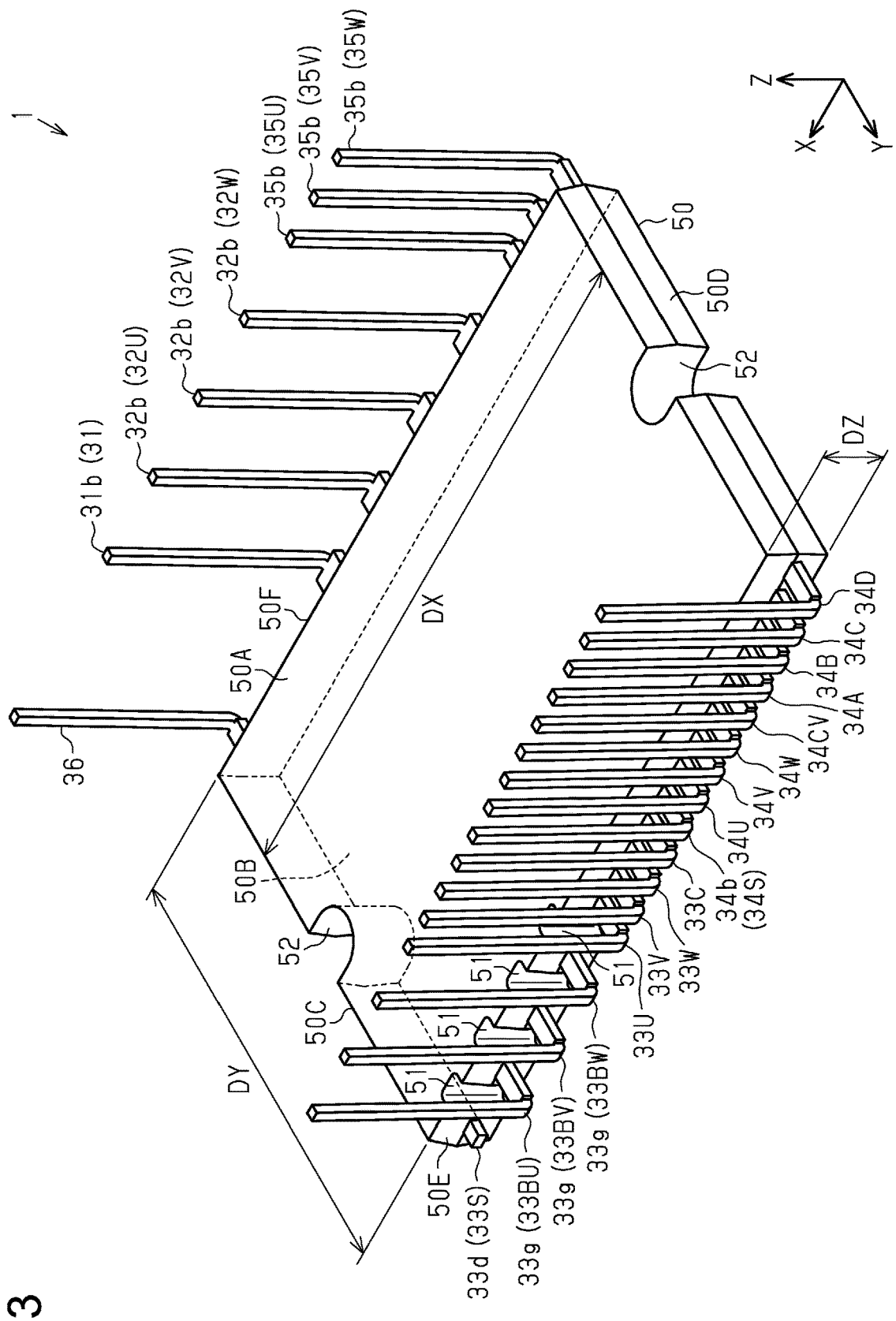
FIG. 3 is a perspective view of the semiconductor device.

As shown in FIG. 3, the dimension DX in the first direction X of the semiconductor device 1 (encapsulation resin 50) is preferably less than or equal to 60 mm. The dimension DY in the second direction Y of the semiconductor device 1 (encapsulation resin 50) is preferably less than or equal to 35 mm. The dimension DZ in the third direction Z of the semiconductor device 1 (encapsulation resin 50) is preferably less than or equal to 6 mm. In the semiconductor device 1 in accordance with the present embodiment, the dimension DX in the first direction X is about 57 mm, the dimension DY in the second direction Y is about 30 mm, and the dimension DZ in the third direction Z is about 5 mm.

As shown in FIG. 3, the encapsulation resin 50 is flat and rectangular. The encapsulation resin 50 is made of, for example, a black epoxy resin. The encapsulation resin 50 has a front surface 50A, a back surface 50B, a first side surface 50C, a second side surface 50D, a third side surface 50E, and a fourth side surface 50F. The front surface 50A and the back surface 50B are planes extending in the first direction X and the second direction Y and have a substantially rectangular shape in which the first direction X is the longitudinal direction. The first side surface 50C is a side surface on one side of the encapsulation resin 50 in the first direction X, and the second side surface 50D is a side surface on the other side of the encapsulation resin 50 in the first direction X. The first side surface 50C and the second side surface 50D are planes extending in the second direction Y and the third direction Z and have a substantially rectangular shape in which the second direction Y is the longitudinal direction. The third side surface 50E is a side surface on one side of the encapsulation resin 50 in the second direction Y, and the fourth side surface 50F is a side surface of the encapsulation resin 50 on the other side. The third side surface 50E and the fourth side surface 50F are planes extending in the first direction X and the third direction Z and have a substantially rectangular shape in which the first direction X is the longitudinal direction. The encapsulation resin 50 is provided with four first recesses 51 and two second recesses 52. The four first recesses 51 are formed so as to be recessed in the second direction Y from the third side surface 50E and to extend through the encapsulation resin 50 in the third direction Z. The four first recesses 51 are arranged in intervals in the first direction X in a portion of the third side surface 50E close to the first side surface 50C. The second recess 52 is provided at the center of the first side surface 50C of the encapsulation resin 50 in the second direction Y and at the center of the second side surface 50D of the encapsulation resin 50 in the second direction Y. The second recess 52 is formed so as to be recessed in the first direction X and to extend through the encapsulation resin 50 in the third direction Z.

Figure 4:
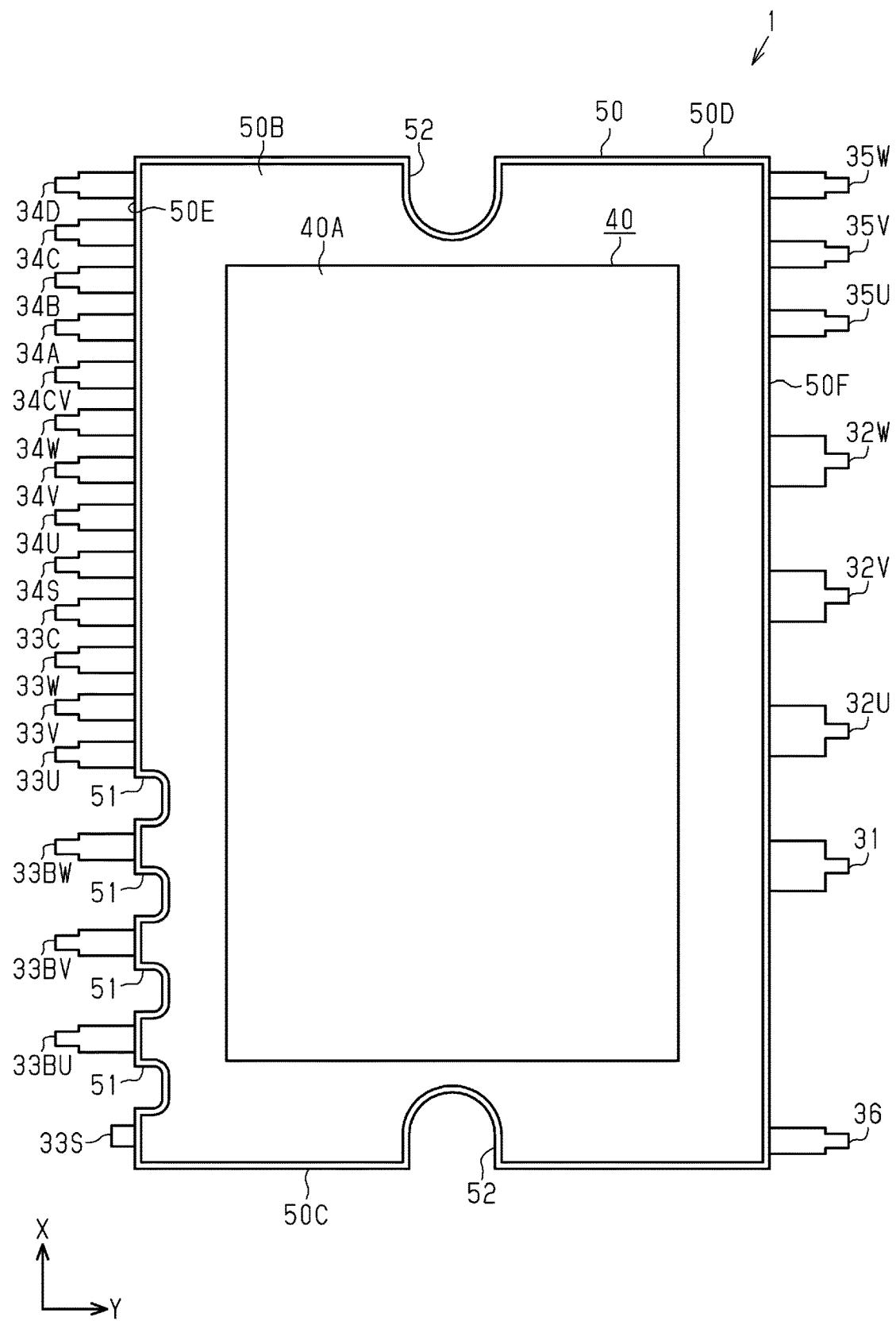
FIG. 4 is a bottom view of the semiconductor device.

As shown in FIG. 4, the heat dissipation member 40 is exposed from the back surface 50B of the encapsulation resin 50. The heat dissipation member 40 is made of, for example, ceramic. The exposed surface 40A of the heat dissipation member 40 is rectangular in shape in which the first direction X is the longitudinal direction.

As shown in FIG. 2, the lead 30 supports the MOSFETs 11U to 11W and the MOSFETs 12U to 12W and the control circuit 20 (see FIG. 1) and serves as a conduction supporting member that forms a conduction path of the MOSFETs 11U to 11W and the MOSFETs 12U to 12W. The lead 30 is formed, for example, by performing cutting process and bending process such as through punching of a sheet material made of metal. One example of the material of the lead 30 is copper (Cu). The thickness of the lead 30 is, for example, about 0.42 mm.

The lead 30 includes a frame 31, the frames 32U, 32V, 32W, a plurality of control frames 33, a plurality of control frames 34, a frame 35U that is an example of a first ground frame, a frame 35V that is an example of a second ground frame, and a frame 35W that is an example of a third ground frame. Furthermore, the lead 30 of the present embodiment includes an auxiliary frame 36 that is not electrically connected to the MOSFET 11U and the MOSFET 12L and serves as a so-called non-connection. The frame 31 and the respective frames 32U, 32V, 32W are arranged at intervals in the first direction X. The plurality of control frames 33 and the plurality of control frames 34 are arranged at intervals in the first direction X. The plurality of control frames 33 and the plurality of control frames 34 are arranged at intervals in the second direction Y together with the frames 31 and the respective frames 32U, 32V, 32W. That is, the plurality of control frames 33 and the plurality of control frames 34 are disposed close to the third side surface 50E of the encapsulation resin 50 in the second direction Y. The frames 35U, 35V, 35W are disposed on the side of the frames 31 opposite to the frames 32U, 32V, 32W in the first direction X. The frames 35U, 35V, 35W are disposed close to the fourth side surface 50F of the encapsulation resin 50 in the second direction Y. The auxiliary frame 36 is disposed on the encapsulation resin 50 at the end of the first side surface 50C close to the fourth side surface 50F. The auxiliary frame 36 has a terminal portion projecting out of the fourth side surface 50F.

The frame 31 is a lead frame for electrically connecting the drains of the MOSFETs 11U to 11W to an external power supply, and includes an island portion 31a, a terminal portion 31b, and a connecting portion 31c. The island portion 31a, the terminal portion 31b, and the connecting portion 31c are integrally formed. The island portion 31a is rectangular in shape in which the first direction X is the longitudinal direction. The MOSFETs 11U to 11W are mounted on the island portion 31a. The terminal portion 31b projects out of the fourth side surface 50F of the encapsulation resin 50. The connecting portion 31c connects the island portion 31a and the terminal portion 31b. The connecting portion 31c extends from the end of the island portion 31a closer to the terminal portion 31b in the second direction Y toward the terminal portion 31b. The terminal portion 31b projects out of the encapsulation resin 50. The terminal portion 31b is L-shaped and extends in the third direction Z after extending in the second direction Y from the encapsulation resin 50 (see FIG. 3). The island portion 31a, the terminal portion 31b, and the connecting portion 31c may be formed separately and joined to each other to form the frame 31.

The first frame 32U is a lead frame for electrically connecting the drain of the MOSFET 12U and an electric device (e.g., motor 2) driven by the semiconductor device 1. The first frame 32U of the present embodiment is electrically connected to a U-phase coil (not shown) of the motor 2. The second frame 32V is a lead frame for electrically connecting the drain of the MOSFET 12V and an electric device (e.g., motor 2) driven by the semiconductor device 1. The second frame 32V of the present embodiment is electrically connected to a V-phase coil (not shown) of the motor 2. The third frame 32W is a lead frame for electrically connecting the drain of the MOSFET 12W and an electric device (e.g. motor 2) driven by the semiconductor device 1. The third frame 32W of the present embodiment is electrically connected to a W-phase coil (not shown) of the motor 2. Each of the frames 32U, 32V, 32W has generally the same shape and includes an island portion 32a, a terminal portion 32b, and a connecting portion 32c. The island portion 32a, the terminal portion 32b, and the connecting portion 32c are integrally formed. The island portion 32a is rectangular in shape in which the second direction Y is the longitudinal direction. The size (width dimension) of the island portion 32a of each frame 32U, 32V, 32W in the first direction X is about ⅓ of the size (width dimension) in the first direction X of the island portion 31a of the frame 31. The MOSFET 12U is mounted on the island portion 32a of the first frame 32U. The MOSFET 12V is mounted on the island portion 32a of the second frame 32V. The MOSFET 12W is mounted on the island portion 32a of the third frame 32W.

The terminal portions 32b of the frames 32U, 32V, 32W project out of the fourth side surface 50F of the encapsulation resin 50. Each terminal portion 32b is L-shaped and extends in the third direction Z after extending in the second direction Y from the encapsulation resin 50 (see FIG. 3).

The connecting portion 32c of the first frame 32U is extended toward the terminal portion 32b from an end of the encapsulation resin 50 on the fourth side surface 50F in the second direction Y and an end of the island portion 32a of the first frame 32U closer to the frame 31 in the first direction X. A wire joining portion 32f having a rectangular shape in a plan view extending in the first direction X is provided the connecting portion 32c near the fourth side surface 50F of the encapsulation resin 50. As shown in FIG. 2, the connecting portion 32c of the second frame 32V and the connecting portion 32c of the third frame 32W also have shapes similar to the connecting portion 32c of the first frame 32U. Furthermore, the island portion 32a, the terminal portion 32b, and the connecting portion 32c may be separately formed and joined to each other to form the frames 32U, 32V, and 32W.

The control frame 33 includes frames 33BU, 33BV, 33BW, frames 33U, 33V, 33W, a frame 33C, and a frame 33S.

The frame 33S is a lead frame for supporting an integrated circuit element 25H. In one example of the integrated circuit element 25H, the high potential block circuit of the control circuit 20 is formed as a chip. In the present embodiment, the high potential block circuit of the control circuit 20 includes a first control circuit. That is, the high potential block circuit includes drive circuits 21UU, 21VU and 21WU, and logic circuits 22UU, 22VU and 22WU (all shown in FIG. 1). The frame 33S includes an island portion 33a, a first arm portion 33b extending along the first direction X from the island portion 33a toward the first side surface 50C of the encapsulation resin 50, a second arm portion 33c extending in the second direction Y from an end of the encapsulation resin 50 of the first arm portion 33b close to the first side surface 50C, and a terminal portion 33d extending from the second arm portion 33c. The island portion 33a, the first arm portion 33b, the second arm portion 33c, and the terminal portion 33d are integrally formed.

The island portion 33a is rectangular in shape in which the first direction X is the longitudinal direction. The size of the island portion 33a in the second direction Y is larger than the size of the first arm portion 33b in the second direction Y. The size of the island portion 33a in the first direction X is smaller than the size of the island portion 31a of the frame 31 in the first direction X. The island portion 33a is spaced apart by a gap from the island portion 31a of the frame 31 in the second direction Y. The island portion 33a is located at generally the center in the first direction X of the island portion 31a of the frame 31 in the first direction X. More specifically, the island portion 33a is located such its central position is slightly closer to the side opposite to the first frame 32U in the first direction X than the center in the first direction X of the island portion 31a. The integrated circuit element 25H is mounted on the island portion 33a.

The first arm portion 33b is extended to closer to the first side surface 50C of the encapsulation resin 50 than the frame 33BU. The first arm portion 33b includes a plurality of recesses 33e along the first direction X. The recesses 33e of the present embodiment are each circular in a plan view and have a curved bottom portion in a cross-sectional view. The second arm portion 33c is located near the first side surface 50C of the encapsulation resin 50. More specifically, the second arm portion 33c is located between the second recess 52 closest to the first side surface 50C among the four second recesses 52 and the first side surface 50C. The size (width dimension) in the first direction X of the second arm portion 33c is smaller than the size (width dimension) in the second direction Y of the first arm portion 33b. The terminal portion 33d projects in the second direction Y from the encapsulation resin 50. The size (width dimension) of the terminal portion 33d in the first direction X is equal to the width dimension of the second arm portion 33c. The island portion 33a, the first arm portion 33b, and the second arm portion 33c may be separately formed and joined to each other to form the frame 33S.

The frames 33BU, 33BV, 33BW, the frames 33U, 33V, 33W, and the frame 33C are arranged so as to surround the island portion 33a of the frame 33S.

The frames 33BU, 33BV, and 33BW are lead frames for electrically connecting a control power supply (not shown) and the bootstrap circuit 23 (see FIG. 1). The frames 33U, 33V, and 33W are lead frames for connection to a gate drive circuit (not shown) provided outside the semiconductor device 1. The gate driving device applies gate signal voltages to the frames 33U, 33V and 33W to generate drive signals. The frame 33C is a lead frame for supplying power to the integrated circuit element 25H.

The first boot frame 33BU faces the island portion 33a of the frame 33S spaced apart by a gap in the first direction X and faces the first arm portion 33b of the frame 33S spaced apart by a gap in the second direction Y. The frame 33BU is disposed on the encapsulation resin 50 closer to the first side surface 50C than the frame 33BV and the frame 33BW.

The frame 33BV and the frame 33BW are located on the encapsulation resin 50 closer to the third side surface 50E than the island portion 33a of the frame 33S. The frame 33BV is arranged to face the island portion 33a of the frame 33S in the second direction Y spaced apart by a gap and is adjacent to the frame 33BU in the second direction Y spaced apart by a gap. The frame 33BW is arranged to face the island portion 33a of the frame 33S in the second direction Y spaced apart by a gap and is adjacent to the frame 33BV in the second direction Y spaced apart by a gap. The frame 33BV is located between the frame 33BU and the frame 33BW in the first direction X.

The frame 33BU includes an island portion 33f and a terminal portion 33g. The island portion 33f and the terminal portion 33g are integrally formed. Each of the frame 33BV and the frame 33BW also includes an island portion 33f and a terminal portion 33g in the same manner as the frame 33BU. The area of the island portion 33f of the frame 33BU is larger than the area of the island portion 33f of the frame 33BV and the area of the island portion 33f of the frame 33BW. The island portion 33f of the frame 33BU has a portion extending from the island portion 33f of the frame 33BV in the second direction Y toward the first arm portion 33b. The island portion 33f of the frame 33BV and the island portion 33f of the frame 33BW include cut-away portions corresponding to the second recesses 52.

The boot diode 24U of the first bootstrap circuit 23U is mounted on the island portion 33f of the frame 33BU through soldering or the like. The boot diode 24U is located closer to the island portion 33f of the frame 33BV in the island portion 33f of the frame 33BU. The boot diode 24U is formed by a semiconductor chip. The boot diode 24U is provided with a cathode electrode serving as a front surface electrode and an anode electrode serving as a back surface electrode. The frame 33BU is electrically connected to the anode electrode of the boot diode 24U.

The boot diode 24V of the second bootstrap circuit 23V is mounted on the island portion 33*f* of the frame 33BV through soldering or the like. The boot diode 24V is located close to the island portion 33*f* of the frame 33BU in the island portion 33*f* of the frame 33BV. The boot diode 24V is formed of a semiconductor chip. The boot diode 24V is provided with a cathode electrode serving as a front surface electrode and an anode electrode serving as a back surface electrode. The frame 33BV is electrically connected to the anode electrode of the boot diode 24V.

The boot diode 24W of the third bootstrap circuit 23W is mounted on the island portion 33*f* of the frame 33BW through soldering or the like. The boot diode 24W is located at the end of the frame 33BV in the island portion 33*f* of the frame 33BW on the side opposite to the island portion 33*f* in the first direction X. The boot diode 24W is formed by a semiconductor chip. The boot diode 24W is provided with a cathode electrode serving as a front surface electrode and an anode electrode to be a back surface electrode. The frame 33BW is electrically connected to the anode electrode of the boot diode 24W.

The terminal portions 33*g* of the frames 33BU, 33BV, and 33BW project out of the third side surface 50E of the encapsulation resin 50. The terminal portions 33*g* of the frames 33BU, 33BV, and 33BW are L-shaped and extend in the third direction Z after extending in the second direction Y (see FIG. 3). The first recess 51 is located between the terminal portion 33*g* of the frame 33BU and the terminal portion 33*g* of the frame 33BV in the first direction X, and the first recess 51 is located between the terminal portion 33*g* of the frame 33BV and the terminal portion 33*g* of the frame 33BW in the first direction X. That is, in the first direction X, the four first recesses 51 and the terminal portions 33*g* of the frames 33BU, 33BV, and 33BW are alternately arranged.

The frames 33U, 33V, 33W, and the frame 33C are each substantially L-shaped in a plan view. The frame 33U and the frame 33V are located closer to the third side surface 50E of the encapsulation resin 50 than the island portion 33*a* of the frame 33S in the second direction Y. The frames 33V and 33W and the frame 33C are located closer to the second side surface 50D of the encapsulation resin 50 than the island portion 33*a* of the frame 33S in the first direction X. Part of the frame 33W and the frame 33C faces the island portion 33*a* of the frame 33S in the first direction X with a gap in between. The frame 33U is disposed to face the island portion 33*a* of the frame 33S in the second direction Y with a gap in between and to face the frame 33BW in the first direction X with a gap in between. The frame 33V faces the frame 33U spaced apart in the first direction X and the second direction Y. The frame 33W faces the frame 33V at an interval in the first direction X and the second direction Y. The frame 33C faces the frame 33W spaced apart in the first direction X and the second direction Y. The size of the gap between the frame 33U and the frame 33V in the first direction X is equal to the size of the gap between the frame 33V and the frame 33W. In the first direction X, the size of the gap between the frame 33W and the frame 33C is larger than the size of the gap between the frame 33V and the frame 33W.

In the frames 33U, 33V, 33W and the frame 33C, the terminal portions projecting out of the third side surface 50E of the encapsulation resin 50 are L-shaped and extend in the third direction Z after extending in the second direction Y from the encapsulation resin 50 (see FIG. 3).

The control frame 34 includes frames 34U, 34V, 34W, a frame 34CV, a frame 34S, and frames 34A, 34B, 34C, 34D.

The frame 34S is a lead frame for supporting an integrated circuit element 25L and grounding the integrated circuit element 25L. In one example of the integrated circuit element 25L, the low potential block circuit of the control circuit 20 is formed by a chip. In the present embodiment, the low potential block circuit of the control circuit 20 includes a second control circuit. That is, the low potential block circuit includes drive circuits 21UL, 21VL, 21WL and logic circuits 22UL, 22VL, 22WL (all shown in FIG. 1). The frame 34S is substantially T-shaped in a plan view. Specifically, the frame 34S includes an island portion 34*a*, a terminal portion 34*b*, a connecting portion 34*c*, and an extension portion 34*d*. The island portion 34*a*, the terminal portion 34*b*, the connecting portion 34*c*, and the extension portion 34*d* are integrally formed.

The island portion 34*a* is rectangular in shape in which the first direction X is the longitudinal direction. In the first direction X, the central position of the island portion 34*a* and the central position of the island portion 32*a* of the second frame 32V are equal to each other. The size of the island portion 34*a* in the first direction X is larger than the size of the island portion 32*a* in the first direction X. The end of the encapsulation resin 50 in the island portion 34*a* closer to the second side surface 50D faces the end of the encapsulation resin 50 in the island portion 32*a* of the third frame 32W closer to the first side surface 50C in the second direction Y. The end of the encapsulation resin 50 in the island portion 34*a* closer to the first side surface 50C faces the end of the encapsulation resin 50 in the island portion 32*a* of the first frame 32U closer to the second side surface 50D in the second direction Y. Furthermore, the size of the island portion 34*a* in the first direction X is larger than the size of the island portion 33*a* of the frame 33S in the first direction X. The size of the island portion 34*a* in the second direction Y is smaller than the size of the island portion 33*a* in the second direction Y.

The integrated circuit element 25L is mounted on the island portion 34*a*. The integrated circuit element 25L is disposed closer to the island portion 32*a* of the third frame 32W in the island portion 34*a*. More specifically, the integrated circuit element 25L is disposed in the island portion 34*a* such that its edge in the second direction Y is located at the same position in the second direction Y as the edge of the third frame 32W close to the island portion 34*a*. In the first direction X, the central position of the integrated circuit element 25L and the central position of the island portion 34*a* of the third frame 32W are equal to each other. The size of the integrated circuit element 25L in the first direction X is generally equal to the size of the integrated circuit element 25H in the first direction X. The size of the integrated circuit element 25L in the second direction Y is smaller than the size of the integrated circuit element 25H in the second direction Y. Recesses 34*e* are provided on both sides in the first direction X of the integrated circuit element 25L in the island portion 34*a*. The recesses 34*e* in the present embodiment are circular in a plan view and have a curved bottom portion in a cross-sectional view.

The connecting portion 34*c* connects the island portion 34*a* and the terminal portion 34*b*. The connecting portion 34*c* extends in the second direction Y from the end of the encapsulation resin 50 in the island portion 34*a* close to the first side surface 50C and the end close to the third side surface 50E. The connecting portion 34*c* faces the frame 33C spaced apart by a gap in the first direction X. The size of the gap in the first direction X between the connecting portion 34*c* and the frame 33C is generally equal to the size of the gap in the first direction X between the frame 33C and the frame 33W. The extension portion 34d extends in the first direction X from the end of the encapsulation resin 50 in the island portion 34a close to the first side surface 50C and the end close to the fourth side surface 50F. The tip of the extension portion 34d faces the island portion 33a of the frame 33S in the first direction X spaced apart by a gap. The extension portion 34d faces the island portion 32a of the first frame 32U and the portion closer to the second side surface 50D of the encapsulation resin 50 in the island portion 31a of the frame 31 spaced apart by a gap in the second direction Y. The extension portion 34d faces the frame 33C of the control frame 33 spaced apart by a gap in the second direction Y. The terminal portion 34b projects out of the third side surface 50E of the encapsulation resin 50. The terminal portion 34b is L-shaped and extends in the third direction Z after extending in the second direction Y (see FIG. 3).

The frames 34U, 34V, 34W, the frame 34CV, and the frames 34A, 34B, 34C, 34D are arranged to surround the island portion 34a of the frame 34S. The frames 34U, 34V, 34W, the frame 34CV, and the frame 34A are disposed closer to the third side surface 50E of the encapsulation resin 50 than the island portion 34a of the frame 34S in the second direction Y. The frames 34B, 34C, 34D are disposed closer to the second side surface 50D of the encapsulation resin 50 than the island portion 34a of the frame 34S in the first direction X.

The frames 34U, 34V, 34W are lead frames for connection to a gate drive circuit (not shown) provided outside the semiconductor device 1. The gate driving device applies gate signal voltages for generating drive signals to the frames 34U, 34V and 34W. The frame 34CV is a lead frame for supplying power to the integrated circuit element 25L. The frame 34A is a lead frame for outputting an error signal when an error occurs in the semiconductor device 1. The frame 34B is a lead frame for detecting a state in which at least one of the voltages applied to the frames 32U, 32V, 32W is short-circuited to the high voltage application terminal (or corresponding high potential terminal). The frame 34C is a lead frame for grounding the integrated circuit element 25L. The frame 34D is a non-connection lead frame.

The portion (connecting portion) of the frame 34U in the encapsulation resin 50 extends in the second direction Y, and the size (width dimension) in the first direction X decreases toward the distal end. The portions in the encapsulation resin 50 in the frames 34V and 34W, the frame 34CV, and the frames 34A and 34B are inclined toward the second side surface 50D as they go toward the third side surface 50E of the encapsulation resin 50, respectively. The portions of the encapsulation resin 50 in the frames 34V and 34W, the frame 34CV, and the frames 34A and 34C are decreased in size (width dimension) in the first direction X a toward the distal end. The frame 34D is L-shaped and includes a first portion extending in the first direction X and a second portion extending in the second direction Y. The first portion of the frame 34D is decreased in size (width dimension) in the second direction Y toward its distal end. The first portions of the frames 34C, 34D are wider than the frames 34U, 34V, 34W, the frame 34CV, and the frames 34A, 34B. Each of the frames 34C, 34D is provided with a plurality of recesses 34f. The recesses 34f of the present embodiment have the same shape as the recesses 34e. That is, the recesses 34f are circular in a plan view and have a curved bottom portion in a cross-sectional view.

The frames 34U, 34V, 34W, the frame 34CV, and the frames 34A, 34B, 34C, 34D each include a terminal portion that projects out of the third side surface 50E of the encapsulation resin 50 to extend in the second direction Y and then extend in the third direction Z to be L-shaped. The terminal portions of the frames 34U, 34V, 34W, the frame 34CV, and the frames 34A, 34B, 34C, 34D are spaced apart by gaps and arranged next to one another in the first direction X.

The frames 35U, 35V and 35W, serving as ground, are lead frames for grounding the sources of the MOSFETs 12U to 12W. Each of the frames 35U and 35V includes an island portion 35a and a terminal portion 35b. The frame 35W includes an island portion 35a, a terminal portion 35b, and a connecting portion 35c. In the frames 35U and 35V, the island portion 35a and the terminal portion 35b are integrally formed. In the frame 35W, the island portion 35a, the terminal portion 35b, and the connecting portion 35c are integrally formed.

The island portion 35a of the frames 35U and 35V is disposed in the vicinity of the fourth side surface 50F of the encapsulation resin 50, that is, at the same position as the wire joining portion 32f of the frames 32U, 32V and 32W in the second direction Y. The island portion 35a of the frame 35W is disposed at the same position as the island portion 32a of the third frame 32W in the first direction X. That is, the island portion 35a of the frame 35W is disposed on the encapsulation resin 50 closer to the third side surface 50E than the island portions 35a of the frames 35U and 35V in the second direction Y. When viewed from the fourth side surface 50F of the encapsulation resin 50, part of the island portion 35a of the frame 35W is disposed so as to overlap with the island portion 35a of the frame 35V. The island portions 35a of the frames 35U and 35V are disposed on the encapsulation resin 50 closer to the fourth side surface 50F than the island portions 32a of the third frame 32W. The island portion 35a of the frame 35U is rectangular in shape in which the first direction X is the longitudinal direction in a plan view. The island portion 35a of the frame 35V is substantially square in a plan view. The size of the island portion 35a of the frame 35U in the second direction Y is equal to the size of the island portion 35a of the frame 35V in the second direction Y. The size of the island portion 35a of the frame 35U in the first direction X is larger than the size of the island portion 35a of the frame 35V in the first direction X. The island portion 35a of the frame 35W is rectangular in shape in which the second direction Y is the longitudinal direction. The size of the island portion 35a of the frame 35W in the second direction Y is larger than the size of the island portion 35a of the frame 35U in the second direction Y. The area of the island portion 35a of the frame 35W is larger than the area of the island portion 35a of the frame 35U. The connecting portion 35c extends in the second direction Y from the end at the side of the second side surface 50D and the end at the side of the fourth side surface 50F of the encapsulation resin 50 of the island portion 35a in the first direction X.

The terminal portions 35b of the frames 35U, 35V, 35W project out of the fourth side surface 50F of the encapsulation resin 50. The terminal portion 35b of the frame 35U is connected to the end of the encapsulation resin 50 in the island portion 35a of the frame 35U at the side of the second side surface 50D. The terminal portion 35b of the frame 35V is connected to the center of the island portion 35a of the frame 35V in the first direction X. The terminal portion 35b of the frame 35W is connected to the connecting portion 35c. Each terminal portion 35b is L-shaped and extends in the third direction Z after extending in the second direction Y.

Figure 5:
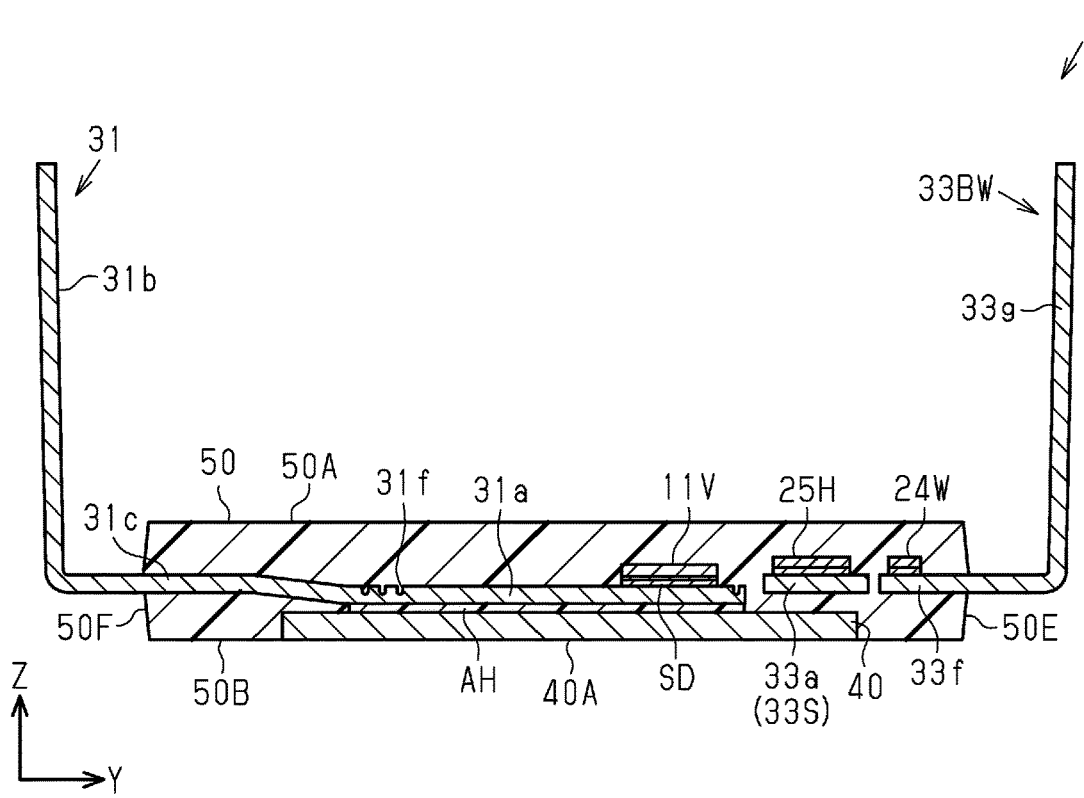
FIG. 5 is a cross-sectional view taken along line 5-5 in FIG. 2.

As shown in FIG. 5, the island portion 31a of the frame 31 is joined to the heat dissipation member 40. The connecting portion 31c of the frame 31 is disposed spaced apart from the heat dissipation member 40 in the third direction Z. The frame 33S and the frame 33BW are located closer to the front surface 50A of the encapsulation resin 50 than the island portion 31a of the frame 31. The frame 33S and the frame 33BW are disposed spaced apart from the heat dissipation member 40 in the third direction Z. Although not shown in FIG. 5, the control frames 33 other than the frame 33S and the frame 33BW are also located closer to the front surface 50A of the encapsulation resin 50 than the frame 31, that is, spaced apart from the heat dissipation member 40 in the third direction Z.

Figure 6:
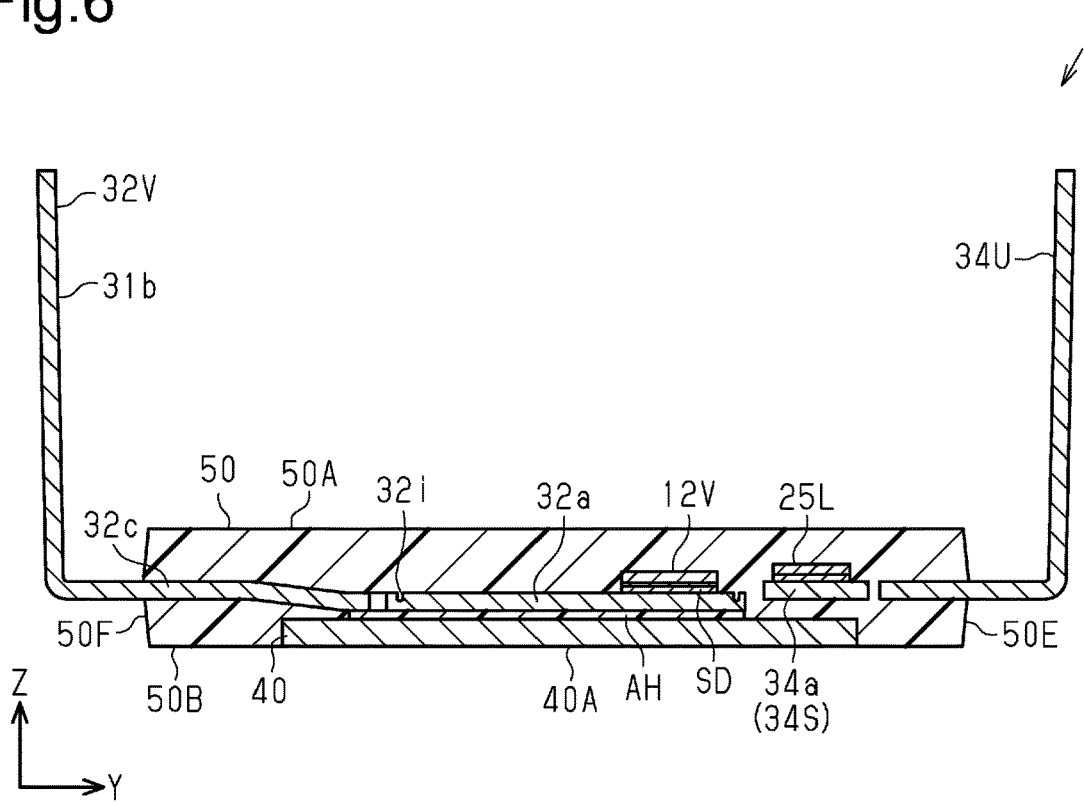
FIG. 6 is a cross-sectional view taken along line 6-6 in FIG. 2.

As shown in FIG. 6, the island portion 32a of the second frame 32V is joined to the heat dissipation member 40. FIG. 6 shows the cross-sectional structure of the second frame 32V and the plurality of control frames 33. The connecting portion 32c of the second frame 32V is disposed spaced apart from the heat dissipation member 40 in the third direction Z. The frame 34S and the frame 34U are located closer to the front surface 50A of the encapsulation resin 50 than the second frame 32V. The frame 34S and the frame 34U are located closer to the front surface 50A of the encapsulation resin 50 than the frames 32U, 32V, and 32W. Although not illustrated in FIG. 6, the island portions 32a of the first frame 32U and the third frame 32W are each joined to the heat dissipation member 40. Furthermore, the connecting portions 32c of the first frame 32U and the third frame 32W are each disposed spaced apart from the heat dissipation member 40 in the third direction Z. The control frames 34 other than the frames 34S and 34U are located closer to the front surface 50A of the encapsulation resin 50 than the frames 32U, 32V, 32W, that is, spaced apart from the heat dissipation member 40 in the third direction Z.

The detailed configuration of the frame 31 and the arrangement of the MOSFET 11U will now be described with reference to FIGS. 7 and 8.

The frame 31 includes an element mounting region Rse that is a region where integrated circuit elements such as MOSFETs 11U to 11W can be mounted. The element mounting region Rse is a rectangular region in which the first direction X is the longitudinal direction, and the element mounting region Rse is separated from other portions of the island portion 31a by the groove 31d. The element mounting region Rse is formed close to the control frame 33 of the island portion 31a in the second direction Y. The element mounting region Rse is partitioned into six regions Ra1 to Ra6 by the groove 31e. The six regions Ra1 to Ra6 are formed by dividing the element mounting region Rse into three in the first direction X and into two in the second direction Y. The three regions Ra1 to Ra3 are regions of the element mounting region Rse closer to the control frames 33 in the second direction Y. The three regions Ra4 to Ra6 are regions of the element mounting region Rse closer to the connecting portion 31c in the second direction Y. As shown in FIG. 7, the regions Ra1 and Ra4 are arranged in the second direction Y, the regions Ra2 and Ra5 are arranged in the second direction Y, and the regions Ra3 and Ra6 are arranged in the second direction Y. The region Ra2 is located between the region Ra1 and the region Ra3 in the first direction X. The region Ra1 is located closer to the first side surface 50C of the encapsulation resin 50 than the region Ra2, and the region Ra3 is located closer to the second side surface 50D of the encapsulation resin 50 than the region Ra2. Each of the regions Ra1 to Ra3 is a rectangular region in which the second direction Y is the longitudinal direction. The regions Ra1 to Ra3 are equal in size to one another in the first direction X, and the regions Ra1 to Ra3 are equal in size to one another in the second direction Y. Each of the regions Ra4 to Ra6 is a rectangular region in which the second direction Y is the longitudinal direction. The regions Ra4 to Ra6 are equal in size to one another in the first direction X, and the regions Ra4 to Ra6 are equal in size to one another in the second direction Y. The size of the regions Ra1 to Ra3 in the first direction X is equal to the size of the regions Ra4 to Ra6 in the first direction X. The size of the regions Ra1 to Ra3 in the second direction Y is larger than the size of the regions Ra4 to Ra6 in the second direction Y.

The MOSFET 11U is mounted in the region Ra1. The MOSFET 11U is located in the region Ra1 closer to the control frame 33 in the second direction Y. The MOSFET 11V is mounted in the region Ra2. The MOSFET 11V is located in the region Ra2 closer to the control frame 33 in the second direction Y. The MOSFET 11W is mounted in the region Ra3. The MOSFET 11W is located in the region Ra3 closer to the control frame 33 in the second direction Y. The position of the MOSFET 11U in the second direction Y, the position of the MOSFET 11V in the second direction Y, and the position of the MOSFET 11W in the second direction Y are equal to one another. Semiconductor elements that differ from the MOSFETs 11U to 11W can be mounted in the regions Ra4 to Ra6. In the present embodiment, no semiconductor element is mounted in the regions Ra4 to Ra6.

Figure 7:
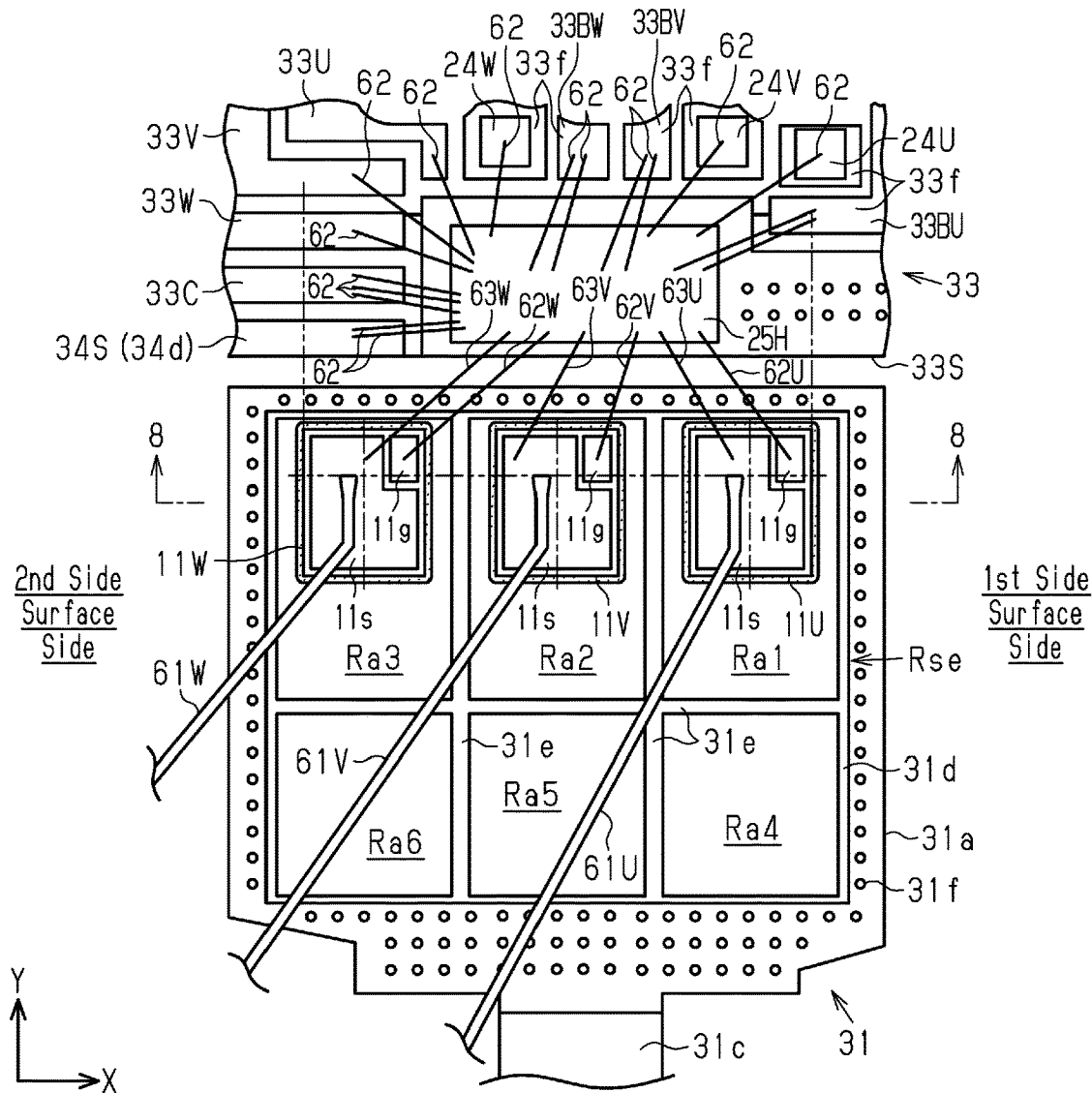
FIG. 7 is an enlarged view of part of FIG. 2.

As shown in FIG. 7, the MOSFETs 11U and 11V are disposed so as to overlap with the integrated circuit element 25H when viewed in the second direction Y. The MOSFET 11W is disposed closer to the second side surface 50D than the integrated circuit element 25H. The MOSFET 11U is disposed such that the end of the MOSFET 11U closer to the first side surface 50C is closer to the first side surface 50C than the edge of the integrated circuit element 25H closer to the first side surface 50C.

Recesses 31f are recessed in the third direction Z and arranged in portions of the island portion 31a other than the element mounting region Rse. The recesses 31f are arranged in a matrix form in the first direction X and the second direction Y. The recesses 31f of the present embodiment are circular in a plan view and have a curved bottom portion in a cross-sectional view.

The MOSFETs 11U to 11W and the MOSFETs 12U to 12W use the same MOSFET.

The MOSFET 11U is formed by a semiconductor chip that is rectangular in a plan view. The MOSFET 11U is disposed such that the second direction Y is the longitudinal direction. The size of the MOSFET 11U in the first direction X is smaller than the size of the region Ra1 in the first direction X. The source electrode pad 11s and the gate electrode pad 11g are provided on the front surface of the MOSFET 11U, and the drain electrode pad 11d (see FIG. 8) is provided on the back surface of the MOSFET 11U. Thus, the frame 31 is electrically connected to the drain of the MOSFET 11U. The solder SD (see FIG. 8), which is used to join the MOSFET 11U to the island portion 31a, is melted and then hardened to join the MOSFET 11U to the island portion 31a. As shown in FIG. 7, the solder SD slightly extends out of the periphery of the MOSFET 11U. The source electrode pad 11s, the drain electrode pad 11d, and the gate electrode pad 11g of the MOSFET 11U are made of, for example, aluminum (Al) or an aluminum alloy. Examples of the aluminum alloy include Al—Cu, Al—Si—Cu, and the like. The shape, size, and structure of the MOSFETs 11V and 11W and the connecting structure to the island portion 31a are the same as the MOSFET 11U.

The source electrode pad 11s of the MOSFET 11U occupies most of the front surface of the MOSFET 11U. Among the four corners of the front surface of the MOSFET 11U, the gate electrode pad 11g of the MOSFET 11U is arranged in a corner closer to the first side surface 50C of the encapsulation resin 50 in the first direction X and closer to the control frame 33 in the second direction Y. The source electrode pad 11s of the MOSFET 11U includes a cutout portion so as to avoid the gate electrode pad 11g. The gate electrode pad 11g of the MOSFET 11U is rectangular in shape in which the second direction Y is the longitudinal direction.

Figure 8:
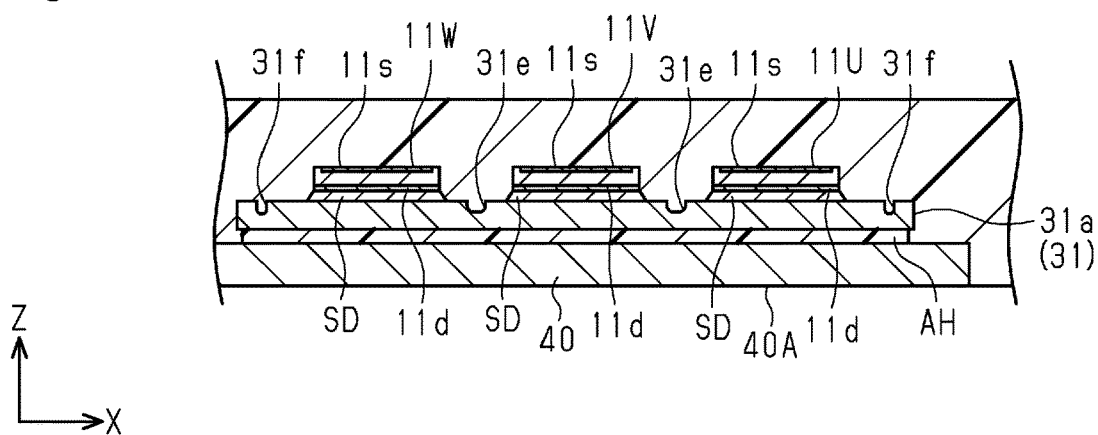
FIG. 8 is a cross-sectional view taken along line 8-8 in FIG. 7.

As shown in FIG. 8, the island portion 31a of the frame 31 and the heat dissipation member 40 are joined by an adhesive AH. The adhesive AH is applied over the entire surface of the island portion 31a facing the heat dissipation member 40. That is, the entire surface of the island portion 31a facing the heat dissipation member 40 contacts the heat dissipation member 40 through the adhesive AH. Preferably, the adhesive AH properly joins the heat dissipation member 40, which is made of a ceramic, and the island portion 31a, which is made of copper (Cu) and has thermal conductivity that is relatively satisfactory. For example, a resin adhesive have superior thermal conductivity is used.

Next, the detailed configuration of each frame 32U, 32V, 32W and the arrangement of the MOSFETs 12U to 12W will now be described with reference to FIGS. 9 and 10.

The island portion 32a of the first frame 32U, the island portion 32a of the second frame 32V, and the island portion 32a of the third frame 32W differ from one another in the shape of the end closer to the connecting portion 32c in the second direction Y. The island portion 32a of the first frame 32U includes a cut-away portion 32d for preventing interference with the connecting portion 32c of the second frame 32V. The island portion 32a of the second frame 32V includes a cut-away portion 32e for preventing interference with the connecting portion 32c of the third frame 32W. No cut-away portion is formed in the island portion 32a of the third frame 32W.

An element mounting region Rse is formed in each of the frames 32U, 32V, and 32W in the same manner as the frame 31. The element mounting region Rse of each of the frames 32U, 32V, 32W are regions of the same shape. The element mounting region Rse is a rectangular region in which the second direction Y is the longitudinal direction. The size of the element mounting region Rse of each frame 32U, 32V, 32W in the second direction Y is equal to the size of the element mounting region Rse of the frame 31 in the second direction Y. The size of the element mounting region Rse of each frame 32U, 32V, 32W in the first direction X is about ⅓ of the size of the element mounting region Rse of the frame 31 in the first direction X. That is, the size of the element mounting region Rse of each frame 32U, 32V, 32W in the first direction X is equal to the size of the element mounting region Rse of the frame 31 in the first direction X.

The element mounting region Rse of each frame 32U, 32V, 32W is separated from other portions of the island portion 32a by the groove 32g. The element mounting region Rse is partitioned into six regions Ra7 and Ra8 by the groove 32h. The region Ra7 and the region Ra8 are arranged in the second direction Y. The region Ra7 is a region of the element mounting region Rse closer to the control frames 34 in the second direction Y. The region Ra7 is a rectangular region in which the second direction Y is the longitudinal direction. The size of the region Ra7 is equal to the size of each of the regions Ra1 to Ra3 of the element mounting region Rse of the frame 31. The size of the region Ra8 is equal to the size of each of the regions Ra4 to Ra6 of the element mounting region Rse of the frame 31. That is, the area of the region Ra7 is larger than the area of the region Ra8, and the size of the region Ra7 in the second direction Y is larger than the size of the region Ra8 in the second direction Y.

The MOSFET 12U is mounted in the region Ra7 of the first frame 32U. The MOSFET 12U is located in the region Ra7 of the first frame 32U closer to the control frame 34 in the second direction Y. The MOSFET 12V is mounted in the region Ra7 of the second frame 32V. The MOSFET 12V is located in the region Ra7 of the second frame 32V closer to the control frame 34 in the second direction Y. The MOSFET 12W is mounted in the region Ra7 of the third frame 32W. The MOSFET 12W is locate in the region Ra7 of the third frame 32W d closer to the control frame 34 in the second direction Y. The position of the MOSFET 12U in the second direction Y, the position of the MOSFET 12V in the second direction Y, and the position of the MOSFET 12W in the second direction Y are equal to one another.

A semiconductor element that differs from that of the MOSFETs 12U to 12W can be mounted on the region Ra8 of each frame 32U, 32V, 32W. In the present embodiment, no semiconductor element is mounted in the regions Ra8 of the frames 32U, 32V, 32W.

A plurality of recesses 32i are provided in a portion other than the element mounting region Rse in the island portion 32a, that is, in a portion surrounding the element mounting region Rse in the island portion 32a. The plurality of recesses 32i of the present embodiment have the same shape as the recesses 31f, are circular in a plan view, and have a curved bottom portion in a cross-sectional view.

The MOSFET 12U is formed by a semiconductor chip that is rectangular in a plan view. The MOSFET 12U is disposed such that the second direction Y is the longitudinal direction. As described above, since the MOSFET 12U uses the same semiconductor chip as the MOSFET 11U, the sizes of the MOSFET 12U in the first direction X and the second direction Y are equal to the sizes of the MOSFETs 11U to 11W in the first direction X and the second direction Y. That is, the size of the MOSFET 12U in the first direction X is smaller than the size of each region Ra7 in the first direction X. The source electrode pad 12s and the gate electrode pad 12g are provided on the front surface of the MOSFET 12U, and the drain electrode pad 12d (see FIG. 10) is provided on the back surface of the MOSFET 12U. Thus, the first frame 32U is electrically connected to the drain of the MOSFET 12U mounted on the first frame 32U. The solder SD (see FIG. 10), which is used to join the island portion 32a of the first frame 32U to the MOSFET 12U, is melted and then hardened to join the MOSFET 12U and the island portion 32a.

The second frame 32V is electrically connected to the drain of the MOSFET 12V mounted on the second frame 32V. The third frame 32W is electrically connected to the drain of the MOSFET 12W mounted on the third frame 32W. The joining structure of the MOSFETs 12V and 12W and the island portion 32a of each frame 32V and 32W is the same as the joining structure of the MOSFET 12U and the island portion 32a of the first frame 32U.

The shape of the source electrode pad 12s of the MOSFETs 12U to 12W is equal to the shape of the source electrode pad 11s of the MOSFET 11U, and the shape of the gate electrode pad 12g of the MOSFET 12U to 12W is equal to the shape of the gate electrode pad 11g of the MOSFET 11U. The source electrode pads 12s and the gate electrode pads 12g of the MOSFETs 12U to 12W are made of, for example, gold (Au). The drain electrode pads 12d of the MOSFETs 12U to 12W are made of, for example, gold (Au) or silver (Ag).

Figure 10:
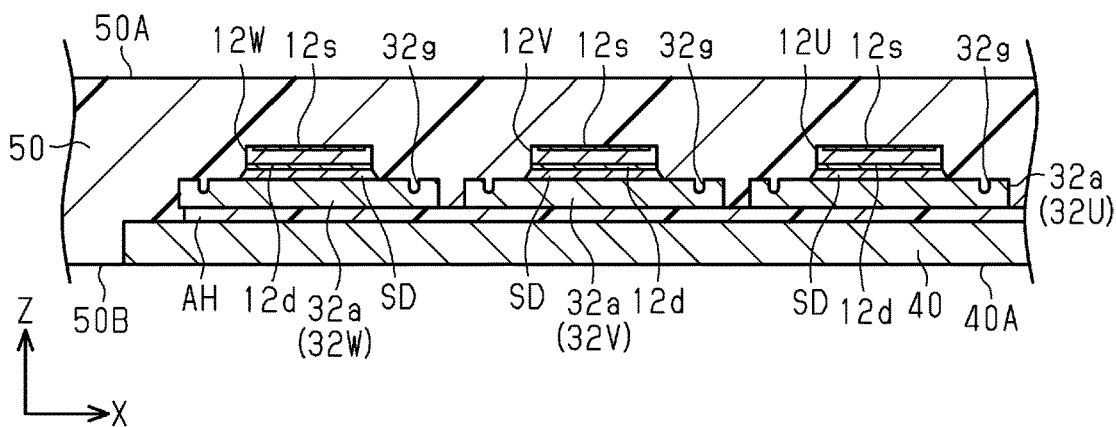
FIG. 10 is a cross-sectional view taken along line 10-10 in FIG. 9.

As shown in FIG. 10, the island portions 32a of the frames 32U, 32V, 32W and the heat dissipation member 40 are joined by an adhesive AH. The adhesive AH is applied over the entire surface of the island portion 32a of each of the frames 32U, 32V, 32W facing the heat dissipation member 40. That is, the entire surface of the island portion 32a of each frame 32U, 32V, 32W facing the heat dissipation member 40 is in contact with the heat dissipation member 40 through the adhesive AH. Preferably, the adhesive AH is an adhesive that properly joins the heat dissipation member 40, which is made of a ceramic, and the island portions 32a of the frames 32U, 32V, 32W, which are made of copper (Cu), and has thermal conductivity that is relatively satisfactory. For example, an adhesive made of resin having superior thermal conductivity is used.

As shown in FIG. 2, the leads 30, the MOSFETs 11U to 11W and the MOSFETs 12U to 12W, and the integrated circuit elements 25H and 25L are electrically connected to each other by wire bonding. More specifically, the semiconductor device 1 includes a high potential side power wire for connecting the lead 30 and the MOSFETs 11U to 11W. The high potential side power wire includes a first wire 60U which is an example of a first power wire, a second wire 60V which is an example of a second power wire, and a third wire 60W which is an example of a third power wire. The semiconductor device 1 also includes a low potential side power wire for connecting the lead 30 and the MOSFETs 12U to 12W. The low potential side power wire includes a first wire 61U which is an example of a fourth power wire, a second wire 61V which is an example of a fifth power wire, and a third wire 61W which is an example of a sixth power wire. The semiconductor device 1 also includes a plurality of wires 62 for connecting the integrated circuit element 25H and the MOSFETs 11U to 11W, and a plurality of wires 62 for connecting the integrated circuit elements 25H and 25L and the plurality of control frames 33 and 34. In the present embodiment, each of the wires 60U, 60V, and 60W are connected to the lead 30 and the MOSFETs 11U to 11W through wedge bonding. The wires 61U, 61V, 61W are connected to the lead 30 and the MOSFETs 12U to 12W through wedge bonding. Furthermore, in the present embodiment, the wires 62 connect the integrated circuit elements 25H and 25L and the plurality of control frames 33 and 34 through ball bonding. The semiconductor device 1 further includes a first wire 62U, a second wire 62V and a third wire 62W which are examples of a control wire for connecting the MOSFETs 12U to 12W and the integrated circuit element 25L, and a first wire 63U, a second wire 63V and a third wire 63W which are examples of a limiting wire. As shown in FIG. 9, the wires 63U, 63V, 63W are provided separately from the wires 62U, 62V, 62W. In the present embodiment, the wires 62U, 62V, 62W and the wires 63U, 63V, 63W connect the integrated circuit element 25L and the MOSFETs 12U to 12W through ball bonding.

The wires 60U, 60V, 60W, 61U, 61V and 61W are made of, for example, aluminum (Al), and the wires 62, 62U, 62V and 62W and the wires 63U, 63V and 63W are made of, for example, gold (Au). The wires 60U, 60V, 60W, 61U, 61V, 61W have equal wire diameters. The wire diameters of the respective wires 62, 62U, 62V, 62W are equal to each other. The wires 63U, 63V, 63W have equal wire diameters. The wire diameter of each of the wires 62, 62U, 62V, 62W are equal to the wire diameter of each of the wires 63U, 63V, 63W. The wire diameter of each of the wires 60U, 60V, 60W, 61U, 61V, 61W are larger than the wire diameter of each of the wires 62, 62U, 62V, 62W and the wire diameter of each of the wires 63U, 63V, 63W. The wire diameter of each of the wires 60U, 60V, 60W, 61U, 61V, and 61W is about 10 times greater than the wire diameter of each of the wires 62, 62U, 62V, and 62W and the wire diameter of each of the wires 63U, 63V, and 63W. One example of the wire diameter of each wire 60U, 60V, 60W, 61U, 61V, 61W is 400 μm. One example of the wire diameter of each wire 62, 62U, 62V, 62W and the wire diameter of each wire 63U, 63V, 63W is 38 μm.

The single first wire 60U connects the source electrode pad 11s of the MOSFET 11U and the wire joining portion 32f of the first frame 32U. The single second wire 60V connects the source electrode pad 11s of the MOSFET 11V and the wire joining portion 32f of the second frame 32V. The single third wire 60W connects the source electrode pad 11s of the MOSFET 11W and the wire joining portion 32f of the third frame 32W. The wires 60U, 60V, 60W are generally parallel to each other. The first wire 60U is extended through the region Ra5 of the element mounting region Rse and connected to the wire joining portion 32f of the first frame 32U. The second wire 60V is extended through the region Ra6 of the element mounting region Rse and the connecting portion 32c of the first frame 32U and connected to the wire joining portion 32f of the second frame 32V. The third wire 60W is extended through the region Ra6 of the element mounting region Rse of the first frame 32U and the connecting portion 32c of the second frame 32V and connected to the wire joining portion 32f of the third frame 32W.

Each of the source electrode pads 11s of the MOSFETs 11U to 11W is connected to the integrated circuit element 25H by a single wire 62. Each of the gate electrode pads 11g of the MOSFETs 11U to 11W is connected to the integrated circuit element 25H by a single wire 62.

As shown in FIG. 7, the part of the first wire 60U connected to the source electrode pad 11s of the MOSFET 11U is thicker than other portions of the first wire 60U. The connecting part is provided on the gate electrode pad 11g of the MOSFET 11U closer to the integrated circuit element 25H than the edge closer to the source electrode pad 11s in the second direction Y. That is, the part of the first wire 60U connected to the source electrode pad 11s of the MOSFET 11U is provided to overlap the gate electrode pad 11g of the MOSFET 11U as viewed from the first direction X and to extend across the edge on one side of the gate electrode pad 11g in the second direction Y. Furthermore, the connecting part is provided closer to the second side surface 50D than a center line (single-dashed line) indicating the center of the MOSFET 11U in the first direction X.

The part of the second wire 60V connected to the source electrode pad 11s of the MOSFET 11V is thicker than other portions of the second wire 60V. The connecting part is provided on the gate electrode pad 11g of the MOSFET 11V closer to the integrated circuit element 25H than the edge closer to the source electrode pad 11s in the second direction Y. That is, the part of the second wire 60V connected to the source electrode pad 11s of the MOSFET 11V is provided to overlap the gate electrode pad 11g of the MOSFET 11V as viewed from the first direction X and to extend across the edge on one side of the gate electrode pad 11g in the second direction Y. Furthermore, the connecting part is provided closer to the second side surface 50D than a center line (single-dashed line) indicating the center of the MOSFET 11V in the first direction X.

The part of the third wire 60W connected to the source electrode pad 11s of the MOSFET 11W is thicker than other portions of the third wire 60W. The connecting part is provided on the gate electrode pad 11g of the MOSFET 11W closer to the integrated circuit element 25H than the edge closer to the source electrode pad 11s in the second direction Y. That is, the part of the third wire 60W connected to the source electrode pad 11s of the MOSFET 11W is provided to overlap the gate electrode pad 11g of the MOSFET 11W as viewed from the first direction X and to extend across the edge on one side of the second direction Y of the gate electrode pad 11g. Furthermore, the connecting part is provided closer to the second side surface 50D than a center line (single-dashed line) indicating the center of the MOSFET 11W in the first direction X.

The integrated circuit element 25H is connected to the frames 33BU, 33BV, 33BW and the boot diodes 24U, 24V, 24W by wires 62. More specifically, the integrated circuit element 25H is connected to the island portion 33f of each of the frames 33BU, 33BV, 33BW by two wires 62. The integrated circuit element 25H is connected to the cathode electrode of each of the frames 33BU, 33BV and 33BW by one wire 62.

The integrated circuit element 25H is connected to each of the frames 33U, 33V and 33W by one wire 62. The integrated circuit element 25H is connected to the frame 33C by three wires 62. The integrated circuit element 25H is connected to the extension portion 34d of the frame 34S of the control frame 34 by two wires 62.

As shown in FIG. 2, one first wire 61U connects the source electrode pad 12s of the MOSFET 12U and the frame 35U. One second wire 61V connects the source electrode pad 12s of the MOSFET 12V and the frame 35V. One third wire 61W connects the source electrode pad 12s of the MOSFET 12W and the frame 35W. The wires 61U, 61V, 61W are generally parallel to each other. The first wire 61U is extended through the region Ra8 of the element mounting region Rse of the second frame 32V and the connecting portion 32c of the third frame 32W and connected to the frame 35U. The second wire 61V is extended through the region Ra8 of the element mounting region Rse of the third frame 32W and connected to the frame 35V. The third wire 61W is extended through the element mounting region Rse of the region Ra8 closer to the third frame 32W than the region Ra7 side and connected to the frame 35W.

Figure 9:
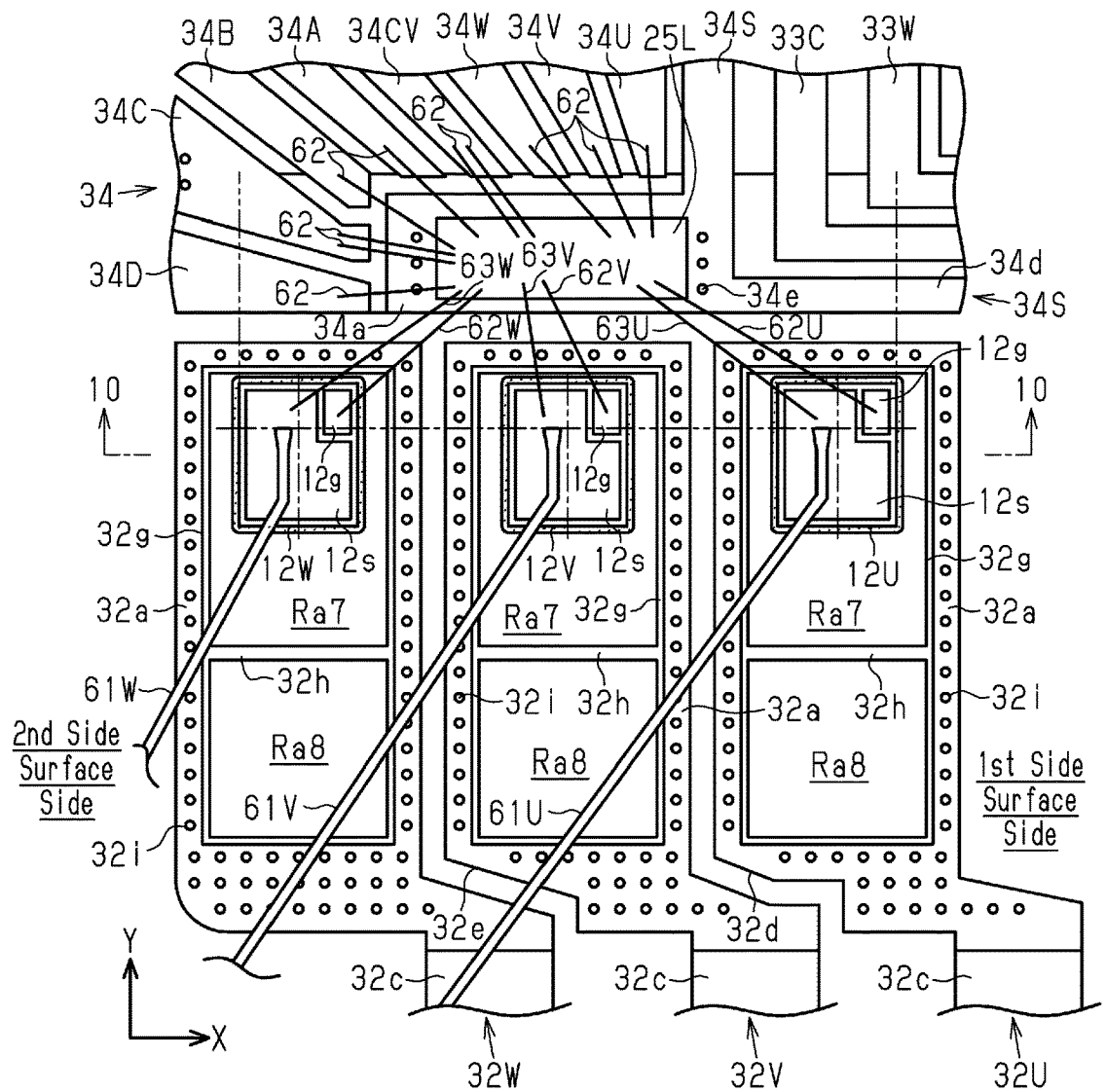
FIG. 9 is an enlarged view of part of FIG. 2.

As shown in FIG. 9, the part of the first wire 61U connected to the source electrode pad 12s of the MOSFET 12U is thicker than other portions of the first wire 61U. The connecting part is provided on the gate electrode pad 12g of the MOSFET 12U closer to the integrated circuit element 25H than the edge closer to the source electrode pad 12s in the second direction Y. That is, the part of the first wire 61U connected to the source electrode pad 12s of the MOSFET 12U is provided to overlap the gate electrode pad 12g of the MOSFET 12U as viewed from the first direction X and to extend across the edge on one side of the second direction Y of the gate electrode pad 12g. Furthermore, the connecting part is provided closer to the second side surface 50D than a center line (single-dashed line) indicating the center of the MOSFET 12U in the first direction X.

The part of the second wire 61V connected to the source electrode pad 12s of the MOSFET 12V is thicker than other portions of the second wire 60V. The connecting part is provided on the gate electrode pad 12g of the MOSFET 12V closer to the integrated circuit element 25H than the edge closer to the source electrode pad 12s in the second direction Y. That is, the part of the second wire 61V connected to the source electrode pad 12s of the MOSFET 12V is provided to overlap the gate electrode pad 12g of the MOSFET 12V as viewed from the first direction X and to extend across the edge on one side of the second direction Y of the gate electrode pad 12g. Furthermore, the connecting part is provided closer to the second side surface 50D than a center line (single-dashed line) indicating the center of the MOSFET 12V in the first direction X.

The part of the third wire 61W connected to the source electrode pad 12s of the MOSFET 12W is thicker than other portions of the third wire 61W. The connecting part is provided on the gate electrode pad 12g of the MOSFET 12W closer to the integrated circuit element 25H than the edge closer to the source electrode pad 12s in the second direction Y. That is, the part of the third wire 61W connected to the source electrode pad 12s of the MOSFET 12W is provided to overlap the gate electrode pad 12g of the MOSFET 12W as viewed from the first direction X and to extend across the edge on one side of the second direction Y of the gate electrode pad 12g. Furthermore, the connecting part is provided closer to the second side surface 50D than a center line (single-dashed line) indicating the center of the MOSFET 12W in the first direction X.

One first wire 62U, which is an example of a first control wire, connects the gate electrode pad 12g of the MOSFET 12U mounted on the first frame 32U and the integrated circuit element 25L. One second wire 62V, which is an example of a second control wire, connects the gate electrode pad 12g of the MOSFET 12V mounted on the second frame 32V and the integrated circuit element 25L. One third wire 62W, which is an example of a third control wire, connects the gate electrode pad 12g of the MOSFET 12W mounted on the third frame 32W and the integrated circuit element 25L. One end of each of the wires 62U, 62V, 62W is connected to the end of the integrated circuit element 25L closer to the MOSFETs 12U to 12W. The number of wires 62U, 62V, 63W is not limited to one and may be two or more.

One first wire 63U, which is an example of the first limiting wire, connects the source electrode pad 12s of the MOSFET 12U mounted on the first frame 32U and the integrated circuit element 25L. One second wire 63V, which is an example of the second limiting wire, connects the source electrode pad 12s of the MOSFET 12V mounted on the second frame 32V and the integrated circuit element 25L. One third wire 63W, which is an example of the third limiting wire, connects the source electrode pad 12s of the MOSFET 12W mounted on the third frame 32W and the integrated circuit element 25L. One end of each of the wires 63U, 63V, 63W is connected to the end of the integrated circuit element 25L closer to the MOSFETs 12U to 12W. The number of wires 63U, 63V, 63W is not limited to one and may be two or more.

In the first direction X, the first wire 63U is disposed to be adjacent to the first wire 62U, the second wire 63V is disposed to be adjacent to the second wire 62V, and the third wire 63W is disposed to be adjacent to the third wire 62W. Specifically, the first wire 62U is disposed closer to the second frame 32V than the first wire 63U. The first wire 62U and the first wire 63U are each connected to the one of the four corners of the integrated circuit element 25L closer to the first frame 32U. The second wire 63V is disposed closer to the third frame 32W than the second wire 62V. The second wire 62V and the second wire 63V are connected to the portion of the integrated circuit element 25L closer to the third frame 32W than the central portion in the first direction X. The third wire 62W is disposed closer to the second frame 32V than the third wire 63W. One end of each of the third wire 62W and the third wire 63W is connected to a portion of the integrated circuit element 25L closer to the second frame 32V than the position of the wire 62 connecting the integrated circuit element 25L to the frame 34D.

The integrated circuit element 25L is connected to the frames 34U, 34V, 34W by one wire 62. The integrated circuit element 25L is connected to the frame 34CV by two wires 62. The integrated circuit element 25L is connected to each of the frames 34A, 34B, 34D by one wire 62. The integrated circuit element 25L is connected to the frame 34C by two wires 62. One end of the wire 62 connected to the frame 34D is connected to the end of the integrated circuit element 25L closer to the frame 34D in the second direction Y.

[Structure of MOSFET]

Figure 11:
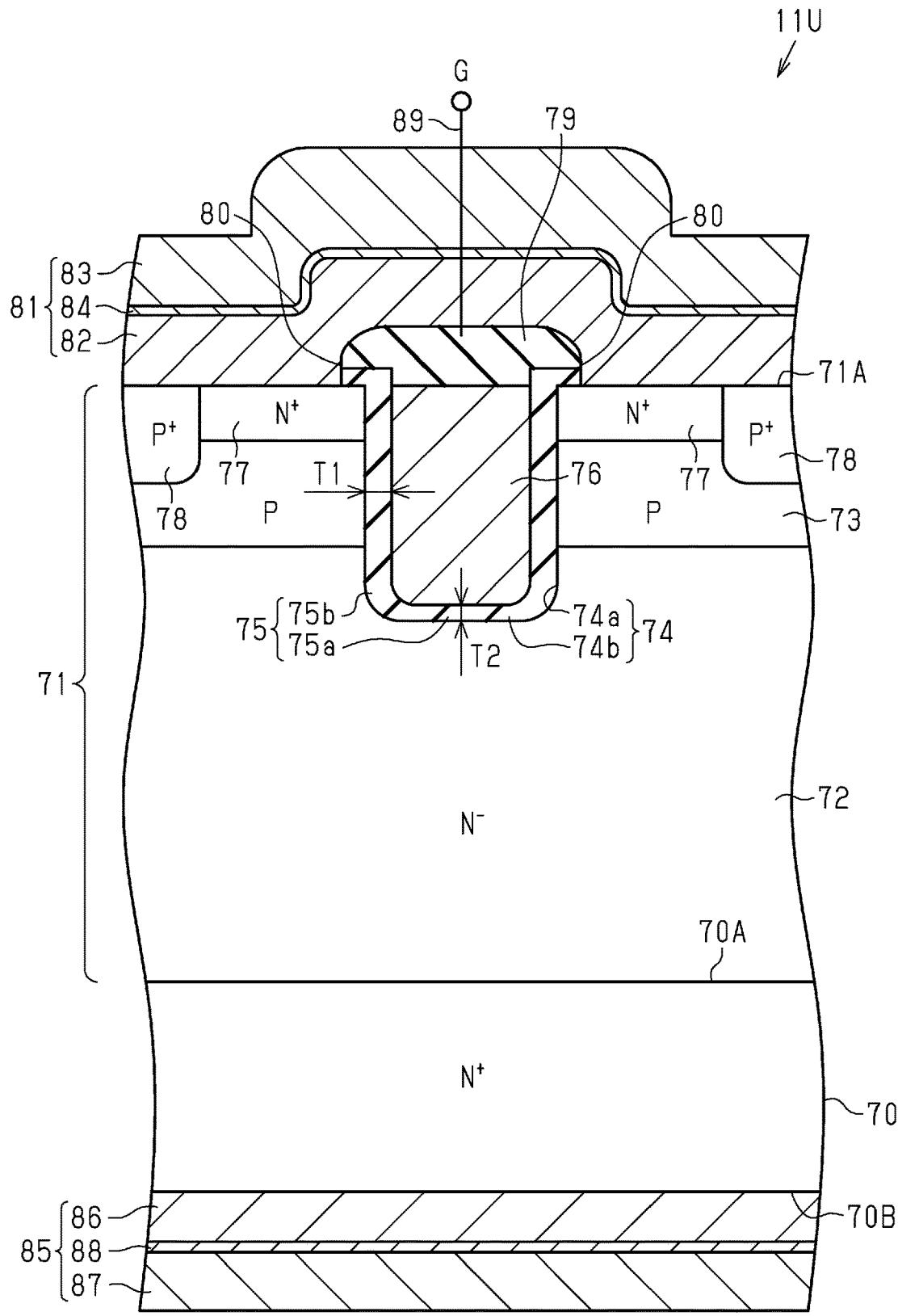
FIG. 11 is a cross-sectional view showing the structure of a MOSFET.

The detailed structures of the MOSFETs 11U to 11W and the MOSFETs 12U to 12W will now be described with reference to FIG. 11. The MOSFETs 11U to 11W and the MOSFETs 12U to 12W have the same structure. Thus, the structure of the MOSFET 11U will be described below, and the MOSFETs 11V and 11W and the MOSFETs 12U to 12W will not be described.

The MOSFET 11U includes a SiC (silicon carbide:silicon carbide) substrate 70. The SiC substrate 70 is doped with an N-type impurity at a high concentration (e.g., 1e18 to 1e21 $cm^{-3}$). The front surface 70A (upper surface) of the SiC substrate 70 is a Si surface, and the back surface 70B (lower surface) is a C surface.

An $N^-$ type epitaxial layer 71 is stacked on the front surface 70A of the SiC substrate 70. The $N^-$ type epitaxial layer 71 is made of SiC doped with an N-type impurity at a lower concentration than the SiC substrate 70. The epitaxial layer 71 is formed on the SiC substrate 70 by so-called epitaxial growth. The epitaxial layer 71 formed on the front surface 70A, which is a Si surface, is grown with the Si surface as a main growth surface. Therefore, the front surface 71A of the epitaxial layer 71 formed by the growth is a Si surface like the front surface 70A of the SiC substrate 70.

The portion (base layer portion) of the epitaxial layer 71 at the side of the C surface opposite to the portion of the Si surface (surface layer portion) forms an $N^-$ type drain region 72 of which the entire region is maintained in a state after the epitaxial growth. The N-type impurity concentration of the drain region 72 is, for example, 1e15 to 1e17 $cm^{-3}$.

A P-type body region 73 is formed in the surface layer portion of the epitaxial layer 71. The body region 73 is in contact with the side of the drain region 72 closer to the front surface 71A (Si surface side) of the epitaxial layer 71. The P-type impurity concentration of the body region 73 is, for example, 1e16 to 1e19 $cm^{-3}$.

In the epitaxial layer 71, a gate trench 74 is formed dug down from the front surface 71A. Although not shown in FIG. 11, a plurality of gate trenches 74 are formed at regular intervals parallel to each other extending in the same direction (direction perpendicular to the plane of drawing of FIG. 11, hereinafter, this direction may be referred to as "direction of gate width") and has, for example, a stripe structure.

The gate trenches 74 are spaced apart from one another and are opposed to one another. Each gate trench 74 has two side surfaces 74a, which are arranged along planes orthogonal to the front surface 71A, and a bottom surface 74b, which has a portion parallel to the front surface 71A. The gate trench 74 extends through the body region 73 in the layer thickness direction, and the deepest portion (bottom surface 74b) reaches the drain region 72.

A gate insulating film 75 is formed on the inner surface of the gate trench 74 and the front surface 71A of the epitaxial layer 71 so as to cover the entire region of the inner surface (side surface 74a and bottom surface 74b) of the gate trench 74. The gate insulating film 75 is an oxide film containing nitrogen (Ni), for example, a silicon nitride oxide film formed by thermal oxidation using a nitrogen-containing gas. The nitrogen content (nitrogen concentration) in the gate insulating film 75 is, for example, 0.1% to 10%.

In the gate insulating film 75, the thickness T2 of the portion (insulating film bottom portion 75a) on the bottom surface 74b of the gate trench 74 is smaller than the thickness T1 of the portion (insulating film side portion 75b) on the side surface 74a. Specifically, the ratio of the thickness T2 of the insulating film bottom portion 75a to the thickness T1 of the insulating film side portion 75b (thickness T2 of the insulating film bottom portion 75a/thickness T1 of the insulating film side portion 75b) is 0.3 to 1.0, and preferably, 0.5 to 1.0. The thickness T1 of the insulating film side portion 75b is, for example, 300 to 1000 Å, and the thickness T2 of the insulating film bottom portion 75a is, for example, 150 to 500 Å.

A gate electrode 76 is embedded in the gate insulating film 75. The gate electrode 76 is formed by completely filling the inner side of the gate insulating film 75 with a polysilicon material doped with N-type impurities at high concentration.

In the surface layer portion of the body region 73, an $N^+$ type source region 77 is formed on both sides in a direction (left and right direction in FIG. 11) orthogonal to the gate width with respect to the gate trench 74. The source region 77 is a region doped with N-type impurity at a high concentration, which is higher than the N-type impurity concentration of the drain region 72. The N-type impurity concentration of the source region 77 is, for example, 1e18 to 1e21 $cm^{-3}$. The source region 77 extends in the direction of gate width at a position adjacent to gate trench 74.

In the epitaxial layer 71, a $P^+$-type body contact region 78 extends through the central portion of the source region 77 in the direction orthogonal to the gate width from the front surface 71A and is connected to the body region 73. The body contact region 78 is a region doped with P-type impurity at high concentration, higher than the P-type impurity concentration of the body region 73. The P-type impurity concentration of the body contact region 78 is, for example, 1e18 to 1e21 $cm^{-3}$.

The gate trench 74 and the source region 77 are alternately arranged in the direction orthogonal to the gate width and extend in the direction of gate width. A boundary between adjacent unit cells in the direction orthogonal to the gate width along the source region 77 is set on the source region 77. At least one body contact region 78 is provided across two adjacent unit cells in the direction orthogonal to the gate width. The boundary between adjacent unit cells in the direction of gate width is set such that the gate electrode 76 included in each unit cell has a constant gate width.

An inter-layer insulating film 79 made of silicon oxide ($SiO_2$) is stacked on the epitaxial layer 71. The inter-layer insulating film 79 and the gate insulating film 75 include contact holes 80 for exposing the front surfaces of the source region 77 and the body contact region 78.

A source wiring 81 is formed on the inter-layer insulating film 79. The source wiring 81 contacts (is electrically connected to) the source region 77 and the body contact region 78 through the contact hole 80. The source wiring 81 includes a polysilicon layer 82, located at a portion in contact with the source region 77 and the body contact region 78, and a metal layer 83, located on the polysilicon layer 82.

The polysilicon layer 82 is a doped layer formed using doped polysilicon doped with an impurity and is preferably, for example, a high concentration doped layer doped with an impurity at a high concentration of 1e19 to 1e21 $cm^{-3}$. As an impurity for forming the polysilicon layer 82 as a doped layer (including high concentration doped layer), an N-type impurity such as phosphorus (P) or arsenic (As) or a P-type impurity such as boron (B) can be used. Furthermore, the polysilicon layer 82 completely fills the contact hole 80. The thickness of the polysilicon layer 82 varies depending on the depth of the contact hole 80, and is, for example, 5000 to 1000 Å.

The metal layer 83 is formed using, for example, aluminum (Al), gold (Au), silver (Ag), copper (Cu), or an alloy thereof and a metal material containing them. The metal layer 83 forms the outermost layer of the source wiring 81, and for example, the first wire 60U and the like are connected (bonded). The thickness of the metal layer 83 is, for example, 1 to 5 μm.

In the source wiring 81, an intermediate layer 84 containing titanium (Ti) is interposed between the polysilicon layer 82 and the metal layer 83. The intermediate layer 84 includes a single layer of a layer containing titanium or a plurality of layers including the layer. The layer containing titanium can be formed using titanium, titanium nitride (TiN), or the like. The thickness of the intermediate layer 84 is, for example, 200 to 500 nm.

The source wiring 81 including such polysilicon layer 82, intermediate layer 84, and metal layer 83 preferably has a stacked structure (Po—Si/Ti/TiN/Al) in which the polysilicon (polysilicon layer 82), titanium (intermediate layer 84), titanium nitride (intermediate layer 84), and aluminum (metal layer 83) are stacked in order.

A drain wiring 85 is formed on the back surface 70B of the SiC substrate 70. The drain wiring 85 contacts (is electrically connected to) the SiC substrate 70. The drain wiring 85 includes a polysilicon layer 86 at a portion in contact with the SiC substrate 70 and includes a metal layer 87 on the polysilicon layer 86.

The polysilicon layer 86 can be formed using the same material as that of the polysilicon layer 82. The thickness of the polysilicon layer 86 is, for example, 1000 to 2000 Å.

The metal layer 87 can be formed using the same material as the metal layer 83. The metal layer 87 forms the outermost layer of the drain wiring 85 and is joined to the island portion 31a when, for example, the SiC substrate 70 is mounted on the island portion 31a of the frame 31. The thickness of the metal layer 87 is, for example, 0.5 to 1 μm.

In the drain wiring 85, an intermediate layer 88 containing titanium (Ti) is interposed between the polysilicon layer 86 and the metal layer 87. The intermediate layer 88 can be formed using the same material as that of the intermediate layer 84.

A gate wiring 89 contacts (is electrically connected to) the gate electrode 76 through a contact hole (not shown) formed in the inter-layer insulating film 79.

When a predetermined voltage (voltage higher than or equal to gate threshold value voltage) is applied to the gate wiring 89 while a predetermined potential difference is generated between the source wiring 81 and the drain wiring 85 (between the source and the drain), a channel is formed in the vicinity of the interface with the gate insulating film 75 in the body region 73 by the electric field from the gate electrode 76. Thus, a current flows between the source wiring 81 and the drain wiring 85, and the MOSFET 11U is turned on.

[Configuration of Low Potential Block Circuit]

Figure 12:
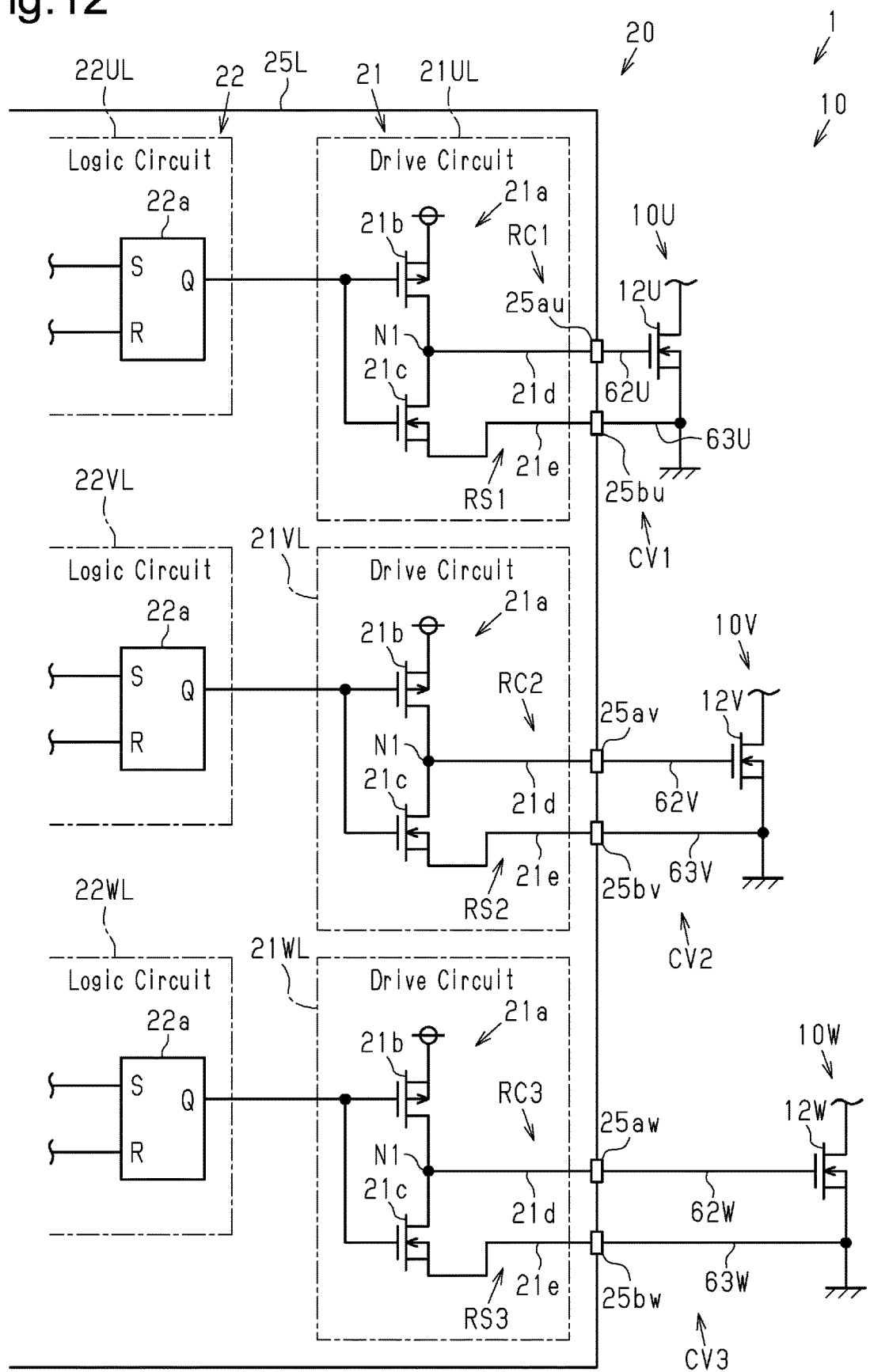
FIG. 12 is a detailed circuit diagram showing the electrical configuration of part of the semiconductor device.

The circuit configuration of the low potential block circuit in the control circuit 20 will now be described with reference to FIG. 12. FIG. 12 shows an example of the circuit configuration of the low potential block circuit.

As shown in FIG. 12, the integrated circuit element 25L includes a first output terminal 25au, a second output terminal 25av, a third output terminal 25aw, a first input terminal 25bu, a second input terminal 25bv, and a third input terminal 25bw. The first output terminal 25au and the first input terminal 25bu are electrically connected to the control circuit 20 (specifically, the drive circuit 21UL of the control circuit 20). The second output terminal 25av and the second input terminal 25bv are electrically connected to the control circuit 20 (specifically, the drive circuit 21VL of the control circuit 20). The third output terminal 25aw and the third input terminal 25bw are electrically connected to the control circuit 20 (specifically, the drive circuit 21WL of the control circuit 20).

The first output terminal 25au is connected to the gate of the MOSFET 12U through the first wire 62U. The first input terminal 25bu is connected to the source of the MOSFET 12U through the first wire 63U. The second output terminal 25av is connected to the gate of the MOSFET 12V through the second wire 62V. The second input terminal 25bv is connected to the source of the MOSFET 12V through the second wire 63V. The third output terminal 25aw is connected to the gate of the MOSFET 12W through the third wire 62W. The third input terminal 25bw is connected to the source of the MOSFET 12W through the third wire 63W.

The drive circuit 21UL includes a source ground circuit 21a which is an output stage. The source ground circuit 21a has a first MOSFET 21b that serves as a P-channel MOSFET and a second MOSFET 21c that serves an N-channel MOSFET. The source of the first MOSFET 21b is electrically connected to the power supply voltage terminal (frame 34CV), and the drain of the first MOSFET 21b is connected to the drain of the second MOSFET 21c. The gate of the first MOSFET 21b and the gate of the second MOSFET 21c are connected in common. The drive circuit 21UL includes output wiring 21d that connects a node N1 between the drain of first MOSFET 21b and the drain of second MOSFET 21c to the first output terminal 25au of the integrated circuit element 25L, and limiting wiring 21e that connects the source of the second MOSFET 21c of the source ground circuit 21a and the first input terminal 25bu of the integrated circuit element 25L. The output wiring 21d and the limiting wiring 21e are each provided in the integrated circuit element 25L. More specifically, the output wiring 21d and the limiting wiring 21e are provided closer to the first output terminal 25au and the first input terminal 25bu than the source ground circuit 21a in the second direction Y. The second MOSFET 21c of the source ground circuit 21a in the drive circuit 21UL is electrically connected to the source of the MOSFET 12U through the limiting wiring 21e, the first input terminal 25bu, and the first wire 63U.

The configurations of drive circuit 21VL and drive circuit 21WL are the same as the configuration of the drive circuit 21UL. The output wiring 21d of the drive circuit 21VL connects the node N1 between the drain of the first MOSFET 21b and the drain of the second MOSFET 21c and the second output terminal 25av of the integrated circuit element 25L. The limiting wiring 21e of the drive circuit 21VL connects the source of the second MOSFET 21c of the source ground circuit 21a and the second input terminal 25bv of the integrated circuit element 25L. The second MOSFET 21c of the source ground circuit 21a in the drive circuit 21VL is electrically connected to the source of the MOSFET 12V through the limiting wiring 21e, the second input terminal 25bv, and the second wire 63V. The output wiring 21d of the drive circuit 21WL connects a node N1 between the drain of the first MOSFET 21b and the drain of the second MOSFET 21c and the third output terminal 25aw of the integrated circuit element 25L. The limiting wiring 21e of the drive circuit 21WL connects the source of the second MOSFET 21c of the source ground circuit 21a and the third input terminal 25bw of the integrated circuit element 25L. The second MOSFET 21c of the source ground circuit 21a in the drive circuit 21WL is electrically connected to the source of the MOSFET 12V through the limiting wiring 21e, the third input terminal 25bw, and the third wire 63W.

Thus, the semiconductor device 1 includes a first control path RC1 that electrically connects the drive circuit 21UL and the gate (control terminal) of the MOSFET 12U, a second control path RC2 that electrically connects the drive circuit 21VL and the gate (control terminal) of the MOSFET 12V, and a third control path RC3 that electrically connects the drive circuit 21WL and the gate (control terminal) of the MOSFET 12W.

The first control path RC1 transmits the drive signal of the drive circuit 21UL to the gate of the MOSFET 12U. The first control path RC1 includes the output wiring 21d of the drive circuit 21UL and the first wire 62U. That is, the first wire 62U forms part of the first control path RC1.

The second control path RC2 transmits the drive signal of the drive circuit 21VL to the gate of the MOSFET 12V. The second control path RC2 includes the output wiring 21d of the drive circuit 21VL and the second wire 62V. That is, the second wire 62V forms part of the second control path RC2.

The third control path RC3 transmits the drive signal of the drive circuit 21WL to the gate of the MOSFET 12W. The third control path RC3 includes the output wiring 21d of the drive circuit 21WL and the third wire 62W. That is, the third wire 62W forms part of the third control path RC3.

The semiconductor device 1 further includes a first limiting path RS1 that electrically connects the first control path RC1 and the source (second terminal) of the MOSFET 12U, a second limiting path RS2 that electrically connects the second control path RC2 and the source (second terminal) of the MOSFET 12V, and a third limiting path RS3 that electrically connects the third control path RC3 and the source (second terminal) of the MOSFET 12W.

The first limiting path RS1 includes limiting wiring 21e of the drive circuit 21UL and the first wire 63U. That is, the first wire 63U forms part of the first limiting path RS1. The second limiting path RS2 includes limiting wiring 21e of the drive circuit 21VL and the second wire 63V. That is, the second wire 63V forms part of the second limiting path RS2. The third limiting path RS3 includes limiting wiring 21e of the drive circuit 21WL and the third wire 63W. That is, the third wire 63W forms part of the third limiting path RS3.

Each of the logic circuits 22UL, 22VL, and 22WL includes an RS flip-flop circuit 22a and the like. The RS flip-flop circuit 22a includes a set terminal (S terminal) to which a set signal is input, a reset terminal (R terminal) to which a reset signal is input, and an output terminal (Q terminal) from which an output signal is output. The RS flip-flop circuit 22a sets the output signal to a high level with the falling edge of the set signal as a trigger and sets the output signal to a low level using the falling edge of the reset signal as a trigger. The RS flip-flop circuit 22a is electrically connected to the gate of each of the MOSFETs 21b and 21c and outputs an output signal to the gate. Each of the MOSFETs 21b and 21c is complementarily turned on and off based on the output signal of the RS flip-flop circuit 22a. This generates a drive signal output to the gate of the MOSFET 12L through the output wiring 21d.

The operation of the present embodiment will now be described.

The semiconductor device 1 includes a limiting unit that reduces fluctuation of the source-gate voltage of the MOSFET 12U. More specifically, as shown in FIG. 12, the semiconductor device 1 includes a first limiting unit CV1 as a limiting unit. The first limiting unit CV1 is a mechanism for reducing fluctuation of the source-gate voltage of the MOSFET 12U based on the voltage fluctuation of the source of the MOSFET 12U and includes the first limiting path RS1.

Since the source of the second MOSFET 21c of the source ground circuit 21a of the drive circuit 21UL and the source of the MOSFET 12U are electrically connected by the first limiting unit CV1 (first limiting path RS1), even if the source potential of the MOSFET 12U floats due to the current change dI/dt when the MOSFET 11U is turned on and the inductance of the first wire 61U connected to the source of the MOSFET 12U, the source potential of the second MOSFET 21c of the source ground circuit 21a of the drive circuit 21UL floats following the source potential of the MOSFET 12U. Thus, shifting of the gate-source voltage of the MOSFET 12U to a negative value is limited. As a result, the fluctuation of the threshold value voltage Vth of the MOSFET 12U is reduced. As a result, even when the intermittent operation of the first inverter circuit 10U is repeated, an increase in the rate of fluctuation of the threshold value voltage Vth of the MOSFET 12U is reduced.

The semiconductor device 1 further includes a second limiting unit CV2 and a third limiting unit CV3 serving as limiting units. The second limiting unit CV2 is a mechanism for reducing fluctuation of the source-gate voltage of the MOSFET 12V based on the voltage fluctuation of the source of the MOSFET 12V and includes the second limiting path RS2. The third limiting unit CV3 is a mechanism for reducing fluctuation of the source-gate voltage of the MOSFET 12W based on the voltage fluctuation of the source of the MOSFET 12W and includes the third limiting path RS3. This configuration also limits increases in the rate of fluctuation of the threshold value voltage Vth of the MOSFETs 12L and 12L for the MOSFETs 12V and 12L in the same manner as the MOSFET 12U.

The present embodiment has the advantages described below.

(1-1) The semiconductor device 1 includes the first limiting unit CV1 (first limiting path RS1), the second limiting unit CV2 (second limiting path RS2), and the third limiting unit CV3 (third limiting path RS3). According to this configuration, even if the source potential of the MOSFET 12U fluctuates, the gate potential of the MOSFET 12U follows and fluctuates, and thus the fluctuation of the source-gate voltage of the MOSFET 12U is reduced. Even if the source potential of the MOSFET 12V fluctuates, the gate potential of the MOSFET 12V follows and fluctuates, and thus the fluctuation of the source-gate voltage of the MOSFET 12V is reduced. Even if the source potential of the MOSFET 12W fluctuates, the gate potential of the MOSFET 12W follows and fluctuates, and thus the fluctuation of the source-gate voltage of the MOSFET 12W is reduced. Therefore, the fluctuation of threshold value voltage Vth can be reduced for each of the MOSFETs 12U to 12W.

(1-2) The first wire 63U that forms part of the first limiting path RS1 is connected to the source electrode pad 12s of the MOSFET 12U. Thus, the potential on the source side of the MOSFET 12U can be extracted from the first wire 61U connected to the source electrode pad 12s of the MOSFET 12U as the source side of the MOSFET 12U. The MOSFET 12U can thus be controlled by the gate-source voltage of the MOSFET 12U in which the influence of the inductance of the first wire 61U is reduced. The second wire 63V that forms part of the second limiting path RS2 is connected to the source electrode pad 12s of the MOSFET 12V. The third wire 63W that forms part of the third limiting path RS3 is connected to the source electrode pad 12s of the MOSFET 12W. Thus, effects similar to the first wire 63U are obtained since the second wire 63V and the third wire 63W have the same configuration as the first wire 63U.

In addition, the distances between the MOSFETs 12U to 12W and the integrated circuit element 25L is shorter than the distances between the frames 35U, 35V and 35W and the integrated circuit element 25L. This shortens the lengths of the respective wires 62U, 62V, 62W and the lengths of the wires 63U, 63V, 63W connecting the sources of the MOSFETs 12U to 12W and the integrated circuit element 25L. Therefore, the influence of the inductance of each wire 62U, 62V, 62W and the influence of the inductance of each wire 63U, 63V, 63W can be reduced.

(1-3) The MOSFET 12U is disposed in the region Ra7 of the element mounting region Rse of the first frame 32U at the end closer to the integrated circuit element 25L in the second direction Y. Thus, the distance between the MOSFET 12U and the integrated circuit element 25L is shortened. This shortens the length of the first wire 62U and the length of the first wire 63U connecting the MOSFET 12U and the integrated circuit element 25L. Therefore, the influence of the inductance of the first wire 62U and the influence of the inductance of the first wire 63U can be reduced. The MOSFET 12V is disposed at the end in the region Ra7 of the element mounting region Rse of the second frame 32V closer to the integrated circuit element 25L in the second direction Y. The MOSFET 12W is disposed in the region Ra7 of the element mounting region Rse of the third frame 32W at the end closer to the integrated circuit element 25L in the second direction Y. With such a configuration, the lengths of the wires 62V and 62W and the lengths of the wires 63V and 63W can be shortened in the same manner as the first wire 62U and the first wire 63U. Thus, the influence of the inductance of each wire 62V and 62W and the influence of the inductance of each wire 63V and 63W can be reduced.

(1-4) The first wire 63U is connected to the portion of the source electrode pad 12s of the MOSFET 12U closer to integrated circuit element 25L. The second wire 63V is connected to a portion of the source electrode pad 12s of the MOSFET 12V closer to the integrated circuit element 25L. The third wire 63W is connected to a portion of the source electrode pad 12s of the MOSFET 12W closer to the integrated circuit element 25L. According to such a configuration, the length of each wire 63U, 63V, 63W can be shortened. Therefore, the influence of the inductance of each wire 63U, 63V, 63W can be reduced.

(1-5) The wires 63U, 63V, and 63W are connected to the end of the integrated circuit element 25L closer to the MOSFETs 12U to 12W in the second direction Y. Thus, the length of each wire 63U, 63V, 63W can be shortened. Therefore, the influence of the inductance of each wire 63U, 63V, 63W can be reduced.

(1-6) Each of the frames 32U, 32V, 32W include the grooves 32g, 32h forming the element mounting region Rse. Thus, when the MOSFETs 12U to 12W are mounted in the region Ra7 of the element mounting region Rse, the solder SD does not spread beyond the element mounting region Rse. If the melted solder SD is directed toward the edges of the grooves 32g and 32h, surface tension restricts movement of the solder SD beyond the grooves 32g and 32h and the edges of the grooves 32g and 32h function to stop the melted solder SD at the grooves 32g and 32h. The grooves 32g and 32h are formed to surround the entire periphery of the MOSFETs 12U to 12W and further limits spreading of the solder SD. Since the grooves 31d and 31e of the frame 31 have the same configuration as the grooves 32g and 32h, the solder SD does not spread beyond the element mounting region Rse when the MOSFETs 11U to 11W are mounted on the element mounting region Rse.

(1-7) The frame 31 includes the recesses 31f, and each frame 32U, 32V, 32W includes the recesses 32i. According to this configuration, the encapsulation resin 50, which enters the recesses 31f and 32i, increase the strength joining the encapsulation resin 50 to the frame 31 and the frames 32U, 32V and 32W. Therefore, delamination of the encapsulation resin 50 from the frame 31 and the frames 32U, 32V, 32W can be reduced.

(1-8) The recesses 31f and 32i are not provided in the element mounting region Rse. Thus, joining of the MOSFETs 11U to 11W to the frame 31 by the solder SD and joining of the MOSFETs 12U to 12W to the frames 32U, 32V, 32W by the solder SD can be appropriately performed. In addition, the recess 31f of the frame 31 is disposed so as to surround the element mounting region Rse. Thus, the encapsulation resin 50 is firmly joined to the island portion 31a of the frame 31 so as to surround the MOSFETs 11U to 11W. The recess 32i of each frame 32U, 32V, 32W is arranged to surround the element mounting region Rse. Thus, the encapsulation resin 50 surrounds the MOSFETs 12U to 12W and is firmly joined to the island portions 33a of the frames 32U, 32V, and 32W. This reduces the generation of air gaps leading to the MOSFETs 11U to 11W and the MOSFETs 12U to 12W in the encapsulation resin 50 that would result from delamination of the encapsulation resin 50. Therefore, the insulating states of the MOSFETs 11U to 11W and the MOSFETs 12U to 12W can be maintained in a satisfactory state.

Second Embodiment

The semiconductor device 1 in accordance with a second embodiment will now be described with reference to FIGS. 13 and 14. The semiconductor device 1 in accordance with the present embodiment differs from the semiconductor device 1 in accordance with the first embodiment in the configuration of the drive circuits 21UL, 21VL, and 21WL. In the following description, same reference numerals are given to those components that are the same as the semiconductor device 1 in accordance with the first embodiment. Such components will not be described.

Figure 13:
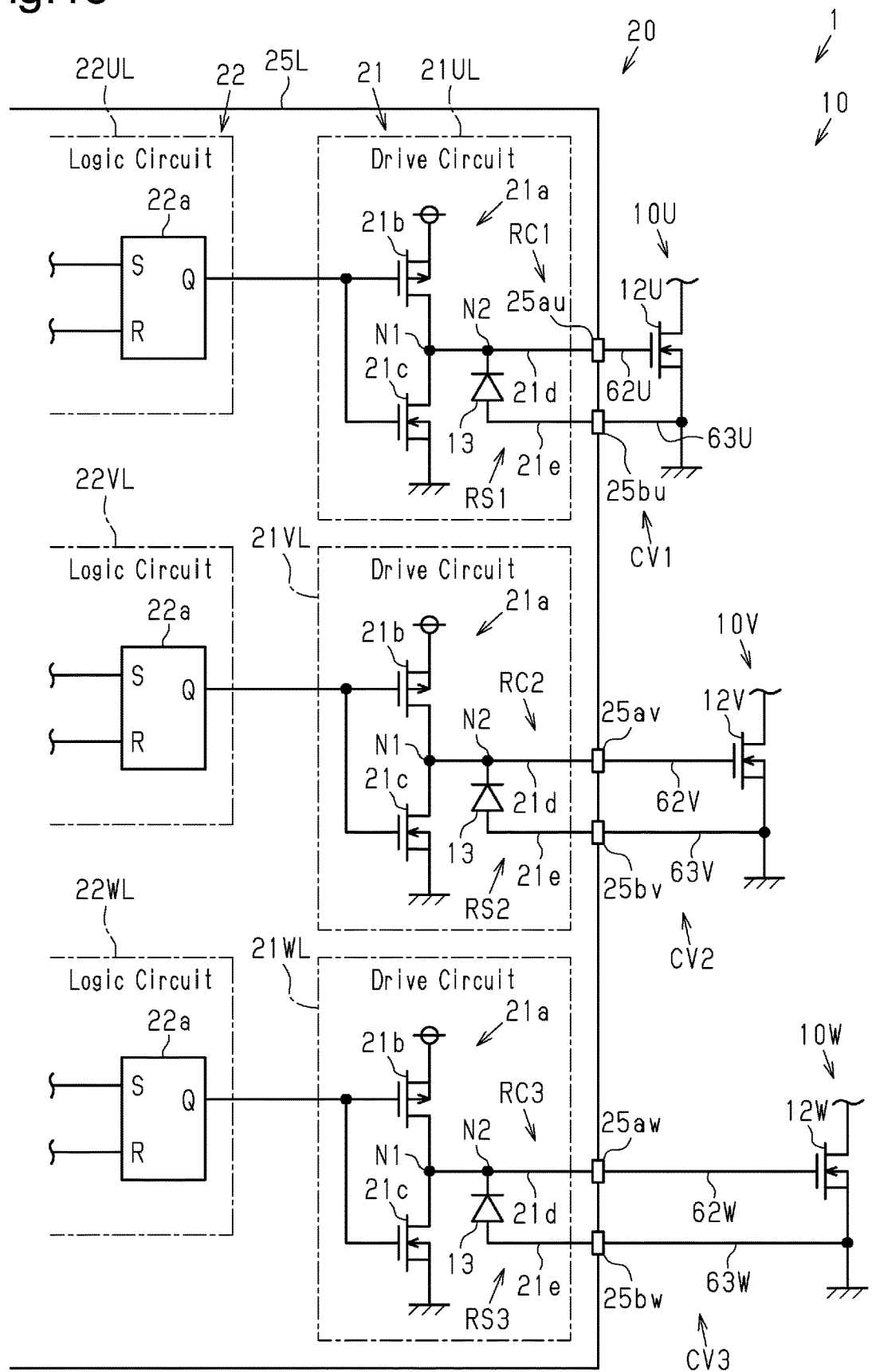
FIG. 13 is a detailed circuit diagram showing the electrical configuration of part of a semiconductor device in accordance with a second embodiment.

As shown in FIG. 13, the first limiting unit CV1 includes a diode 13 provided in the first limiting path RS1. The second limiting unit CV2 includes a diode 13 provided in the second limiting path RS2. The third limiting unit CV3 includes a diode 13 provided in the third limiting path RS3. Each diode 13 is mounted on the integrated circuit element 25L. More specifically, the diode 13 of the first limiting unit CV1 is provided on the limiting wiring 21e of the drive circuit 21UL. The anode of the diode 13 is electrically connected to the first input terminal 25bu, and the cathode is electrically connected to the node N2 of the output wiring 21d of the drive circuit 21UL. The diode 13 of the second limiting unit CV2 is provided on the limiting wiring 21e of the drive circuit 21VL. The anode of the diode 13 is electrically connected to the second input terminal 25bv, and the cathode is electrically connected to the node N2 of the output wiring 21d of the drive circuit 21VL. The diode 13 of the third limiting unit CV3 is provided on the limiting wiring 21e of the drive circuit 21WL. The anode of the diode 13 is electrically connected to the third input terminal 25bw, and the cathode is electrically connected to the node N2 of the output wiring 21d of the drive circuit 21WL.

Figure 14:
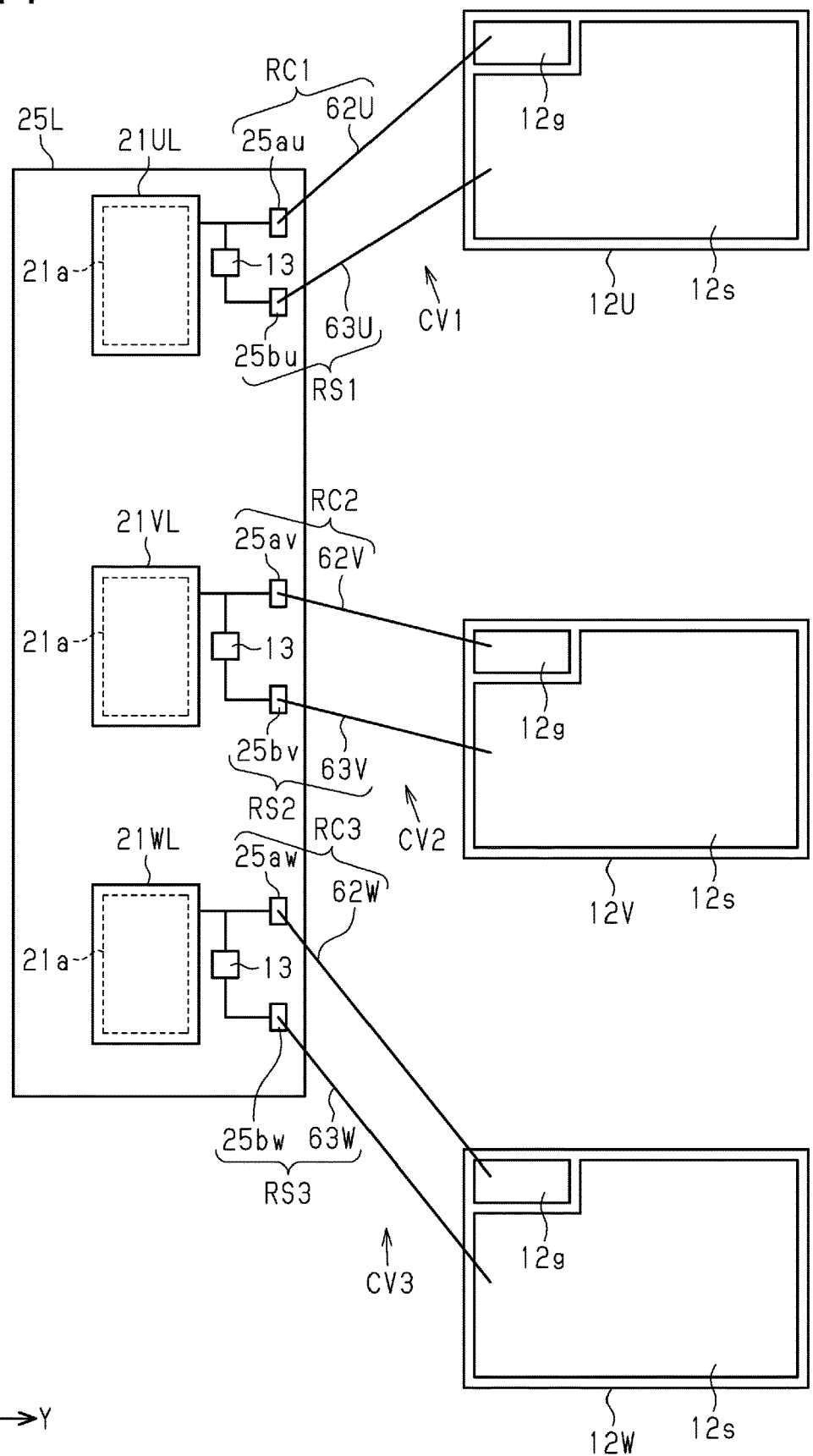
FIG. 14 is a schematic plan view showing the element layout in part of the integrated circuit element of the semiconductor device.

As shown in FIG. 14, in the integrated circuit element 25L, the drive circuit 21UL, the drive circuit 21VL, and the drive circuit 21WL are arranged in the first direction X. That is, the drive circuit 21UL, the drive circuit 21VL, and the drive circuit 21WL are arranged in the longitudinal direction of the integrated circuit element 25L. Here, the direction (first direction X) in which the drive circuit 21UL, the drive circuit 21VL, and the drive circuit 21WL are arranged is an example of the layout direction of the third control circuit, the fourth control circuit, and the fifth control circuit.

The diode 13 of the first limiting unit CV1 is disposed near the source ground circuit 21a of the drive circuit 21UL. More specifically, the diode 13 of the first limiting unit CV1 is disposed closer to the first output terminal 25au and the first input terminal 25bu side, or the MOSFET 12U, than the source ground circuit 21a of the drive circuit 21UL in the second direction Y.

The diode 13 of the second limiting unit CV2 is disposed near the source ground circuit 21a of the drive circuit 21VL. More specifically, the diode 13 of the second limiting unit CV2 is disposed closer to the second output terminal 25av and the second input terminal 25bv, or the MOSFET 12V, than the source ground circuit 21a of the drive circuit 21VL in the second direction Y.

The diode 13 of the third limiting unit CV3 is disposed near the source ground circuit 21a of the drive circuit 21WL. More specifically, the diode 13 of the third limiting unit CV3 is disposed closer to the third output terminal 25aw and the third input terminal 25bw, or the MOSFET 12W, than the source ground circuit 21a of the drive circuit 21WL in the second direction Y.

The operation of the present embodiment will now be described. Since the operation is the same in each of the inverter circuits 10U, 10V and 10W, the operation of the first inverter circuit 10U will be described. The operation of the second inverter circuit 10V and the third inverter circuit 10W will not be described.

When the MOSFET 11U of the first inverter circuit 10U is turned on, the source potential of the MOSFET 12U floats due to the change dI/dt in the current flowing through the MOSFET 11U and the inductance of the first wire 61U connected to the MOSFET 12U. Consequently, the potential at the output wiring 21d of the drive circuit 21UL becomes higher through the first wire 63U connected to the source of the MOSFET 12U and the limiting wiring 21e of the integrated circuit element 25L. Thus, the gate-source voltage of the MOSFET 12U does not become a negative value, and fluctuation of the threshold value voltage Vth of the MOSFET 12U can be reduced.

The present embodiment has the advantages described below in addition to the advantages of the first embodiment.

(2-1) The diodes 13 are provided on the limiting wiring 21e of the drive circuits 21UL, 21VL and 21WL. Thus, the source potential of the MOSFETs 12U to 12W is not increased by the output voltage of the drive circuits 21UL, 21VL, 21WL when the MOSFETs 12U to 12W are turned on. Therefore, the current flowing in each of MOSFETs 12U to 12W can be controlled with high accuracy.

(2-2) The diode 13 of the first limiting unit CV1 is disposed closer to the first output terminal 25au and the first input terminal 25bu than the source ground circuit 21a of the drive circuit 21UL. The diode 13 of the second limiting unit CV2 is disposed closer to the second output terminal 25av and the second input terminal 25bv than the source ground circuit 21a of the drive circuit 21VL. The diode 13 of the third limiting unit CV3 is disposed closer to the third output terminal 25aw and the third input terminal 25bw than the source ground circuit 21a of the drive circuit 21WL. Thus, the length of the limiting wiring 21e of the drive circuits 21UL, 21VL, and 21WL can be shortened, and the influence of the inductance of the limiting wiring 21e can be reduced.

(2-3) Each diode 13 is provided in the integrated circuit element 25L. According to such a configuration, the semiconductor device 1 can be reduced in size as compared with a configuration in which each diode 13 is provided as a semiconductor chip separate from the integrated circuit element 25L.

Third Embodiment

The semiconductor device 1 in accordance with a third embodiment will now be described with reference to FIGS. 9 and 15. The semiconductor device 1 in accordance with the present embodiment differs from the semiconductor device 1 in accordance with the first embodiment in the arrangement mode of the MOSFET 12U. In the following description, same reference characters are given to components that are the same as the components of the semiconductor device 1 in accordance with the first embodiment. Such components will not be described.

As shown in FIG. 9, in the first embodiment, the orientations (arrangement positions) of the MOSFETs 12U to 12W mounted on the frames 32U, 32V, and 32W are the same. The MOSFETs 12U to 12W in FIG. 9 are mounted on the frames 32U, 32V, and 32W such that the second direction Y is the longitudinal direction. In this case, the length of the first wire 62U and the length of the first wire 63U of the MOSFET 12U of the first frame 32U disposed on the most frame 31 side among the frames 32U, 32V, and 32W become longer.

Figure 15:
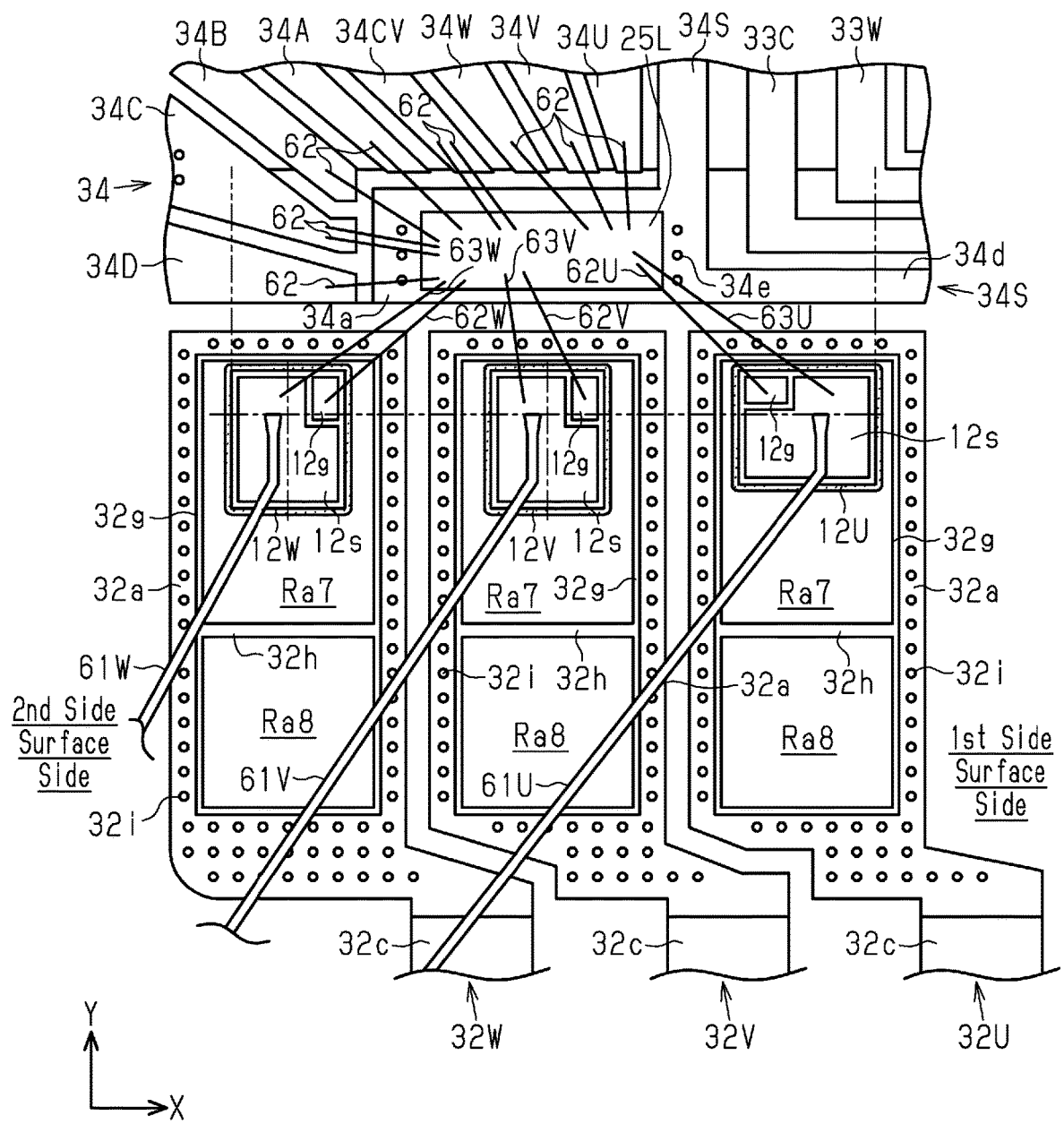
FIG. 15 is a plan view in which part of the layout inside a semiconductor device in accordance with a third embodiment is enlarged.
Figure 16:
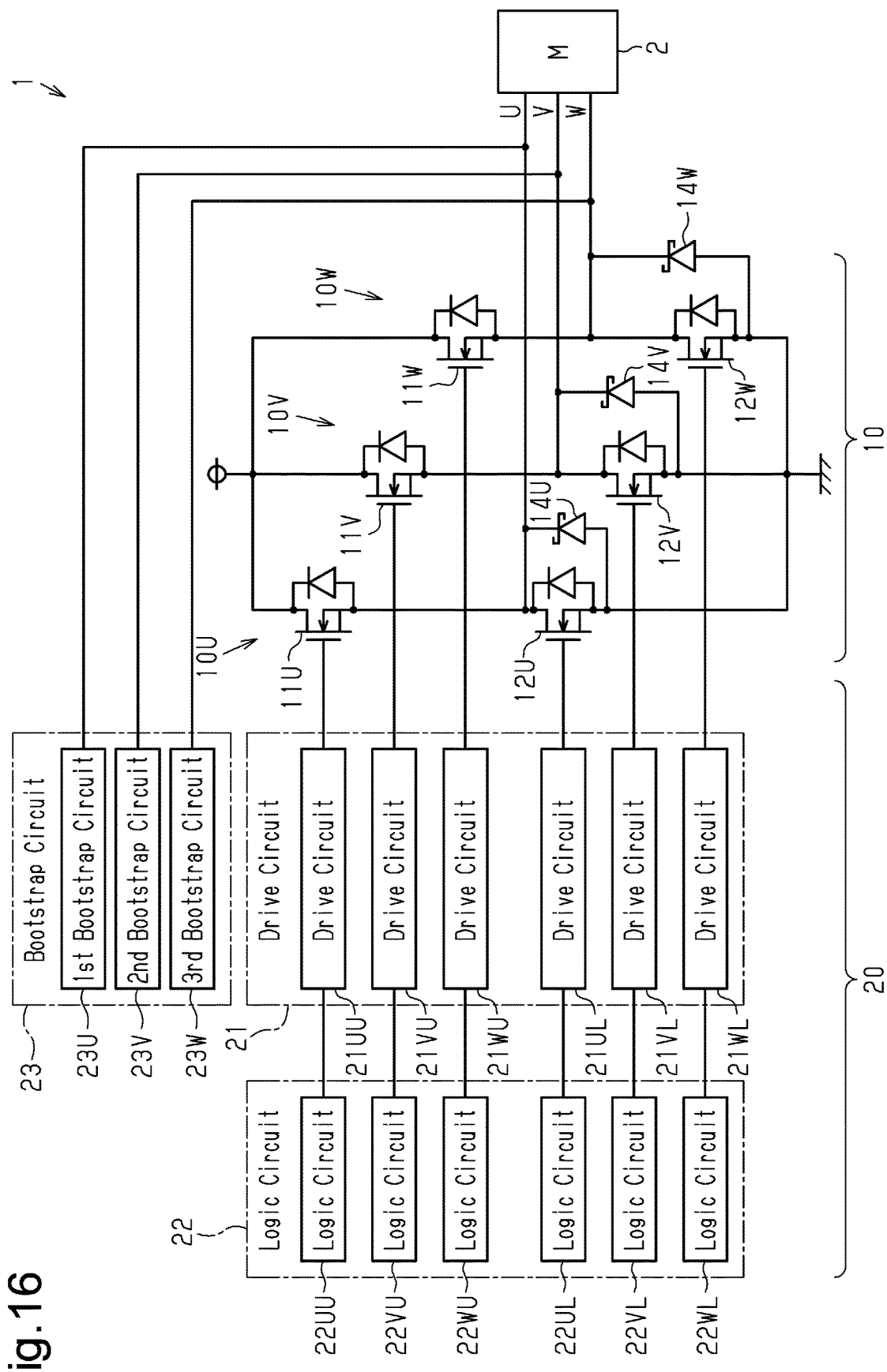
FIG. 16 is a block diagram showing the electrical configuration of a semiconductor device in accordance with a fourth embodiment.

Thus, in the present embodiment, as shown in FIG. 15, the orientation (arrangement position) of the MOSFET 12U mounted in the first frame 32U is different from the orientation (arrangement position) of the MOSFET 12V mounted in the second frame 32V and the MOSFET 12W mounted in the third frame 32W. More specifically, the MOSFET 12U of the first frame 32U is mounted on the first frame 32U such that the first direction X is the longitudinal direction. Furthermore, the MOSFET 12U is mounted on the first frame 32U such that the gate electrode pad 12g approaches the integrated circuit element 25L. More specifically, the MOSFET 12U is mounted on the first frame 32U such that the gate electrode pad 12g is closer to the MOSFET 12V in the first direction X and closer to the frame 34 in the second direction Y on the front surface of the MOSFET 12U.

Furthermore, in the present embodiment, the arrangements of the first wire 63U for connecting the source electrode pad 12s of the MOSFET 12U and the integrated circuit element 25L and the first wire 62U for connecting the gate electrode pad 12g of the MOSFET 12U and the integrated circuit element 25L are different. Specifically, the first wire 62U is disposed closer to the second frame 32V than the first wire 63U. The first wire 62U is adjacent in the first direction X to the gate electrode pad 12g in the source electrode pad 12s and connected to the region at the side of the frame 33.

According to the present embodiment, the advantages described below can be obtained in addition to the advantages of the first embodiment.

(3-1) Since the MOSFET 12U mounted on the first frame 32U is disposed on the first frame 32U such that the gate electrode pad 12g approaches the integrated circuit element 25L, the length of the first wire 62U connecting the gate electrode pad 12g and the integrated circuit element 25L can be shortened. Therefore, the influence of the inductance of the first wire 62U can be reduced.

Fourth Embodiment

The semiconductor device 1 in accordance with a fourth embodiment will now be described with reference to FIGS. 16, 17, 18A, and 18B. The semiconductor device 1 in accordance with the present embodiment differs from the semiconductor device 1 in accordance with the first embodiment in that a limiting unit for reducing fluctuation of the potential of the sources of the MOSFETs 12U to 12W when the MOSFETs 11U to 11W are turned on is provided. In the following description, same reference characters are given to those components that are the same as the components of the semiconductor device 1 in accordance with the first embodiment. Such components will not be described.

Figure 17:
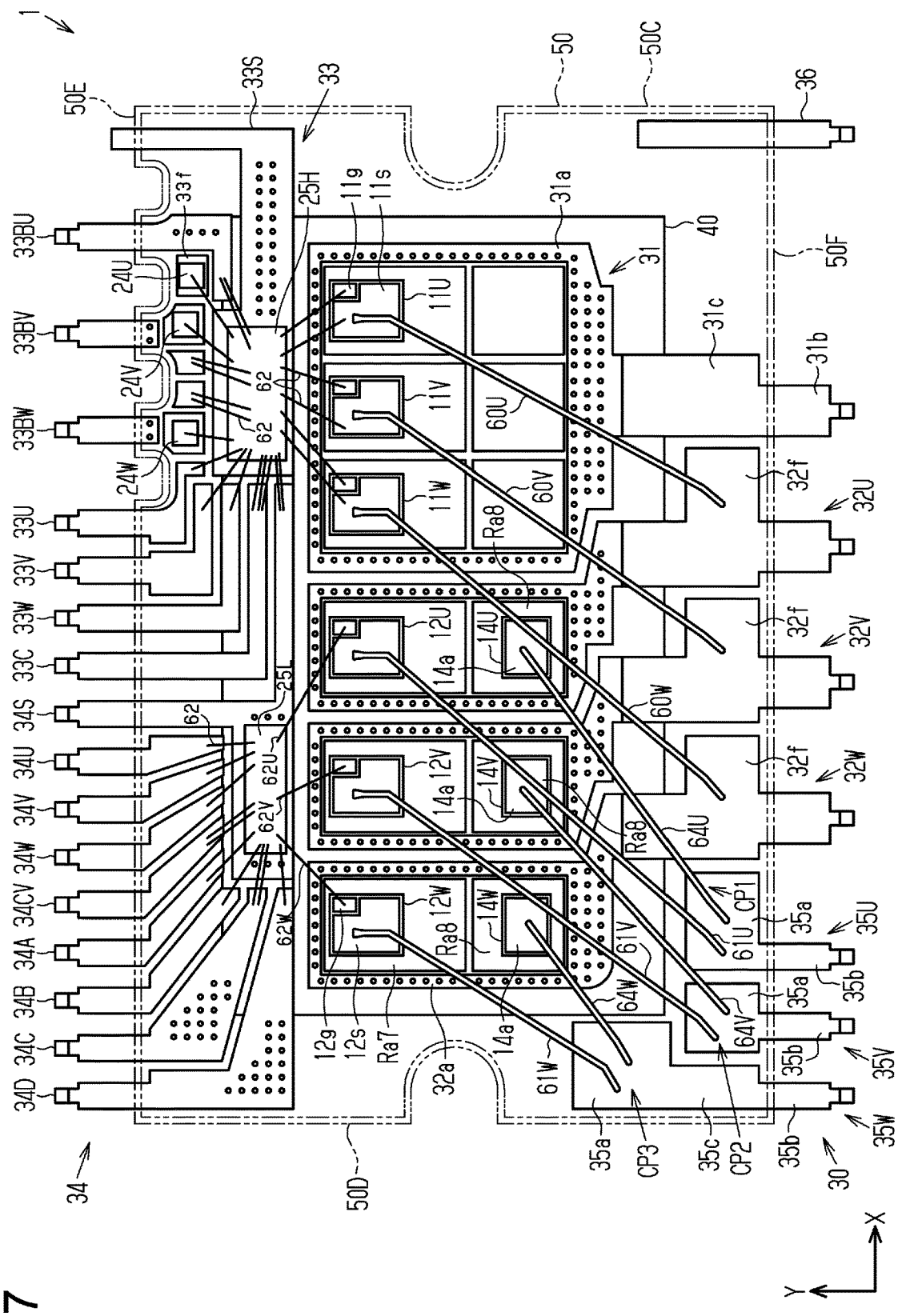
FIG. 17 is a plan view showing the layout inside the semiconductor device.

As shown in FIG. 17, instead of the first limiting unit CV1, the second limiting unit CV2, and the third limiting unit CV3 (all shown in FIG. 14) serving as the limiting units in the first embodiment, the semiconductor device 1 includes a first limiting unit CP1, a second limiting unit CP2, and a third limiting unit CP3 serving as a limiting unit.

The first limiting unit CP1 is a mechanism that reduces fluctuation in the potential of the source of the MOSFET 12U when the MOSFET 11U is turned on. The first limiting unit CP1 includes a first diode 14U which is an example of a sixth diode connected to the second switching element of the first inverter circuit 10U. The anode of the first diode 14U is connected to the source of the MOSFET 12U, and the cathode of the first diode 14U is connected to the drain of the MOSFET 12U.

The second limiting unit CP2 is a mechanism that reduces fluctuation in the potential of the source of the MOSFET 12V when the MOSFET 11V is turned on. The second limiting unit CP2 includes a second diode 14V which is an example of a seventh diode connected to the second switching element of the second inverter circuit 10V. The anode of the second diode 14V is connected to the source of the MOSFET 12V and the cathode of the second diode 14V is connected to the drain of the MOSFET 12V.

The third limiting unit CP3 is a mechanism that reduces fluctuation in the potential of the source of the MOSFET 12W when the MOSFET 11W is turned on. The third limiting unit CP3 includes a third diode 14W which is an example of an eighth diode connected to the second switching element of the third inverter circuit 10W. The anode of the third diode 14W is connected to the source of the MOSFET 12W, and the cathode of the third diode 14W is connected to the drain of the MOSFET 12W.

One example of each of the diodes 14U, 14V, 14W is a Schottky barrier diode. In the present embodiment, the first diode 14U is configured such that its forward voltage Vf is lower than the forward voltage of the body diode of the MOSFET 12U. The second diode 14V is configured such that its forward voltage Vf is lower than the forward voltage of the body diode of the MOSFET 12V. The third diode 14W is configured such that its forward voltage is lower than the forward voltage of the body diode of the MOSFET 12W. As shown in FIG. 17, each of the diodes 14U, 14V and 14W is formed by a semiconductor chip. The first diode 14U is mounted in the region Ra8 of the first frame 32U, the second diode 14V is mounted in the region Ra8 of the second frame 32V, and the third diode 14W is mounted in the region Ra8 of the third frame 32W. The diodes 14U, 14V, and 14W are located closer to the fourth side surface 50F of the encapsulation resin 50 in the second direction Y in the region Ra8.

Each of the diodes 14U, 14V, 14W has an anode electrode pad 14a which is a front surface electrode and a cathode electrode which is a back surface electrode. The cathode electrode of the first diode 14U is electrically connected to the first frame 32U by solder or the like. The cathode electrode of the second diode 14V is electrically connected to the second frame 32V by solder or the like. The cathode electrode of the third diode 14W is electrically connected to the third frame 32W by solder or the like.

As shown in FIG. 17, the first limiting unit CP1 further includes a first wire 61U and a first diode wire 64U which is an example of a fourth diode wire provided separately from the first wire 61U. The first wire 61U connects the source electrode pad 12s of the MOSFET 12U of the first frame 32U and the island portion 35a of the frame 35U. The first wire 61U is extended through the second diode 14V of the second frame 32V and the connecting portion 32c of the third frame 32W and connected to the frame 35U. The first diode wire 64U connects the anode electrode pad 14a of the first diode 14U and the island portion 35a of the frame 35U. The first diode wire 64U is extended through the connecting portion 32c of the frame 32V and the connecting portion 32c of the frame 32W and connected to the frame 35U. In the island portion 35a of the frame 35U, the position where the first wire 61U is connected differs from the position where the first diode wire 64U. More specifically, the position where the first wire 61U is connected to the island portion 35a of the frame 35U is located closer to the connecting portion 32c of the third frame 32W than the position where the first diode wire 64U is connected to the island portion 35a of the frame 35U.

The second limiting unit CP2 further includes a second wire 61V and a second diode wire 64V which is an example of a fifth diode wire provided separately from the second wire 61V. The second wire 61V connects the source electrode pad 12s of the MOSFET 12V of the second frame 32V and the island portion 35a of the frame 35V. The second wire 61V is extended through the third diode 14W of the third frame 32W and connected to the frame 35V. The second diode wire 64V connects the anode electrode pad 14a of the second diode 14V and the island portion 35a of the frame 35V. The second diode wire 64V is extended through the end on the connecting portion 32c side of the island portion 32a of the frame 32W and connected to the frame 35V. In the island portion 35a of the frame 35V, the position where the second wire 61V is connected differs from the position where the second diode wire 64V is connected. More specifically, the position where the second wire 61V is connected to the island portion 35a of the frame 35V is located closer to the island portion 35a of the frame 35U than the position where the second diode wire 64V is connected to the island portion 35a of the frame 35V.

The third limiting unit CP3 further includes a third wire 61W and a third diode wire 64W which is an example of a sixth diode wire provided separately from the third wire 61W. The third wire 61W connects the source electrode pad 12s of the MOSFET 12W of the third frame 32W and the island portion 35a of the frame 35W. The third wire 61W is extended through a portion closer to the region Ra7 than the third diode 14W of the frame 32W and connected to the frame 35W. The third diode wire 64W connects the anode electrode pad 14a of the third diode 14W and the island portion 35a of the frame 35W. In the island portion 35a of the frame 35W, the position where the third wire 61W is connected differs from the position where the third diode wire 64W is connected. More specifically, the position where the third wire 61W is connected to the island portion 35a of the frame 35W is located closer to the island portion 32a of the third frame 32W than the position where the third diode wire 64W is connected to the island portion 35a of the frame 35W.

Each of the diode wires 64U, 64V, 64W is made of, for example, aluminum (Al). The diode wires 64U, 64V, 64W have equal wire diameters. The wire diameters of each of the diode wires 64U, 64V, 64W is equal to the wire diameters of each of the wires 61U, 61V, 61W.

[Structure of First to Third Diodes]

Figure 18A:
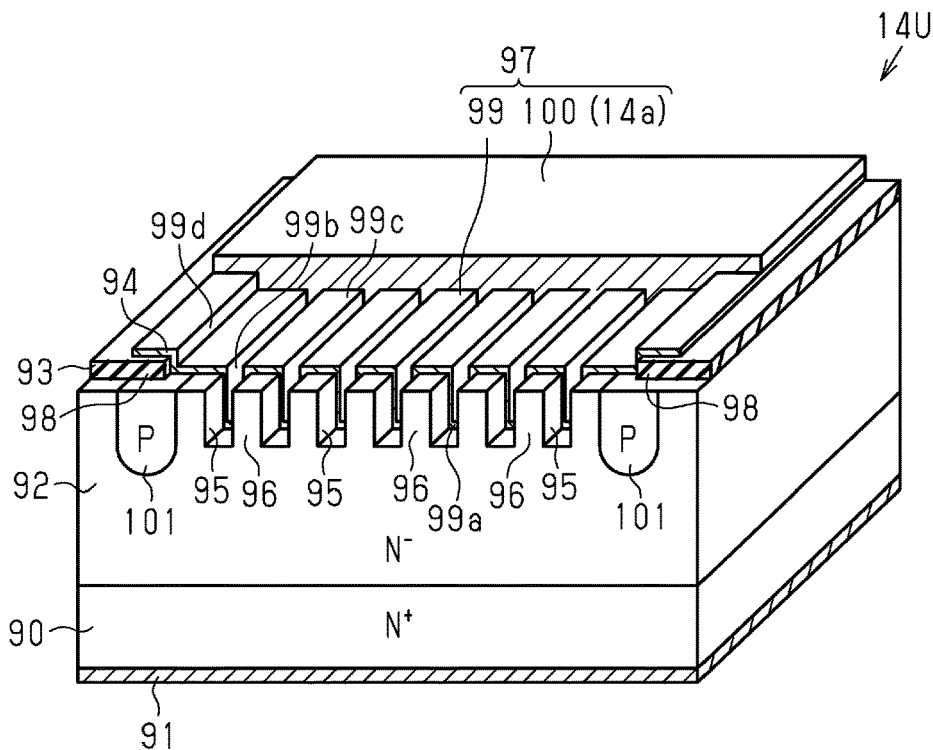
FIG. 18A is a cross-sectional perspective view showing the structure of a diode.
Figure 18B:
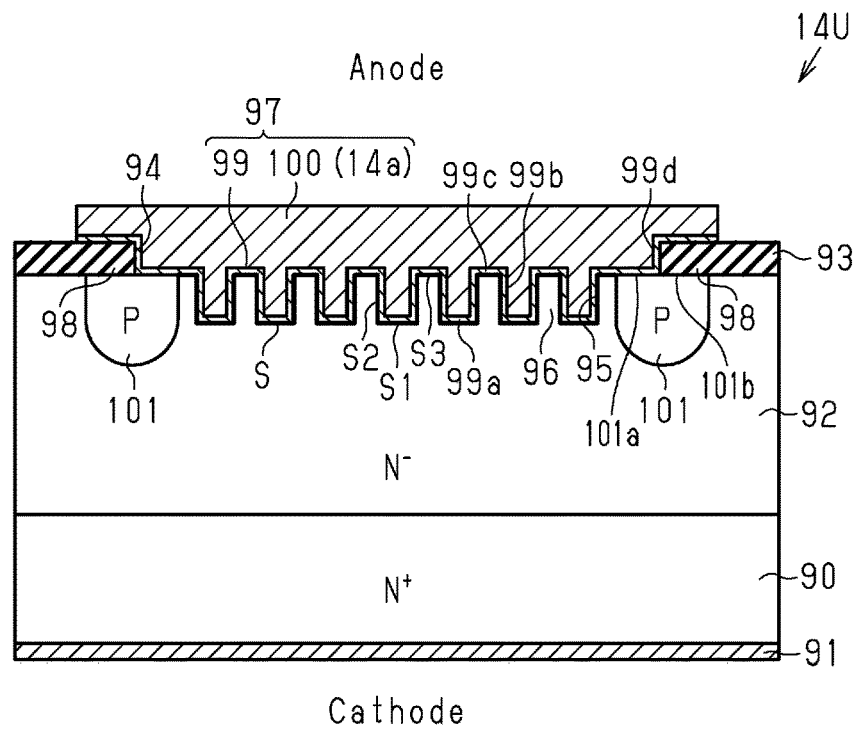
FIG. 18B is a cross-sectional view showing the structure of a diode.

With reference to FIGS. 18A and 18B, an example of the structure of each diode 14U, 14V, and 14W will now be described. Since the structures of the diodes 14U, 14V, and 14W are the same, the structure of the first diode 14U will be described below, and the structures of the second diode 14V and the third diode 14W will not be described.

The first diode 14U includes an N$^+$ type (e.g., N-type impurity concentration is 1e18 to 1e21 cm$^{-3}$) silicon substrate 90. A cathode electrode 91 is formed on the back surface of the silicon substrate 90 so as to cover the entire region. The cathode electrode 91 is made of a metal (e.g., gold (Au), nickel (Ni), silicide, cobalt (Co) silicide etc.) that comes in Ohmic contact with the N-type silicon.

An N$^-$ type (e.g., N-type impurity concentration is 1e15 to 1e17 cm$^{-3}$) epitaxial layer 92 (semiconductor layer) having a lower concentration than the silicon substrate 90 is stacked on the front surface of the silicon substrate 90. The thickness of the epitaxial layer 92 is, for example, 2 μm to 20 μm.

A field insulating film 93 made of, for example, silicon oxide (SiO$_2$) is stacked on the front surface of the epitaxial layer 92. The thickness of the field insulating film 93 is, for example, greater than or equal to 1000 Å, and preferably 7000 Å to 40,000 Å. The field insulating film 93 may be formed of another insulator such as silicon nitride (SiN).

The field insulating film 93 has an opening 94 for exposing the central portion of the epitaxial layer 92. In the surface layer portion of the central portion of the epitaxial layer 92, a plurality of trenches 95 are formed by digging the epitaxial layer 92 from the front surface. Each trench 95 is a vertical groove extending in a predetermined direction. The bottom surface of the trench 95 is a plane that lies along the front surface of the epitaxial layer 92. Therefore, the cross section of each trench 95 has a substantially rectangular shape. In the present embodiment, seven trenches 95 extend in parallel at predetermined intervals. That is, seven trenches 95 are stripes in a plan view.

In the surface layer portion of the epitaxial layer 92, a mesa portion 96 is formed in a portion sandwiched by the adjacent trenches 95. In a case where the trench 95 has a substantially rectangular-shaped cross section, the mesa portion 96 accordingly has a substantially rectangular-shaped cross section. Each mesa portion 96 includes, for example, two side wall surfaces (side wall surfaces of the trench 95), which extend substantially perpendicularly from one side edge in the bottom surface of each of two adjacent trenches 95, and a ceiling surface (front surface of the epitaxial layer 92), which connects the two side wall surfaces.

An anode electrode 97 is formed on the epitaxial layer 92. The anode electrode 97 fills the inside of the opening 94 of the field insulating film 93 and protrudes outward of the opening 94 so as to cover the peripheral edge portion 98 of the opening 94 in the field insulating film 93. That is, the peripheral edge portion 98 of the field insulating film 93 is sandwiched by the epitaxial layer 92 and the anode electrode 97 from the upper and lower sides over the entire periphery. The amount of protrusion of the anode electrode 97 covering the peripheral edge portion 98 of the field insulating film 93 from the end of the opening 94 of the field insulating film 93 is, for example, greater than or equal to 10 μm, and preferably 10 μm to 100 μm.

The anode electrode 97 has a multilayer structure (in the present embodiment, a two-layer structure) including a Schottky metal 99, which is joined to the epitaxial layer 92 in the opening 94 of the field insulating film 93, and a contact metal 100, which is stacked on the Schottky metal 99.

The Schottky metal 99 is made of a metal (e.g., titanium (Ti), molybdenum (Mo), palladium (Pd) etc.) which forms a Schottky junction by the joining with the N-type silicon. Titanium is used as the Schottky metal 99 of the present embodiment. The Schottky metal 99 is formed to come into contact with the front surface of the epitaxial layer 92 including the inner wall surface (bottom surface and two side wall surfaces) of the trench 95. Therefore, the Schottky metal 99 is in contact with the inner wall surfaces of all the trenches 95 and the front surface of the epitaxial layer 92 outside the trenches 95. In addition, the Schottky metal 99 covers the entire region of the inner wall surface of each trench 95 and extends continuously to the outside of the trench 95. That is, the Schottky metal 99 is joined to the front surface of the epitaxial layer 92 exposed from the opening 94 of the field insulating film 93 so as to completely cover the entire region. The Schottky metal 99 according to the present embodiment includes a bottom surface portion 99a that comes into contact with the bottom surface of the trench 95, a side surface portion 99b that comes into contact with the side wall surface of the trench 95 (side wall surface of the mesa portion 96), and a ceiling surface portion 99c that comes into contact with the ceiling surface of the mesa portion 96.

In this case, as shown by a thick line in FIG. 18B, the joining surface (Schottky junction surface) S between the Schottky metal 99 and the front surface of the epitaxial layer 92 is formed to have an irregular cross section in the region within the opening 94 of the field insulating film 93. Therefore, the area of the Schottky junction surface S is larger than the visible area of the epitaxial layer 92 in a plan view along the normal direction of the front surface (portion extending in the horizontal direction in FIG. 18B) of the epitaxial layer 92. More specifically, the Schottky junction surface S includes a bottom surface portion S1 that comes into contact with the bottom surface of the trench 95, a side surface portion S2 that comes into contact with the side wall surface of the trench 95 (side wall surface of the mesa portion 96), and a ceiling surface portion S3 that comes into contact with the ceiling surface of the mesa portion 96. When the trench 95 has a substantially rectangular-shaped cross section, the area of the Schottky junction surface S can be increased by the amount of the side surface portion S2 as compared with a case where the trench 95 is not formed.

The Schottky metal 99 joined to the epitaxial layer 92 forms a Schottky barrier (potential barrier) of, for example, 0.52 eV to 0.9 eV with the silicon semiconductor forming the epitaxial layer 92. The thickness of the Schottky metal 99 in the present embodiment is 0.02 µm to 0.2 µm.

The contact metal 100 is a portion of the anode electrode 97 exposed to the outermost surface of the first diode 14U and to which a first diode wire 64U (see FIG. 17) and the like are joined. That is, the contact metal 100 forms an anode electrode pad 14a. The contact metal 100 is made of, for example, aluminum (Al). The thickness of the contact metal 100 of the present embodiment is, for example, 0.5 µm to 5 µm. The contact metal 100 is embedded in each trench 95 so as to come into contact with the Schottky metal 99 covering the inner wall surface of each trench 95. That is, the contact metal 100 is in contact with the bottom surface portion 99a, the two side surface portions 99b, and the ceiling surface portion 99c of the Schottky metal 99. Therefore, the contact metal 100 is formed to have an irregular cross section at the side that comes into contact with the Schottky metal 99 of each trench 95. The front surface of the contact metal 100 opposite to the side in contact with the Schottky metal 99 is flat and extends along the front surface of the epitaxial layer 92 (excluding inner wall surface of trench 95).

When the Schottky metal 99 is made of titanium, a titanium nitride (TiN) layer is preferably interposed between the Schottky metal 99 and the contact metal 100 made of aluminum. The titanium nitride layer functions as a barrier layer that adheres titanium of the Schottky metal 99 and aluminum of the contact metal 100 while securing conductivity between titanium and aluminum and further reducing mutual diffusion of titanium and aluminum. Such a barrier layer protects the Schottky junction surface S by reducing or preventing the material of the contact metal 100 from diffusing into the Schottky metal 99.

A surface protective film (not shown) may be formed on the outermost surface of the first diode 14U. In this case, an opening for exposing the contact metal 100 is preferably formed in the central portion of the surface protective film. An external connection member such as the first diode wire 64U (see FIG. 17) is joined to the contact metal 100 through the opening.

A guard ring 101 including a P-type diffusion layer is formed in contact with the Schottky metal 99 on a surface layer portion of the epitaxial layer 92. The guard ring 101 is formed along the contour of the opening 94 so as to extend across the inside and the outside of the opening 94 of the field insulating film 93 in a plan view. Therefore, the guard ring 101 includes an inner side portion 101a that protrudes inward of the opening 94 of the field insulating film 93 and comes into contact with the outer edge portion 99d which is the terminal end of the Schottky metal 99 in the opening 94, and an outer side portion 101b that protrudes outward of the opening 94 and faces the anode electrode 97 (Schottky metal 99 on the peripheral edge portion 98) with the peripheral edge portion 98 of the field insulating film 93 therebetween. The depth from the front surface of the epitaxial layer 92 of the guard ring 101 is, for example, 0.5 µm to 8 µm.

The guard ring 101 formed across the inside and the outside of the opening 94 of the field insulating film 93 covers the boundary portion between the peripheral edge portion 98 of the field insulating film 93 and the Schottky metal 99 from side of the epitaxial layer 92. In a case where the guard ring 101 is not present, when a reverse bias is applied to the first diode 14U, the electric field is concentrated at the boundary portion, and leakage tends to occur easily. In the first diode 14U according to the present embodiment, the guard ring 101 covers the boundary portion, so that the concentration of electric field can be reduced by the depletion layer spreading from the guard ring 101 when reverse bias is applied, and the leakage can be reduced accordingly. Therefore, the withstand voltage of the first diode 14U is increased.

Figure 19:
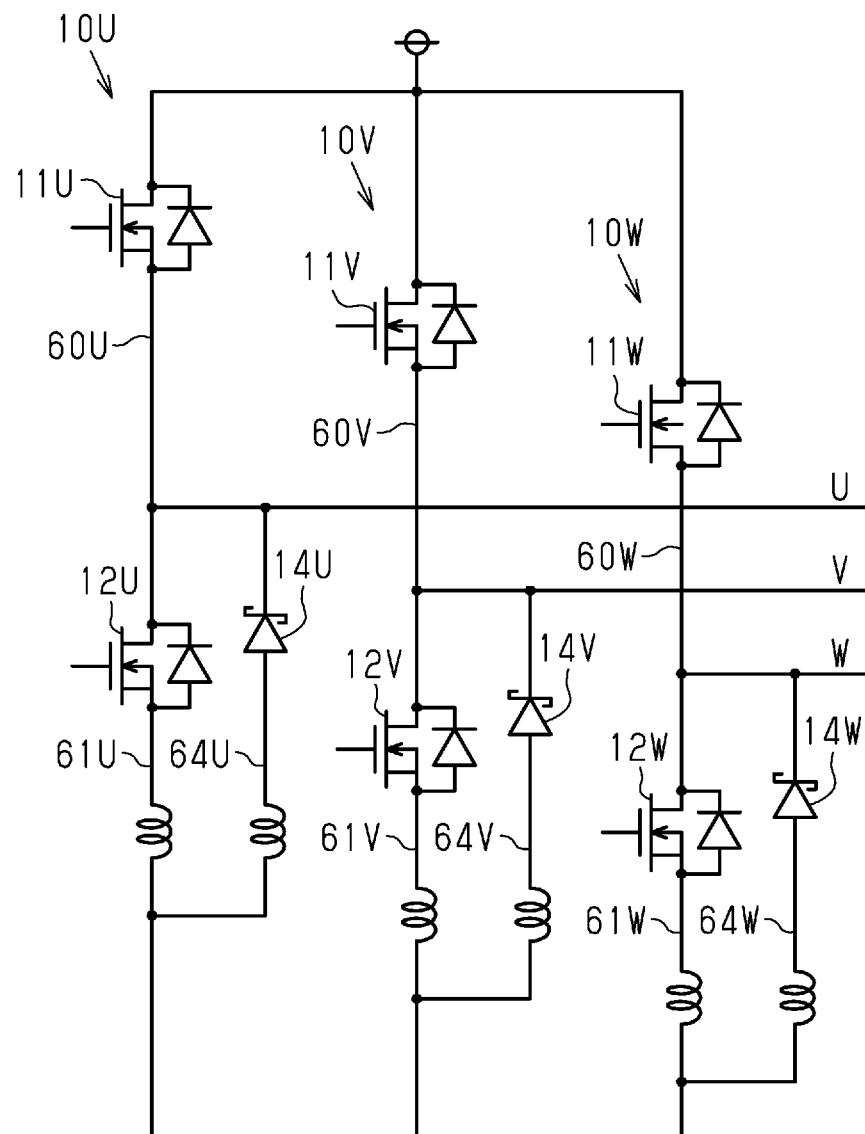
FIG. 19 is a circuit diagram illustrating the operation of the fourth embodiment and showing the electrical connection configuration of a drive unit.

The operation of the present embodiment will now be described with reference to FIG. 19. The comparative semiconductor device is a semiconductor device that does not include the limiting units CP1, CP2, CP3 (diodes 14U, 14V, 14W and diode wires 64U, 64V, 64W).

In the comparative semiconductor device, for example, when the motor 2 (see FIG. 1) is driven, a regenerative current flows through the body diode of the MOSFET 12U when the MOSFET 11U is turned off, and the recovery current flows to the body diode of the MOSFET 12U when the MOSFET 11U is turned on at this time. At this time, due to the influence of the inductance of the first wire 61U, a so-called negative bias may occur in which the source potential of the MOSFET 12U floats and becomes higher than the gate potential of the MOSFET 12U.

In this respect, the semiconductor device 1 in accordance with the present embodiment has a configuration in which the first diode wire 64U and the first wire 61U are separately provided as the first limiting unit CP1, and the first diode wire 64U is connected to the island portion 35a of the frame 35U. Therefore, for example, when the MOSFET 11U is turned on when the motor 2 is driven (see FIG. 1), the regenerative current generated by turning off the MOSFET 12U flows through the first diode 14U as the forward voltage Vf of the first diode 14U is lower than the forward voltage of the body diode of the MOSFET 12U. That is, this regenerative current does not flow through the body diode of the MOSFET 12U through the first wire 61U. This limits floating resulting from the source potential of the MOSFET 12U generated due to the current change dI/dt when the MOSFET 11U is turned on and the inductance of the first wire 61U. The occurrence of negative bias of the MOSFET 12U can thus be reduced.

In addition, the second diode wire 64V and the second wire 61V, and the third diode wire 64W and the third wire 61W have the same configuration as the first diode wire 64U and the first wire 61U and operate in the same manner.

According to the present embodiment, the advantage described below can be obtained in addition to the advantages of the first embodiment.

(4-1) Floating of the source potential of the MOSFETs 12U to 12W is limited by separately providing the wires 61U, 61V, 61W connected to the MOSFETs 12U to 12W and the diode wires 64U, 64V, 64W. Thus, the gate-source voltage of the MOSFET 12U does not become a negative value when the MOSFET 11U is turned on. Furthermore, the gate-source voltage of the MOSFET 12V does not become a negative value when the MOSFET 11V is turned on. Moreover, the gate-source voltage of the MOSFET 12W does not become a negative value when the MOSFET 11W is turned on. Therefore, the fluctuation of threshold value voltage Vth can be reduced for each of the MOSFETs 12U to 12W.

Fifth Embodiment

The semiconductor device 1 in accordance with a fifth embodiment will now be described with reference to FIGS. 20 and 21. The semiconductor device 1 in accordance with the present embodiment differs from the semiconductor device 1 in accordance with the fourth embodiment in that a diode connected in antiparallel to each of the MOSFETs 11U to 11W is added. In the following description, same reference characters are given to components that are the same as the semiconductor device 1 in accordance with the fourth embodiment, and the description thereof may be omitted.

Figure 20:
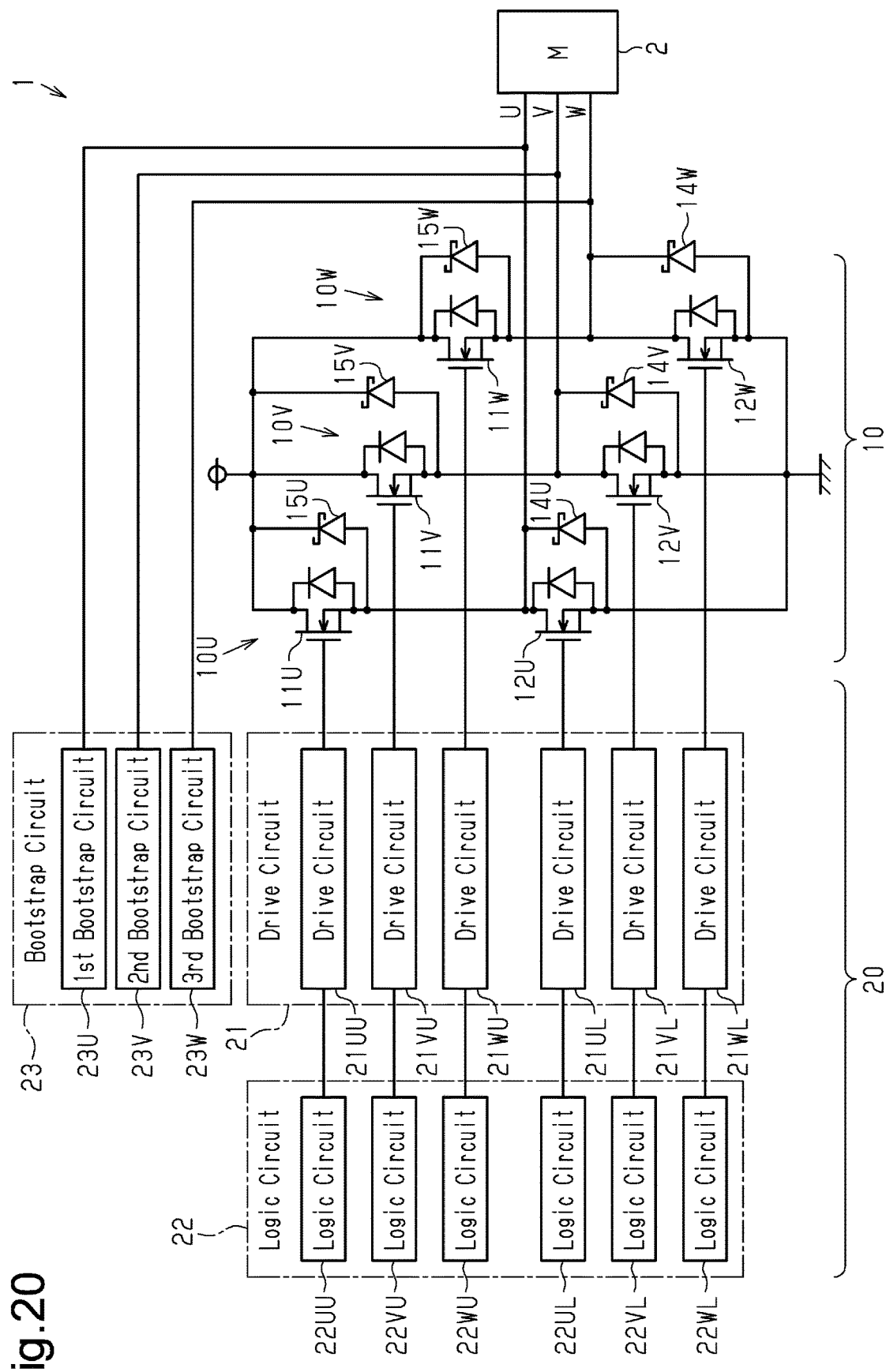
FIG. 20 is a block diagram showing the electrical configuration of a semiconductor device in accordance with a fifth embodiment.

As shown in FIG. 20, the semiconductor device 1 includes a first diode 15U provided separately from the MOSFET 11U, a second diode 15V provided separately from the MOSFET 11V, and a third diode 15W provided separately from the MOSFET 11W. The anode of the first diode 15U is connected to the source of the MOSFET 11U, and the cathode of the first diode 15U is connected to the drain of the MOSFET 11U. The anode of the second diode 15V is connected to the source of the MOSFET 11V, and the cathode of the second diode 15V is connected to the drain of the MOSFET 11V. The anode of the third diode 15W is connected to the source of the MOSFET 11W, and the cathode of the third diode 15W is connected to the drain of the MOSFET 11W. The first diode 15U is an example of a third diode provided separately from the first switching element of the first inverter circuit 10U and electrically connected to the first switching element. The second diode 15V is an example of a fourth diode provided separately from the first switching element of the second inverter circuit 10V and electrically connected to the first switching element. The third diode 15W is an example of a fifth diode provided separately from the first switching element of the third inverter circuit 10W and electrically connected to the first switching element.

One example of each of the diodes 15U, 15V, and 15W is a Schottky barrier diode like each of the diodes 14U, 14V, and 14W. As shown in FIG. 21, each of the diodes 15U, 15V and 15W is formed by a semiconductor chip. The first diode 15U is mounted in the region Ra4 of the frame 31, the second diode 15V is mounted in the region Ra5, and the third diode 15W is mounted in the region Ra6. The first diode 15U is located closer to the fourth side surface 50F of the encapsulation resin 50 in the second direction Y in the region Ra6, the second diode 15V is located closer to the fourth side surface 50F of the encapsulation resin 50 in the second direction Y in the region Ra7, and the third diode 15W is located closer to the fourth side surface 50F of the encapsulation resin 50 in the second direction Y in the region Ra6.

Each of the diodes 15U, 15V, 15W has an anode electrode pad 15a, which is a front surface electrode, and a cathode electrode, which is a back surface electrode. The cathode electrodes of the diodes 15U, 15V, 15W are electrically connected to the frame 31 by solder or the like.

The anode electrode pad 15a of the first diode 15U and the wire joining portion 32f of the first frame 32U are connected by the first wire 60U. The anode electrode pad 15a of the second diode 15V and the wire joining portion 32f of the second frame 32V are connected by the second wire 60V. The anode electrode pad 15a of the third diode 15W and the wire joining portion 32f of the third frame 32W are connected by the third wire 60W.

Figure 21:
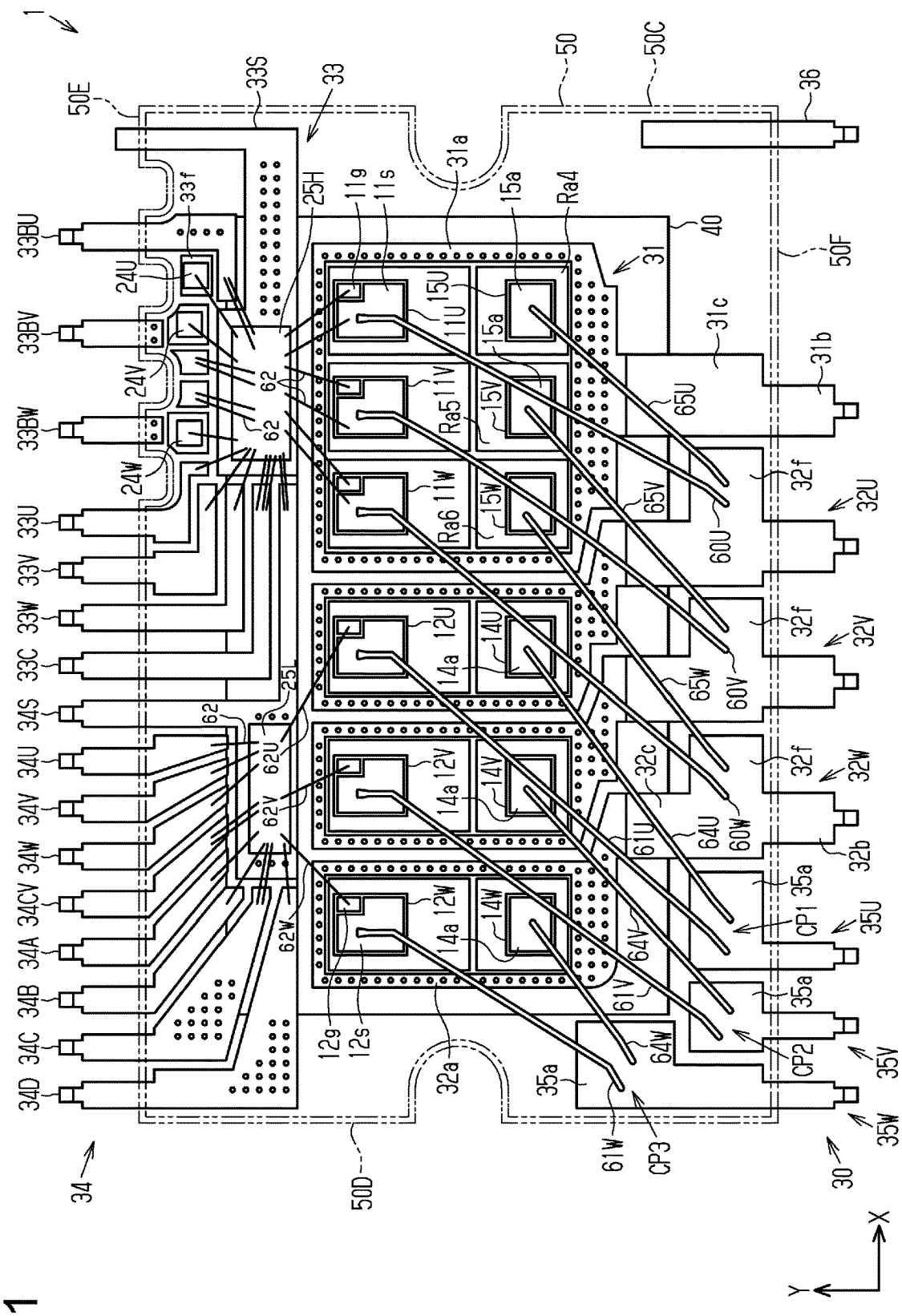
FIG. 21 is a plan view showing the layout inside the semiconductor device.

As shown in FIG. 21, the semiconductor device 1 includes each of the wires 60U, 60V, and 60W, the first diode wire 65U on the high potential side, the second diode wire 65V on the high potential side, and the third diode wire 65W on the high potential side, each of the wires 61U, 61V, 61W, and each of the diode wires 64U, 64V, 64W on the low potential side. The configurations and connecting modes of the wires 61U, 61V, 61W and the diode wires 64U, 64V, 64W are the same as those in the fourth embodiment. The diode wires 64U, 64V, 64W are generally parallel to one another. The diode wires 65U, 65V, 65W are generally parallel to one another. The respective diode wires 64U, 64V, 64W and the diode wires 65U, 65V, 65W are provided generally parallel to one another.

One first wire 60U connects the source electrode pad 11s of the MOSFET 11U and the wire joining portion 32f of the first frame 32U. One second wire 60V connects the source electrode pad 11s of the MOSFET 11V and the wire joining portion 32f of the second frame 32V. One third wire 60W connects the source electrode pad 11s of the MOSFET 11W and the wire joining portion 32f of the third frame 32W. The first wire 60U is extended through the first diode 15U side than the second diode wire 65V of the second diode 15V and connected to the wire joining portion 32f of the first frame 32U. The second wire 60V is extended through the second diode 15V side than the third diode wire 65W of the third diode 15W and the connecting portion 32c of the first frame 32U and connected to the wire joining portion 32f of the second frame 32V. The third wire 60W is extended through the third diode 15W side than the first diode wire 64U of the first diode 14U of the first frame 32U and the connecting portion 32c of the second frame 32V and connected to the wire joining portion 32f of the third frame 32W.

The first diode wire 65U is provided separately from the first wire 60U. One first diode wire 65U connects the anode electrode pad 15a of the first diode 15U and the wire joining portion 32f of the frame 32U. The position where the first wire 60U is connected to the wire joining portion 32f of the first frame 32U differs from the position where the first diode wire 65U is connected to the wire joining portion 32f of the first frame 32U. More specifically, the position where the first wire 60U is connected to the wire joining portion 32f of the first frame 32U is located closer to the wire joining portion 32f of the second frame 32V than the position where the first diode wire 65U is connected to the wire joining portion 32f of the first frame 32U. The first diode wire 65U is extended through the connecting portion 31c of the frame 31 and connected to the wire joining portion 32f of the first frame 32U. The second diode wire 65V is extended through the connecting portion 32c of the first frame 32U and is connected to the wire joining portion 32f of the second frame 32V. The third diode wire 65W is extended through the island portion 32a of the first frame 32U and the connecting portion 32c of the second frame 32V and connected to the wire joining portion 32f of the third frame 32W.

The second diode wire 65V is provided separately from the second wire 60V. One second diode wire 65V connects the anode electrode pad 15a of the second diode 15V and the wire joining portion 32f of the second frame 32V. The position where the second wire 60V is connected to the wire joining portion 32f of the second frame 32V differs from the position where the second diode wire 65V is connected to the wire joining portion 32f of the second frame 32V. More specifically, the position where the second diode wire 65V is connected to the wire joining portion 32f of the second frame 32V is located closer to the wire joining portion 32f of the first frame 32U than the position where the second wire 60V is connected to the wire joining portion 32f of the second frame 32V.

The third diode wire 65W is provided separately from the third wire 60W. One third diode wire 65W connects the anode electrode pad 15a of the third diode 15W and the wire joining portion 32f of the third frame 32W. The position where the third wire 60W is connected to the wire joining portion 32f of the third frame 32W differs from the position where the third diode wire 65W is connected to the wire joining portion 32f of the third frame 32W. More specifically, the position where the third diode wire 65W is connected to the wire joining portion 32f of the third frame 32W is located closer to the wire joining portion 32f of the second frame 32V than the position where the third wire 60W is connected to the wire joining portion 32f of the third frame 32W.

Each diode wire 65U, 65V, 65W is made of, for example, aluminum (Al). The diode wires 65U, 65V, 65W have equal wire diameters. The wire diameter of each of the diode wires 65U, 65V, 65W is equal to the wire diameter of each of the wires 60U, 60V, 60W. The present embodiment has the same advantages as the fourth embodiment.

Modified Examples

The description related with the above embodiments exemplifies, without any intention to limit, an applicable form of a semiconductor device in accordance with the present invention. In addition to the embodiments described above, the semiconductor device in accordance with the present invention is applicable to, for example, modified examples of the above embodiments that are described below and combinations of at least two of the modified examples that do not contradict each other.

At least two of the second to fifth embodiments can be combined.

In each of the embodiments described above, the structure of the electrode pads of the MOSFETs 12U to 12W mounted on the frames 32U, 32V, and 32W, and the orientation (arrangement position) of the MOSFETs 12U to 12W can be changed in any manner. For example, the MOSFETs 12U to 12W may be changed like in modifications (A1) to (A4) described below.

Figure 22:
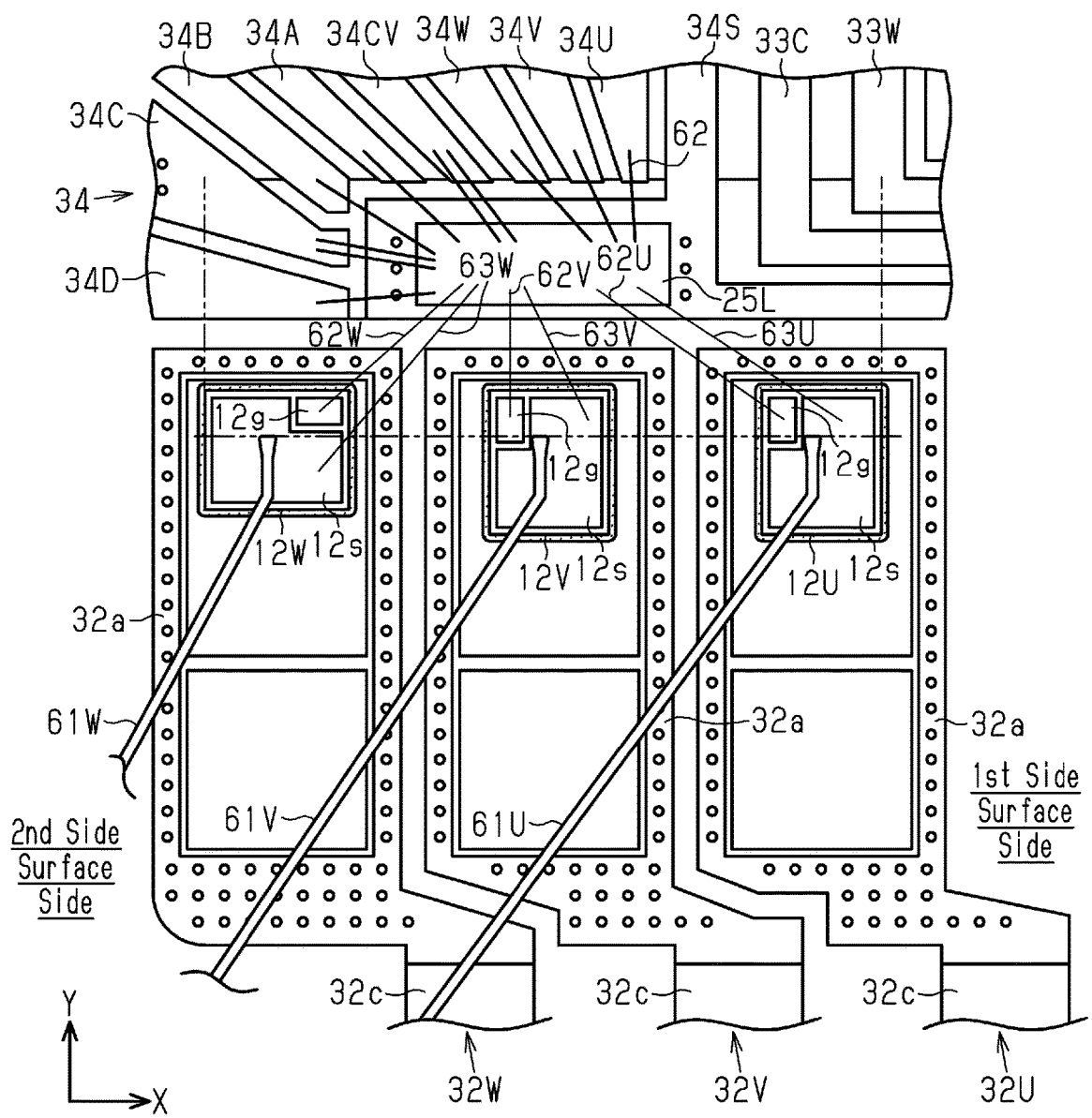
FIG. 22 is a plan view in which part of the layout inside a semiconductor device in accordance with a modified example is enlarged.

(A1) As shown in FIG. 22, the gate electrode pads 12g of the MOSFETs 12U to 12W may be located on the encapsulation resin 50 closer to the second side surface 50D. Each of the source electrode pads 12s of the MOSFETs 12U to 12W has a cut-away portion that avoids the gate electrode pad 12g. As shown in FIG. 22, the MOSFETs 12U and 12V are disposed such that the second direction Y is the longitudinal direction. The MOSFET 12W is disposed such that the first direction X is the longitudinal direction. The MOSFET 12W is disposed such that its gate electrode pad 12g is located closer to the frame 34. The MOSFET 12W is disposed closer to the second side surface 50D than the integrated circuit element 25L. In FIG. 22, the MOSFET 12W is disposed to be at the center of region Ra7 in the first direction X. Instead, for example, the MOSFET 12W may be disposed closer to the second frame 32V in the first direction X. Furthermore, the MOSFET 12U is disposed at the center of the region Ra7 in the first direction X. Instead, for example, the MOSFET 12U may be disposed closer to the second frame 32V in the first direction X.

The first wire 62U and the first wire 63U are connected to the end of the MOSFET 12U and the end of the first frame 32U that is closer to the integrated circuit element 25L. The first wire 62U is disposed closer to the second frame 32V than the first wire 63U in the first direction X. The second wire 62V and the second wire 63V are connected to the vicinity of the central portion of the integrated circuit element 25L in the first direction X. The second wire 62V is disposed closer to the third frame 32W than the second wire 63V in the first direction X. The third wire 62W and the third wire 63W are connected to the portion of the integrated circuit element 25L closer to the third frame 32W. The third wire 63W is disposed closer to the second frame 32V than the third wire 62W in the first direction X.

Figure 23:
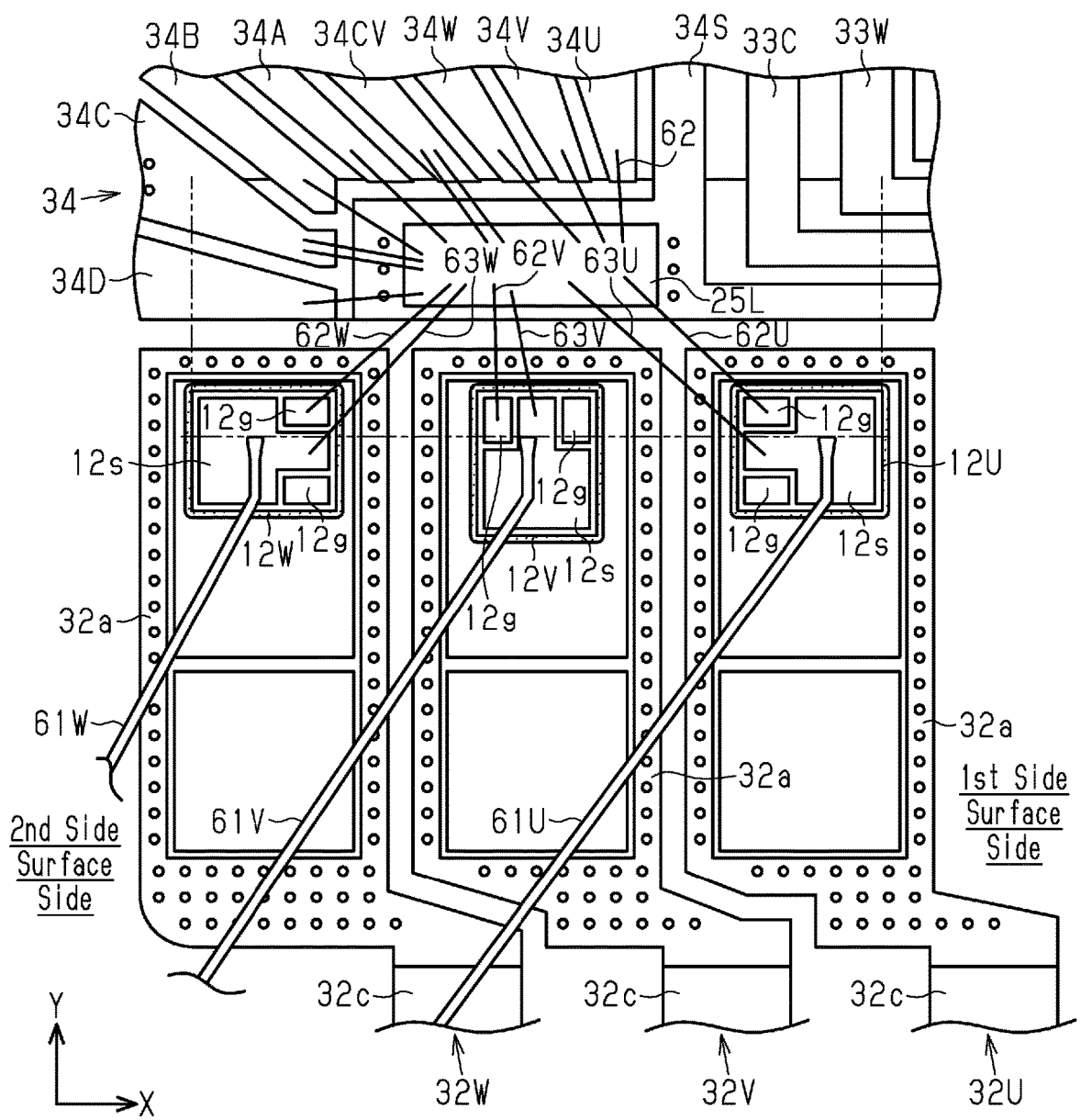
FIG. 23 is a plan view in which part of the layout inside a semiconductor device in accordance with a modified example is enlarged.

(A2) As shown in FIG. 23, each of the MOSFETs 12U to 12W has two gate electrode pads 12g. The MOSFETs 12U to 12W have the same structure. Therefore, the structure of the MOSFET 12U will be described as an example, and the structures of the MOSFETs 12V and 12W will not be described. The two gate electrode pads 12g of the MOSFET 12U are disposed at the end in the longitudinal direction of the MOSFET 12U. The two gate electrode pads 12g of the MOSFET 12U are spaced apart in the direction orthogonal to the longitudinal direction in a plan view of the MOSFET 12U. The source electrode pad 12s of the MOSFET 12U includes a portion extending between the two gate electrode pads 12g and has a tongue-like form in a plan view.

As shown in FIG. 23, the MOSFET 12V is disposed such that the second direction Y is the longitudinal direction. The MOSFETs 12U and 12W are disposed such that the first direction X is the longitudinal direction. The MOSFET 12U is disposed such that its gate electrode pad 12g approaches the integrated circuit element 25L. More specifically, the MOSFET 12U is disposed such that its gate electrode pad 12g is close to the second frame 32V. The MOSFET 12W is disposed such that its gate electrode pad 12g approaches the integrated circuit element 25L. More specifically, the MOSFET 12W is disposed such that its gate electrode pad 12g is close to the second frame 32V. Thus, the orientation (arrangement position) of the MOSFET 12U is opposite to the orientation (arrangement position) of the MOSFET 12W.

The first wire 62U is connected to the one of the two gate electrode pads 12g of the MOSFET 12U that is closer to the integrated circuit element 25L. The first wire 63U is connected to a portion between the two gate electrode pads 12g in the source electrode pad 12s. The first wire 63U is disposed closer to the second frame 32V than the first wire 62U in the first direction X. The second wire 62V is connected to the one of the two gate electrode pads 12g that is closer to the third frame 32W. The second wire 63V is connected to a portion between the two gate electrode pads 12g in the source electrode pad 12s. Therefore, the second wire 62V is disposed closer to the third frame 32W than the second wire 63V in the first direction X. The third wire 62W is connected to the one of the two gate electrode pads 12g closer to the integrated circuit element 25L. The third wire 63W is connected to a portion between the two gate electrode pads 12g in the source electrode pad 12s. The third wire 63W is disposed closer to the second frame 32V than the third wire 62W.

Figure 24:
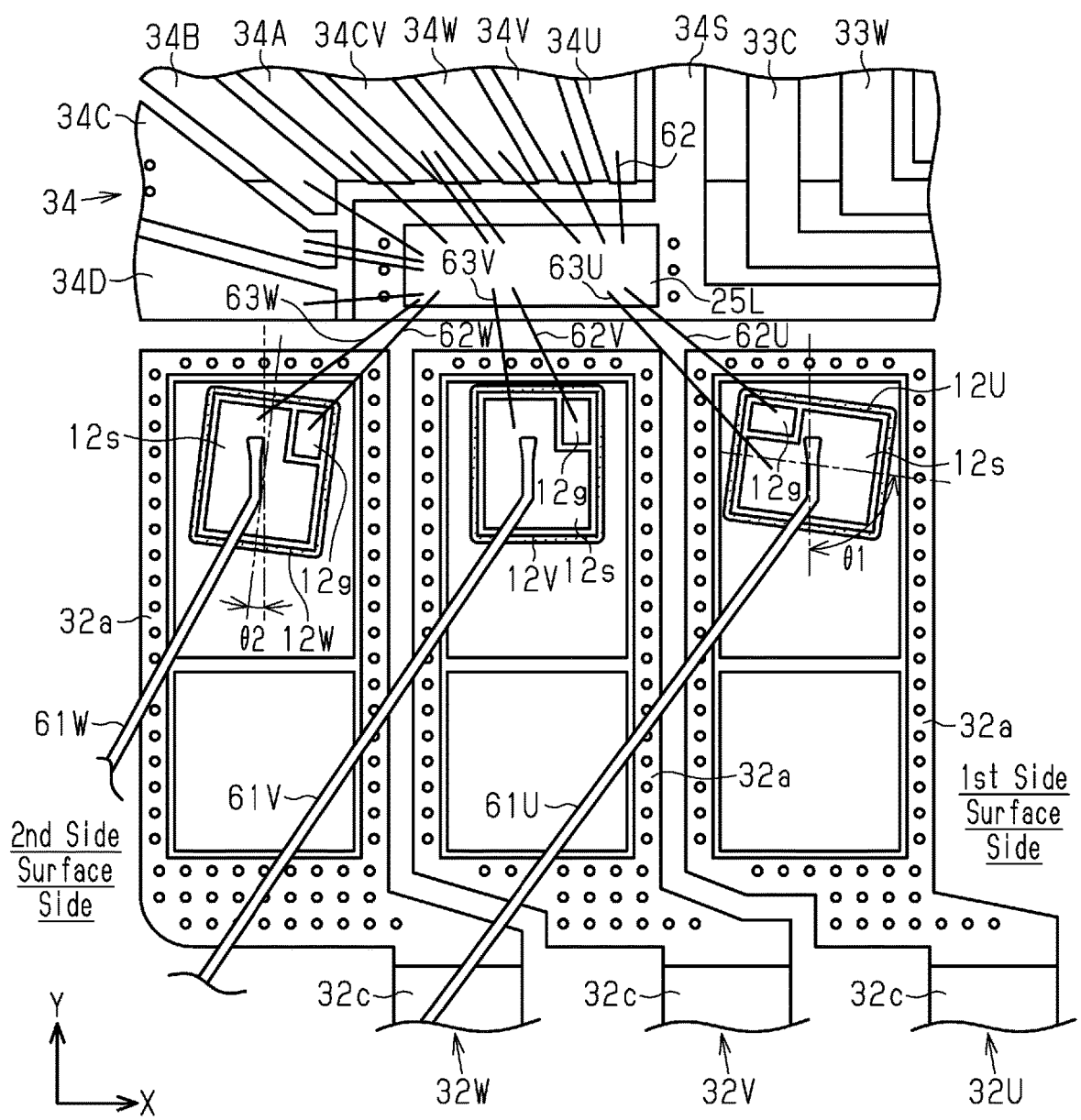
FIG. 24 is a plan view in which part of the layout inside a semiconductor device in accordance with a modified example is enlarged.

(A3) The orientations (arrangement positions) of each of the MOSFETs 12U to 12W mounted on the frames 32U, 32V, 32W can be changed in any manner. In one example, as shown in FIG. 24, the orientations (arrangement positions) of the MOSFETs 12U to 12W are different from each other. More specifically, the MOSFET 12U is disposed such that the gate electrode pad 12g approaches the integrated circuit element 25L, and the longitudinal direction of the MOSFET 12U lies in a direction that differs from the first direction X and the second direction Y. One example of an angle θ1 between the longitudinal direction of the MOSFET 12U and the first direction X is 80°. The MOSFET 12V is disposed such that its longitudinal direction lies in the first direction X. The MOSFET 12W is disposed such that the gate electrode pad 12g approaches the integrated circuit element 25L, and the longitudinal direction of the MOSFET 12W lies in a direction that differs from the first direction X and the second direction Y. One example of an angle θ2 between the longitudinal direction of the MOSFET 12W and the first direction X is 10°. The angle θ1 and the angle θ2 can be changed in any manner within the range of greater than or equal to 0° and less than or equal to 90°. Although the angles θ1 and θ2 are different in FIG. 24, the angles θ1 and θ2 may be equal to each other.

The first wire 62U and the first wire 63U are connected to the integrated circuit element 25L near the end close to the MOSFET 12U and the first frame 32U. The first wire 62U is disposed closer to the second frame 32V than the first wire 63U in the first direction X. The second wire 62V and the second wire 63V are connected to the vicinity of the central portion of the integrated circuit element 25L in the first direction X. The second wire 63V is disposed closer to the third frame 32W than the second wire 62V in the first direction X. The third wire 62W and the third wire 63W are connected to the portion of the integrated circuit element 25L closer to the third frame 32W. The third wire 63W is disposed closer to the second frame 32V than the third wire 62W in the first direction X.

Figure 25:
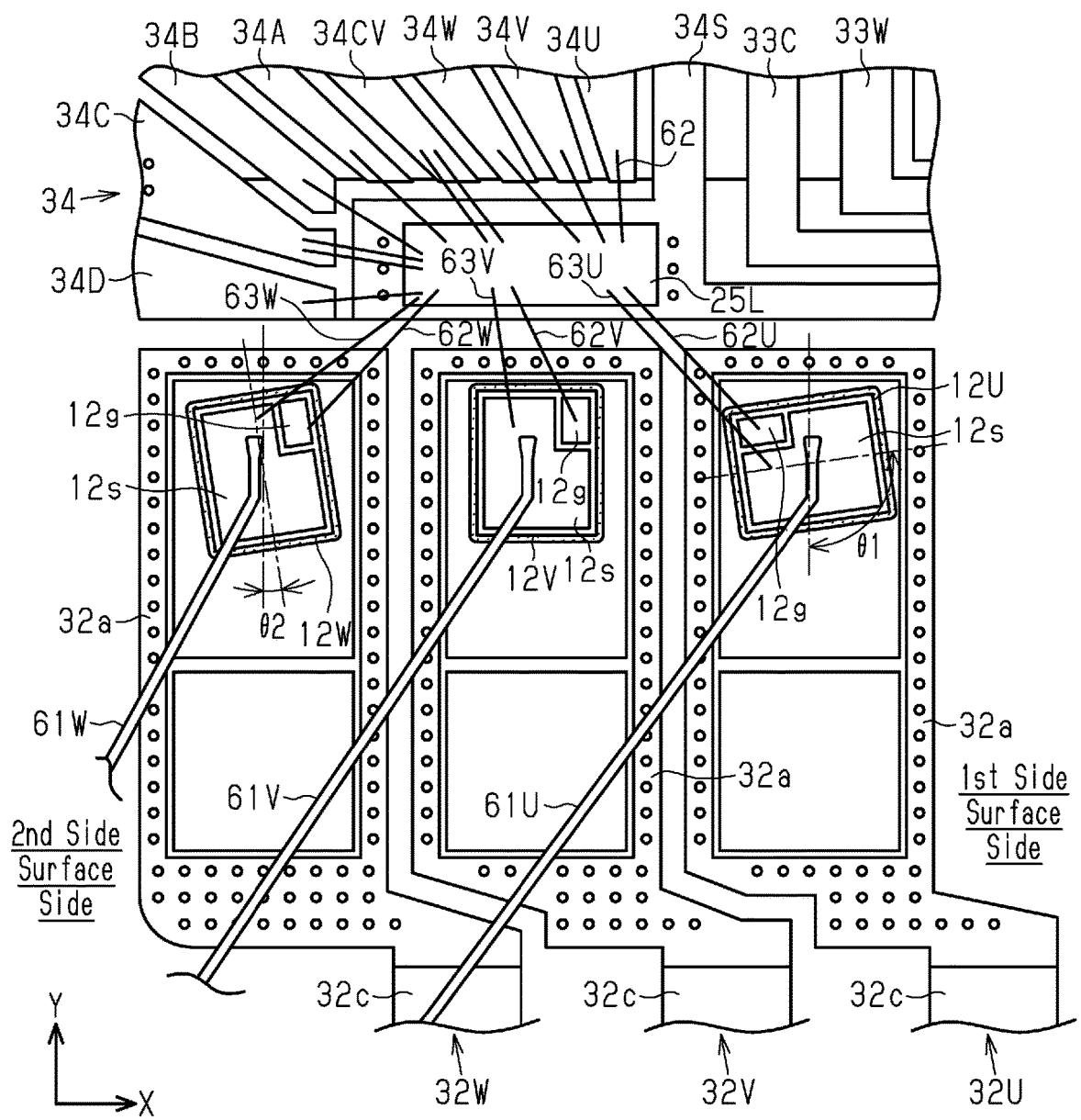
FIG. 25 is a plan view in which part of the layout inside a semiconductor device in accordance with a modified example is enlarged.

Furthermore, the orientations of the MOSFETs 12U and 12W of the modified example shown in FIG. 24 may be further changed as shown in FIG. 25. That is, as shown in FIG. 25, the MOSFET 12U is disposed such that the gate electrode pad 12g is separated from the integrated circuit element 25L and such that the longitudinal direction of the MOSFET 12U lies in a direction that differs from the first direction X and the second direction Y. The MOSFET 12W is disposed such that the gate electrode pad 12g is separated from the integrated circuit element 25L and such that the longitudinal direction of the MOSFET 12W lies in a direction that differs from the first direction X and the second direction Y. One example of the angle θ1 is 100°. In this case, the angle θ1 can be changed in any manner within the range of greater than or equal to 90° and less than or equal to 180°.

The first wire 62U and the first wire 63U are connected to the integrated circuit element 25L near the end close to the MOSFET 12U and the first frame 32U. The first wire 63U is disposed closer to the second frame 32V than the first wire 62U in the first direction X. The third wire 62W and the third wire 63W are connected to the portion of the integrated circuit element 25L close to the third frame 32W. The third wire 62W is disposed closer to the second frame 32V than the third wire 63W in the first direction X.

Furthermore, the MOSFETs 12U to 12W may be set in a state combining the modified example shown in FIG. 24 and the modified example shown in FIG. 25. In one example, the orientation (arrangement position) of the MOSFET 12U mounted on the first frame 32U is the orientation of the MOSFET 12U shown in FIG. 24, and the orientation (arrangement position) of the MOSFET 12W mounted on the third frame 32W is the orientation of the MOSFET 12W shown in FIG. 25.

Figure 26:
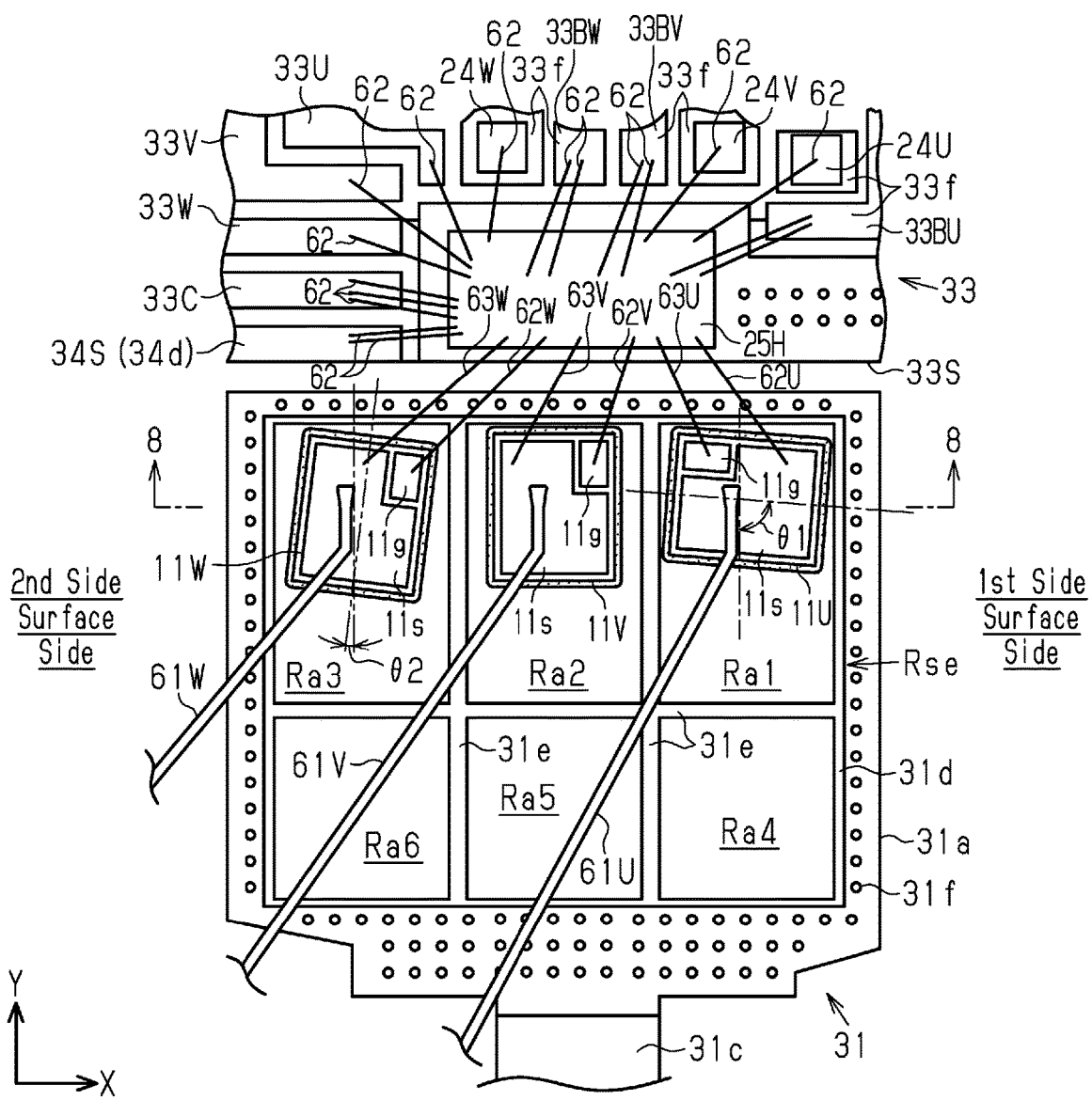
FIG. 26 is a plan view in which part of the layout inside a semiconductor device in accordance with a modified example is enlarged.

Furthermore, the orientations of the MOSFETs 11U to 11W mounted on the frame 31 can also be changed as the orientations of the MOSFETs 12U to 12W in FIGS. 24 and 25. In one example, as shown in FIG. 26, the orientations (arrangement positions) of the MOSFETs 11U to 11W are different from each other. More specifically, the MOSFET 11U is arranged such that the gate electrode pad 12g approaches the integrated circuit element 25H, and the longitudinal direction of the MOSFET 11U lies in a direction that differs from the first direction X and the second direction Y. One example of an angle θ1 between the longitudinal direction of the MOSFET 11U and the first direction X is 80°. The MOSFET 11V is disposed such that its longitudinal direction lies in the first direction X. The MOSFET 11W is disposed such that the gate electrode pad 12g approaches the integrated circuit element 25H, and the longitudinal direction of the MOSFET 11W lies in a direction that differs from the first direction X and the second direction Y. One example of an angle θ2 formed by the longitudinal direction of the MOSFET 11W and the first direction X is 10°. The angle θ1 and the angle θ2 can be changed in any manner within the range of greater than or equal to 0° and less than or equal to 90°. Although the angles θ1 and θ2 are different in FIG. 26, the angles θ1 and θ2 may be equal to each other.

The first wire 62U and the first wire 63U shown in FIG. 26 are respectively connected to the vicinity of the end of the integrated circuit element 25H close to the MOSFET 11U. The first wire 62U is disposed closer to the first side surface 50C than the first wire 63U in the first direction X. The second wire 62V and the second wire 63V are connected to the vicinity of the central portion of the integrated circuit element 25H in the first direction X. The second wire 63V is disposed closer to the second side surface 50D than the second wire 62V in the first direction X. The third wire 62W and the third wire 63W are connected to the portion of the integrated circuit element 25H close to the MOSFET 11W. The third wire 63W is disposed closer to the second side surface 50D than the third wire 62W in the first direction X.

Figure 27:
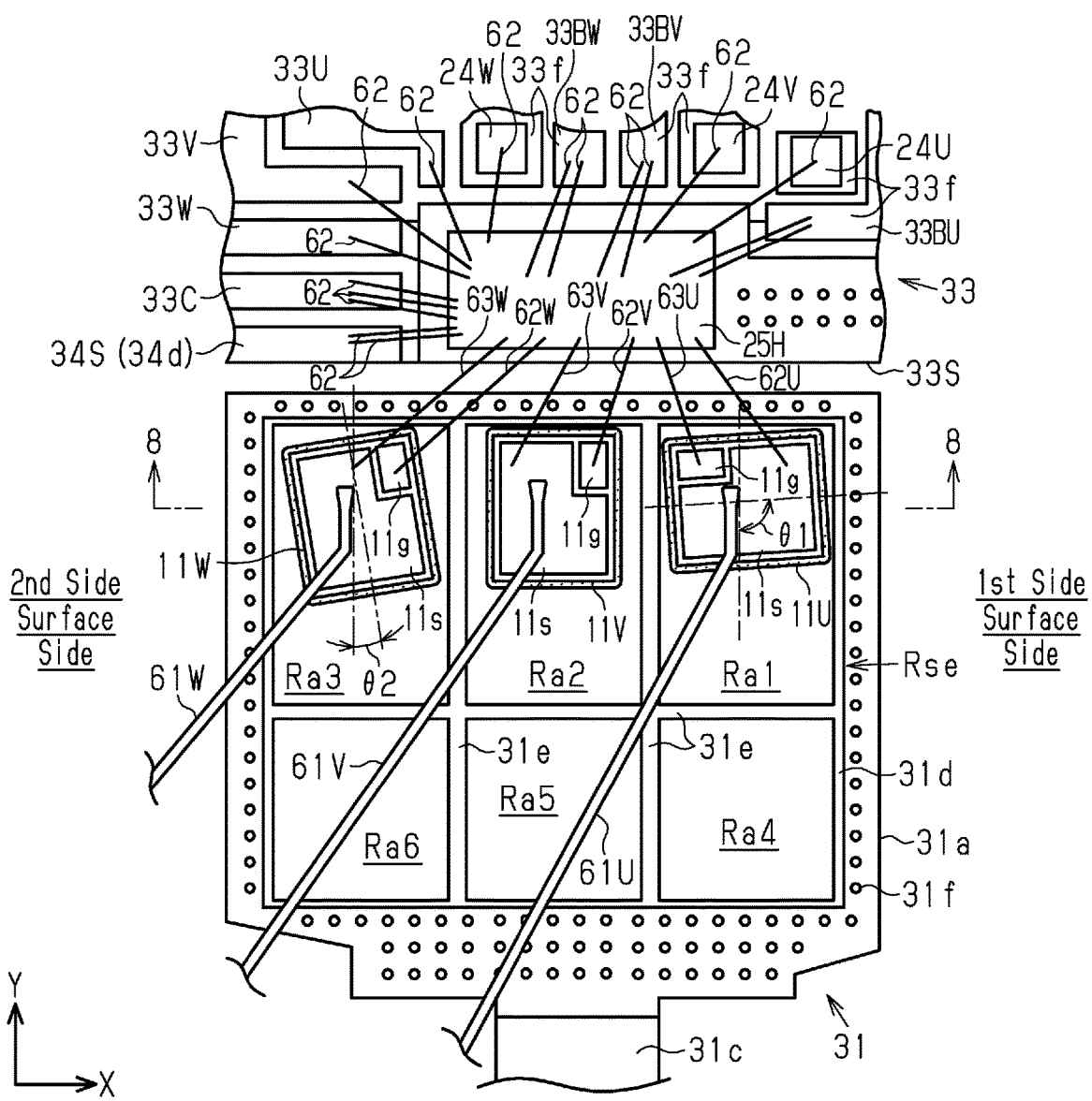
FIG. 27 is a plan view in which part of the layout inside a semiconductor device in accordance with a modified example is enlarged.

As shown in FIG. 27, the MOSFET 11U is disposed such that the gate electrode pad 12g is separated from the integrated circuit element 25H and the longitudinal direction of the MOSFET 11U lies in a direction that differs from the first direction X and the second direction Y. The MOSFET 11W is disposed such that the gate electrode pad 12g is separated from the integrated circuit element 25H and the longitudinal direction of the MOSFET 11W lies in a direction that differs from the first direction X and the second direction Y. One example of the angle θ1 is 100°. In this case, the angle θ1 can be changed in any manner within the range of greater than or equal to 90° and less than or equal to 180°.

The first wire 62U and the first wire 63U shown in FIG. 27 are respectively connected to the vicinity of the end on the MOSFET 11U in the integrated circuit element 25H. The first wire 63U is disposed closer to the first side surface 50C than the first wire 62U in the first direction X. The third wire 62W and the third wire 63W are connected to a portion of the integrated circuit element 25H close to the second side surface 50D. The third wire 63W is disposed closer to the second side surface 50D than the third wire 62W in the first direction X.

Furthermore, the orientations of the MOSFETs 11U to 11W may be set in a state combining the modified example shown in FIG. 26 and the modified example shown in FIG. 27. In one example, the orientation (arrangement position) of the MOSFET 11U is the orientation of the MOSFET 11U shown in FIG. 26, and the orientation (arrangement position) of the MOSFET 11W is the orientation of the MOSFET 11W shown in FIG. 27.

Figure 28:
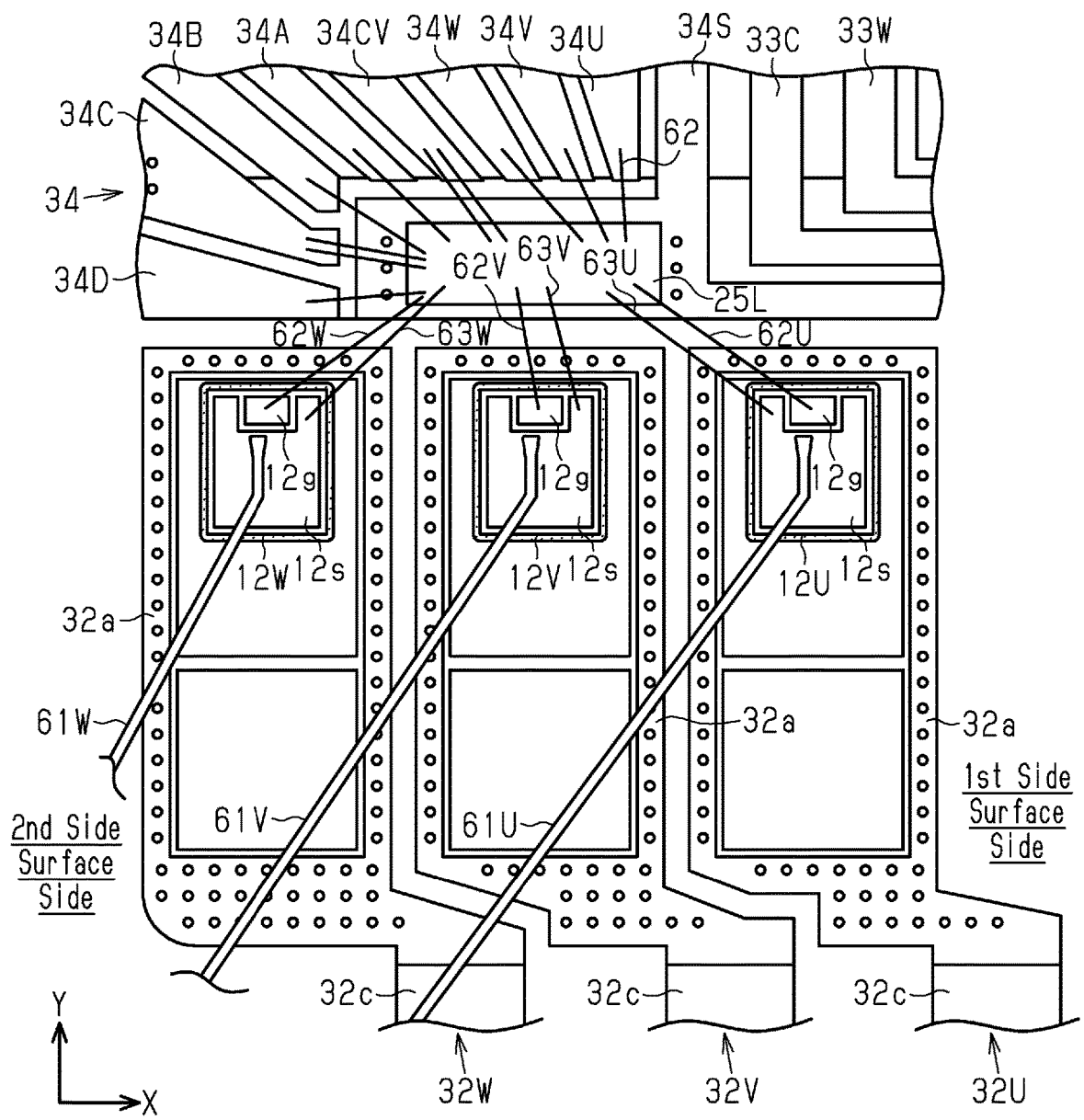
FIG. 28 is a plan view in which part of the layout inside a semiconductor device in accordance with a modified example is enlarged.

(A4) The shape and arrangement position of the gate electrode pad 12g of each of the MOSFETs 12U to 12W can be changed in any manner. The shape of the source electrode pad 12s is changed in accordance with the change in the shape and the arrangement position of the gate electrode pad 12g. In one example, as shown in FIG. 28, the gate electrode pad 12g is rectangular in which the first direction X is the longitudinal direction. The gate electrode pad 12g is located on the front surface of each of the MOSFETs 12U to 12W at the end closer to the integrated circuit element 25L in the first direction X and the center in the second direction Y. The end of the source electrode pad 12s close to the integrated circuit element 25L in the first direction X includes a recess that is recessed to avoid the gate electrode pad 12g. In FIG. 28, the MOSFETs 12U to 12W are arranged such that the longitudinal direction lies in the first direction X. The orientation (arrangement position) of the MOSFETs 12U to 12W can be changed in any manner.

The first wire 62U and the first wire 63U are connected to the integrated circuit element 25L at the end near the MOSFET 12U and the first frame 32U. The first wire 63U is disposed closer to the second frame 32V than the first wire 62U in the first direction X. The second wire 62V and the second wire 63V are connected to the vicinity of the central portion of the integrated circuit element 25L in the first direction X. The second wire 63V is disposed on the first frame 32U side than the second wire 62V in the first direction X. The third wire 62W and the third wire 63W are connected to the portion closer to the third frame 32W in the integrated circuit element 25L. The third wire 63W is disposed closer to the second frame 32V than the third wire 62W in the first direction X.

The shapes of the gate electrode pads 12g and the source electrode pads 12s of the MOSFETs 12U to 12W shown in FIG. 28 can be applied to the gate electrode pads 11g and the source electrode pads 11s of the MOSFETs 11U to 11W. In this case, in the semiconductor device 1, currents of 30 A or more can flow to each of the MOSFETs 11U to 11W and 12U to 12W.

In the first to third embodiments, the shapes of the frame 31 and the frames 32U, 32V, 32W can be changed in any manner. In one example, the frame 31 and each frame 32U, 32V, 32W may be changed as shown in FIG. 29.

Figure 29:
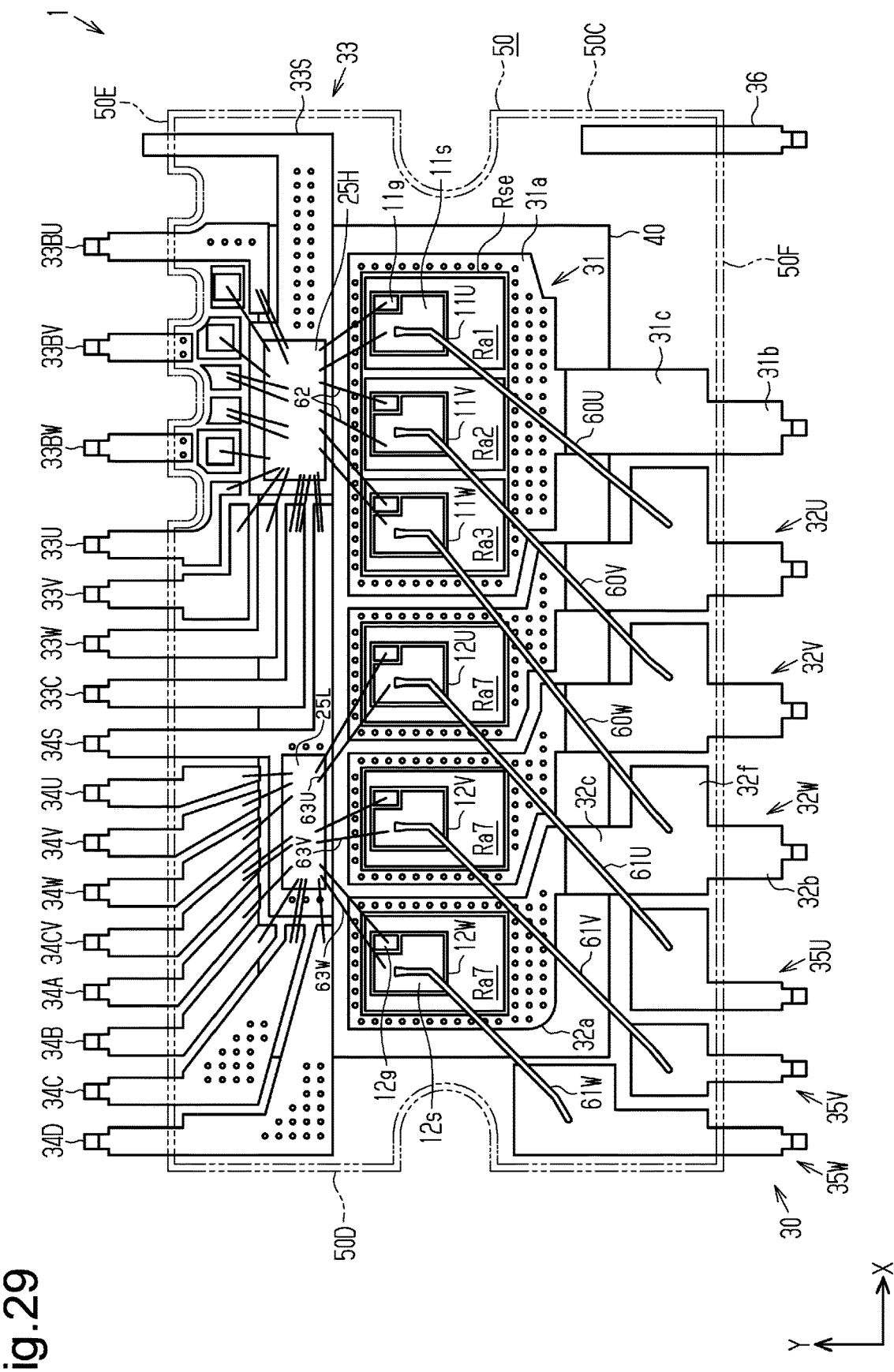
FIG. 29 is a plan view showing the layout inside a semiconductor device in accordance with a modified example.

More specifically, the size in the second direction Y of the island portion 31a of the frame 31 in FIG. 29 is smaller than the size in the second direction Y of the island portion 31a of the frame 31 in the first to third embodiments. The element mounting region Rse of the island portion 31a in FIG. 29 includes the regions Ra1 to Ra3 and does not include the regions Ra4 to Ra6.

The size in the second direction Y of the island portion 32a of each frame 32U, 32V, 32W in FIG. 29 is smaller than the size in the second direction Y of the island portion 32a of each frame 32U, 32V, 32W in the first to third embodiments. The element mounting region Rse of the island portion 32a in FIG. 29 includes the region Ra7 and does not include the region Ra8.

According to such a configuration, the size in the second direction Y of the encapsulation resin 50 of the semiconductor device 1 is smaller because the size in the second direction Y of the frame 31 and the frames 32U, 32V, 32W is smaller. Therefore, the size and weight of the semiconductor device 1 can be reduced.

In the first to third embodiments, the number of wires 63U, 63V and 63W connecting the source electrode pads 12s of the MOSFETs 12U to 12W and the integrated circuit element 25L can be changed in any manner. The number of wires 63U, 63V, 63W may be two or more. For example, the number of wires 63U, 63V, 63W may be two. Furthermore, at least one of the number of first wires 63U, the number of second wires 63V, and the number of third wires 63W may be different.

In the fifth embodiment described above, the MOSFETs 11U to 11W and the diodes 15U, 15V, and 15W of the frame 31 can be electrically connected in any manner. For example, the connecting modes of the MOSFETs 11U to 11W and the diodes 15U, 15V, and 15W may be changed like in modification (B1) and (B2) described below.

Figure 30:
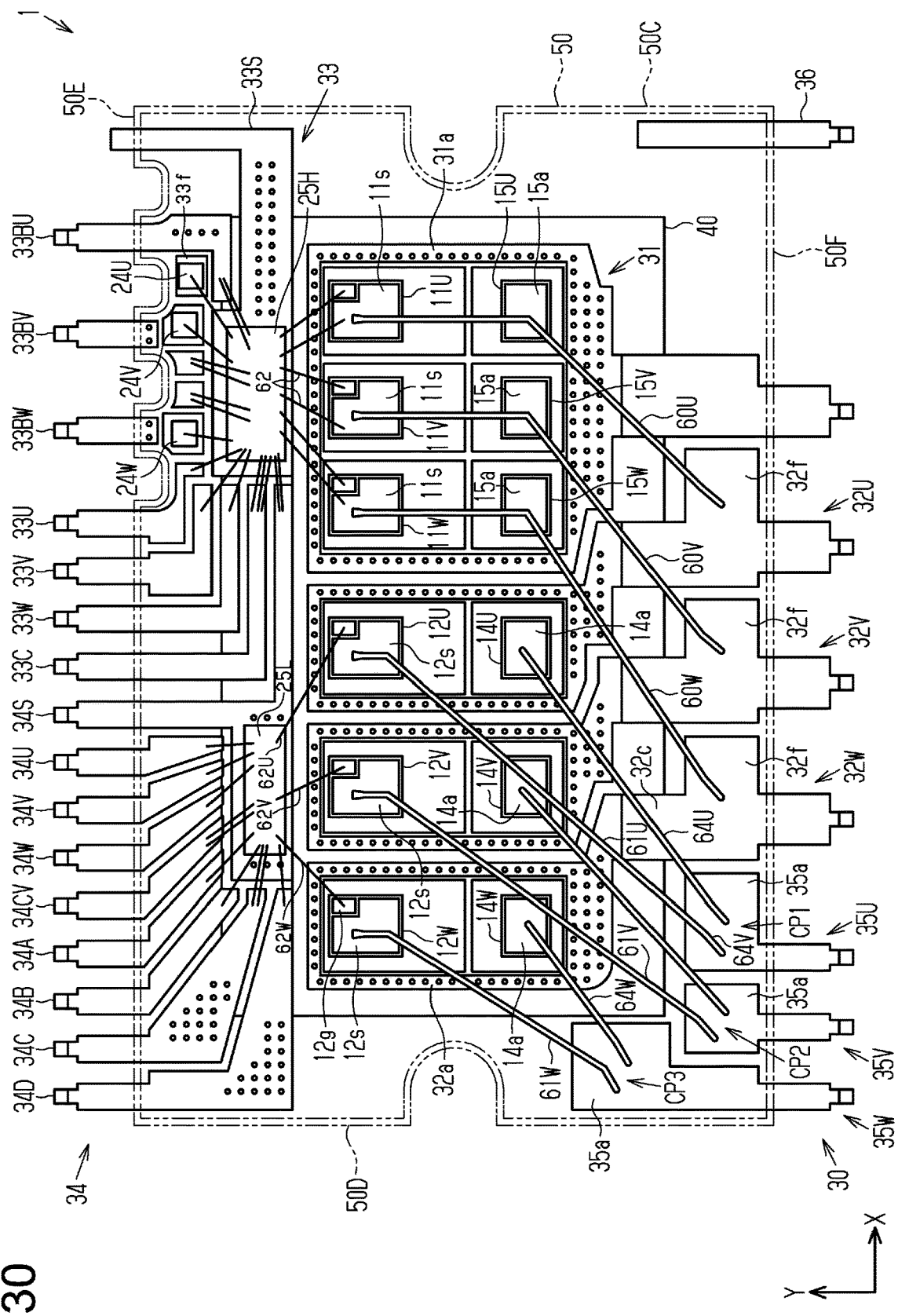
FIG. 30 is a plan view showing the layout inside a semiconductor device in accordance with a modified example.

(B1) As shown in FIG. 30, the MOSFET 11U, the first diode 15U and the first frame 32U are connected by one first wire 60U. The MOSFET 11V, the second diode 15V, and the second frame 32V are connected by one second wire 60V. The MOSFET 11W, the third diode 15W, and the third frame 32W are connected by one third wire 60W. More specifically, the first wire 60U connected to the source electrode pad 11s of the MOSFET 11U includes a first portion, extending in the second direction Y and connected to the anode electrode pad 15a of the first diode 15U, and a second portion, extending toward the second side surface 50D and the fourth side surface 50F of the encapsulation resin 50 to connect the anode electrode pad 15a and the wire joining portion 32f of the first frame 32U. The second wire 60V connected to the source electrode pad 11s of the MOSFET 11V includes a first portion, extending in the second direction Y and connected to the anode electrode pad 15a of the second diode 15V, and a second portion, extending toward the second side surface 50D and the fourth side surface 50F of the encapsulation resin 50 to connect the anode electrode pad 15a and the wire joining portion 32f of the second frame 32V. The third wire 60W connected to the source electrode pad 11s of the MOSFET 11W includes a first portion, extending in the second direction Y and connected to the anode electrode pad 15a of the third diode 15W, and a second portion, extending toward the second side surface 50D and the fourth side surface 50F of the encapsulation resin 50 to connect the anode electrode pad 15a and the wire joining portion 32f of the third frame 32W.

Figure 31:
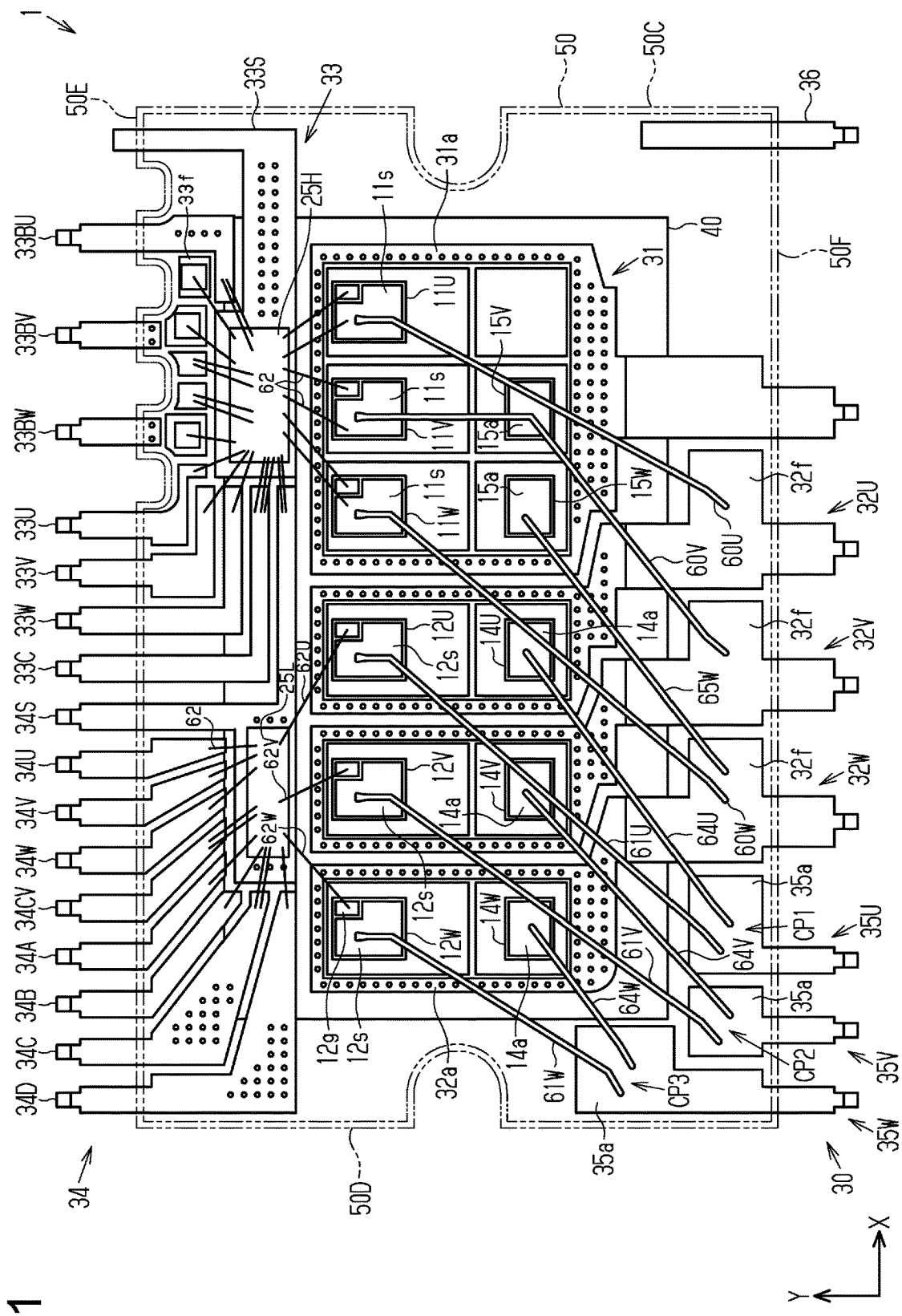
FIG. 31 is a plan view showing the layout inside a semiconductor device in accordance with a modified example.

(B2) One or two of the diodes 15U, 15V, 15W may be omitted. Furthermore, the wires 60U, 60V and 60W may be connected to the MOSFETs 11U to 11W in any manner. In one example, as shown in FIG. 31, the first diode 15U is omitted from the semiconductor device 1. The first wire 60U connected to the source electrode pad 11s of the MOSFET 11U is connected to the wire joining portion 32f of the first frame 32U. In the same manner as FIG. 29, the second wire 60V connected to the source electrode pad 11s of the MOSFET 11V includes a first portion, which is connected to the anode electrode pad 15a of the second diode 15V, and a second portion, which connects the anode electrode pad 15a and the wire joining portion 32f of the second frame 32V. The third wire 60W connected to the source electrode pad 11s of the MOSFET 11W is connected to the wire joining portion 32f of the third frame 32W. The third diode wire 65W connected to the anode electrode pad 15a of the third diode 15W is connected to the wire joining portion 32f of the third frame 32W.

Figure 32:
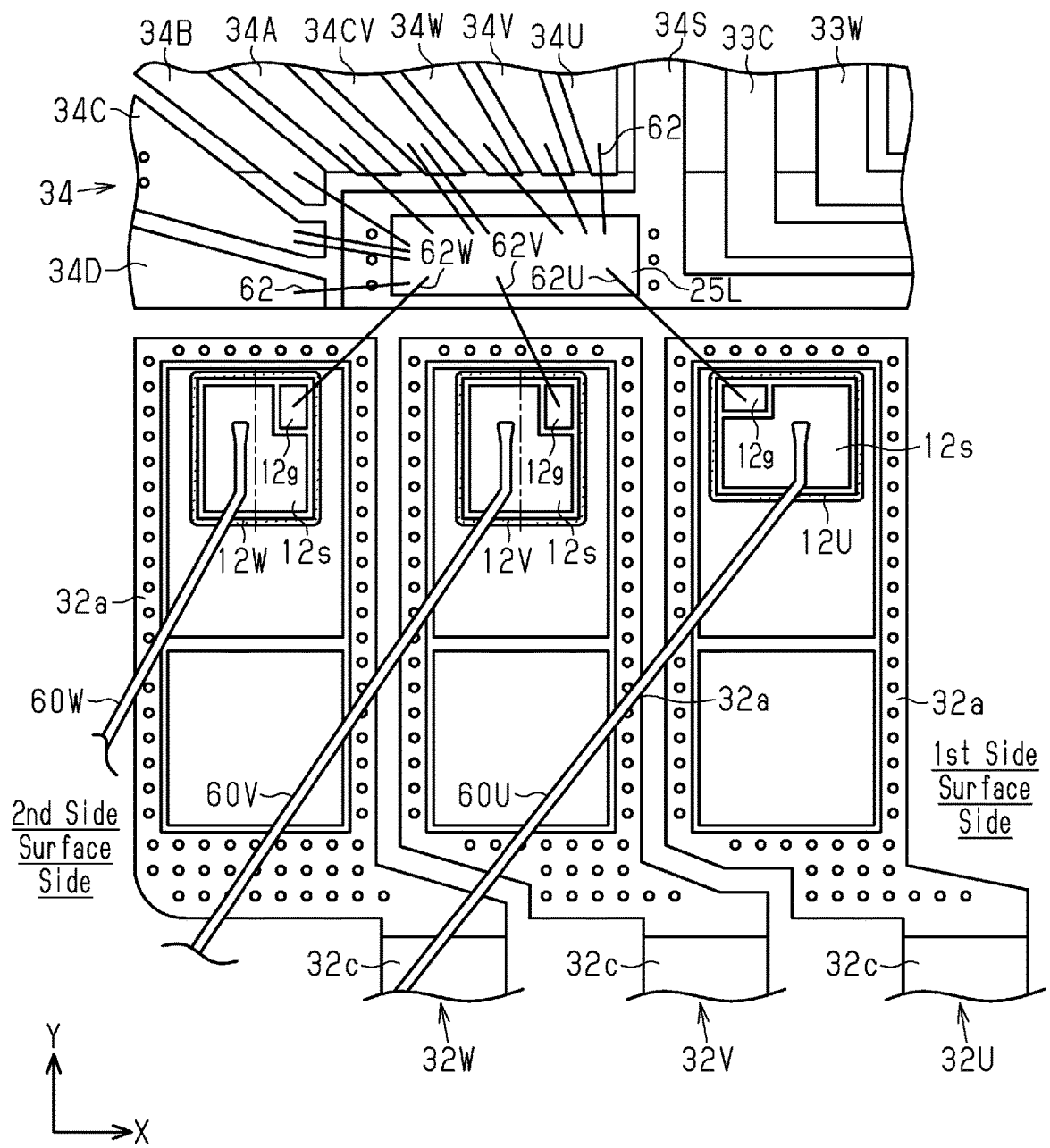
FIG. 32 is a plan view in which part of the layout inside a semiconductor device in accordance with a modified example is enlarged.

In the third embodiment, as shown in FIG. 32, the wires 63U, 63V, 63W connecting the source electrode pads 12s of the MOSFETs 12U to 12W of the frames 32U, 32V, 32W and the integrated circuit element 25L may be omitted. This configuration also has the same advantages as the third embodiment.

Figure 33:
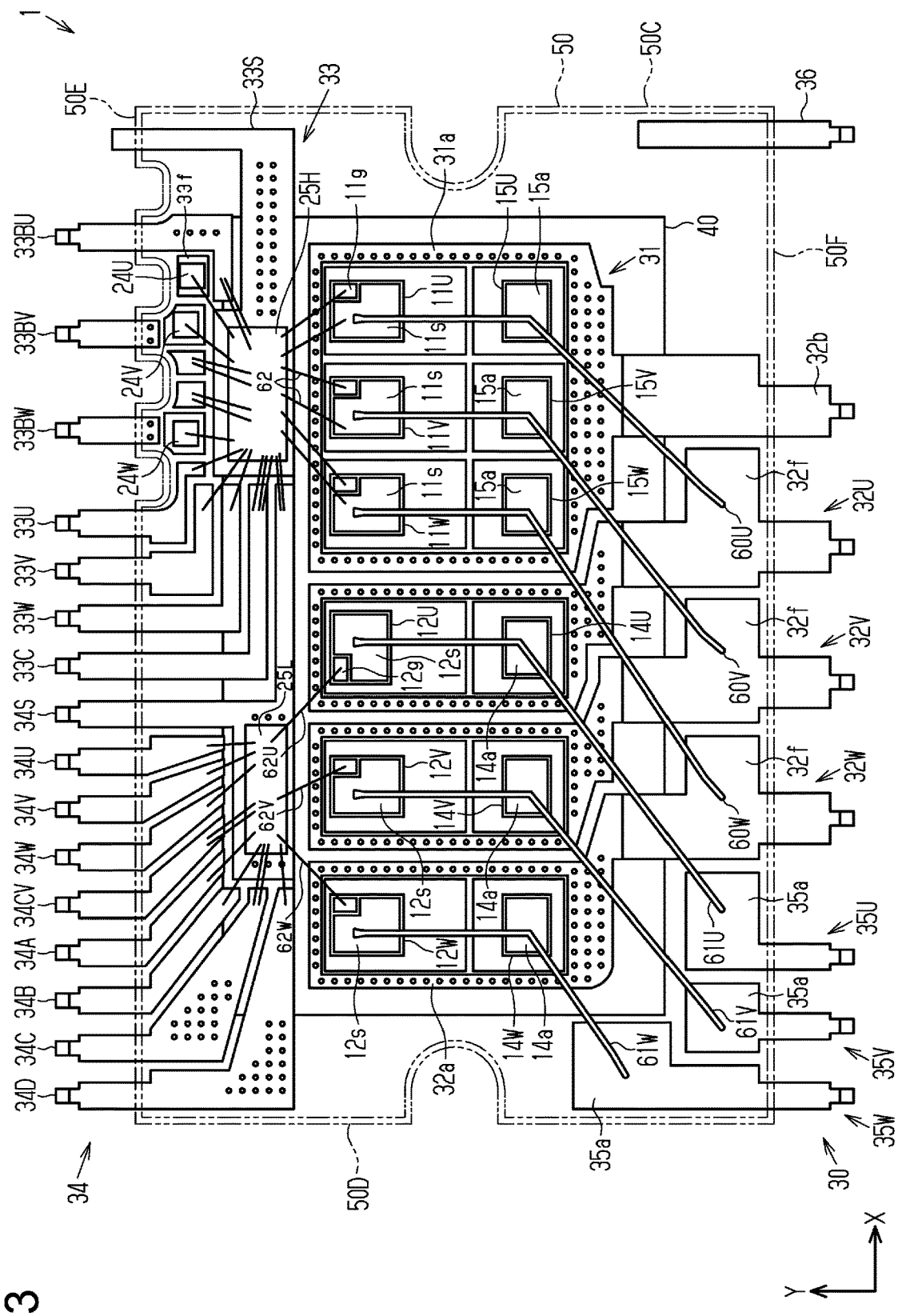
FIG. 33 is a plan view showing the layout inside a semiconductor device in accordance with a modified example.

In the fifth embodiment, the configuration of the third embodiment, that is, the configuration in which the orientation (arrangement position) of the MOSFET 12U of the first frame 32U is changed may be applied. In this case, the connection of the wires 61U, 61V, 61W can be changed as shown in FIG. 33. More specifically, the MOSFET 12U, the diode 14U and the frame 35U are connected by one first wire 61U. The MOSFET 12V, the second diode 14V, and the frame 35V are connected by one second wire 61V. The MOSFET 12W, the third diode 14W, and the frame 35W are connected by one third wire 61W. More specifically, the first wire 61U connected to the source electrode pad 12s of the MOSFET 12U includes a first portion, extending along the second direction Y and connected to the anode electrode pad 14a of the first diode 14U, and a second portion, extending toward the second side surface 50D and the fourth side surface 50F of the encapsulation resin 50 to connect the anode electrode pad 14a and the island portion 35a of the frame 35U. The second wire 61V connected to the source electrode pad 12s of the MOSFET 12V includes a first portion, extending in the second direction Y and connected to the anode electrode pad 14a of the second diode 14V, and a second portion, extending toward the second side surface 50D and the fourth side surface 50F of the encapsulation resin 50 to connect the anode electrode pad 14a and the island portion 35a of the frame 35V. The third wire 61W connected to the source electrode pad 12s of the MOSFET 12L includes a first portion, extending along the second direction Y and connected to the anode electrode pad 14a of the third diode 14W, and a second portion, extending toward the second side surface 50D and the fourth side surface 50F of the encapsulation resin 50 to connect the anode electrode pad 14a and the island portion 35a of the frame 35W.

In the above-described embodiments, the regions Ra7 and Ra8 of the element mounting regions Rse of the frames 32U, 32V, and 32W may be spaced apart in the second direction Y. In this case, a plurality of recesses 32i may be formed in a portion between the region Ra7 and the region Ra8 in the second direction Y. Similarly, in the frame 31, the regions Ra1 to Ra3 and the regions Ra4 to Ra6 of the element mounting region Rse may be spaced apart in the second direction Y. In this case, a plurality of recesses 31f may be formed in a portion between the regions Ra1 to Ra3 and the regions Ra4 to Ra6 in the second direction Y.

In the embodiments described above, the structures of the MOSFETs 11U to 11W and 12U to 12W can be changed in any manner. For example, the structures of the MOSFETs 11U to 11W and 12U to 12W may be changed to modifications (C1) and (C2) described below. Since the MOSFETs 11U to 11W and the MOSFETs 12U to 12W have the same structure, the structure of the MOSFET 11U will be described and the MOSFETs 11V, 11W, and 12U to 12W will not be described in the description of the structures of modifications (C1) and (C2).

Figure 34:
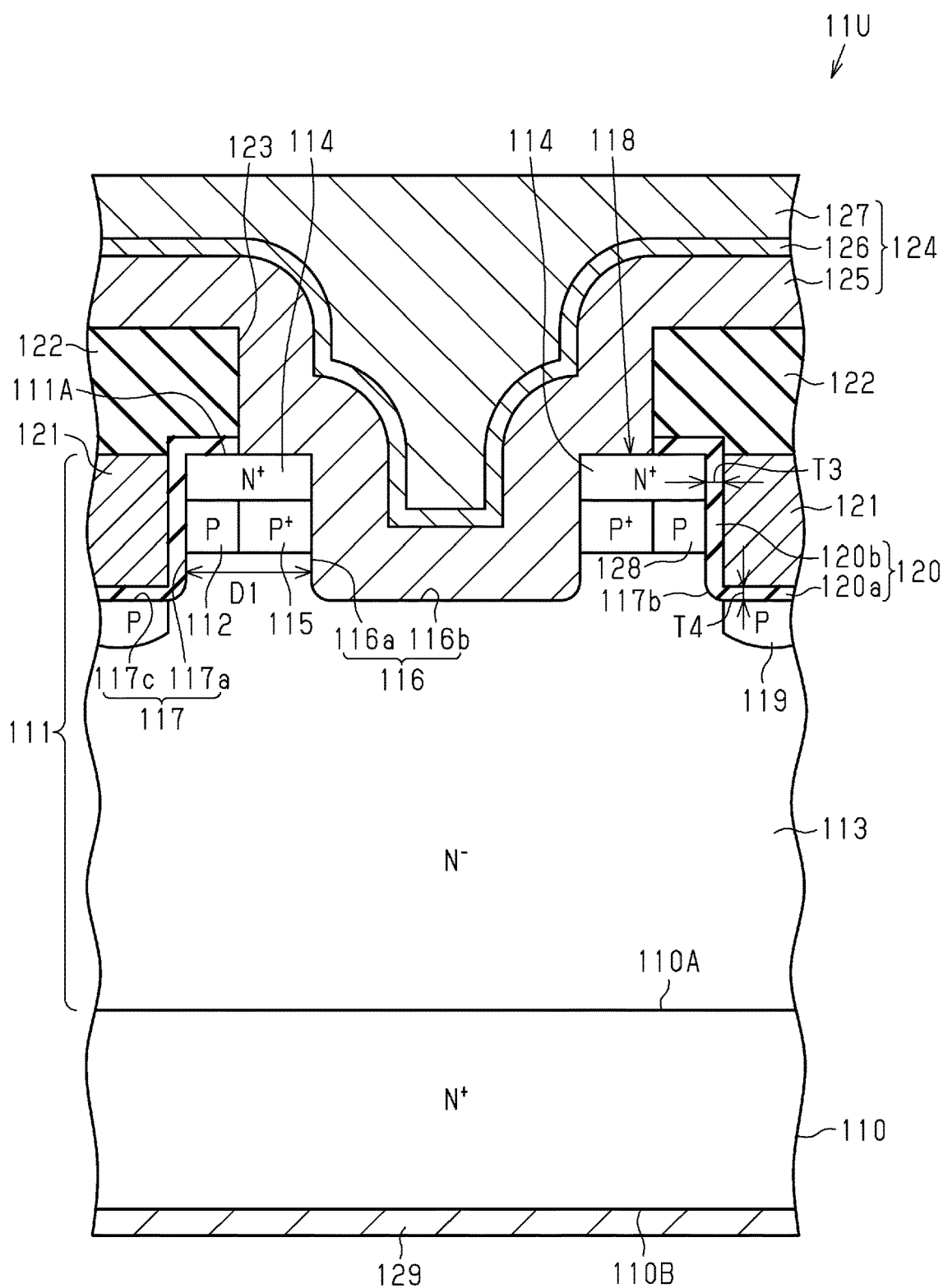
FIG. 34 is a cross-sectional view showing the structure of a MOSFET in accordance with a modified example.

(C1) As shown in FIG. 34, the MOSFET 11U includes an N$^+$ type (e.g., N-type impurity concentration is 1e18 to 1e21 cm$^{-3}$) SiC substrate 110. The front surface 110A (upper surface) of the SiC substrate 110 is a Si surface, and the back surface 110B (lower surface) is a C surface.

An epitaxial layer 111 made of N"type (e.g., N-type impurity concentration is 1e15 to 1e17 cm$^{-3}$) SiC having a lower concentration than the SiC substrate 110 is stacked on the SiC substrate 110. The epitaxial layer 111 serving as a semiconductor layer is formed on the SiC substrate 110 by so-called epitaxial growth. The epitaxial layer 111 formed on the front surface 110A, which is a Si surface, is grown using the Si surface as a main growth surface. Therefore, the front surface 111A of the epitaxial layer 111 formed by the growth is the Si surface in the same manner as the front surface 110A of the SiC substrate 110.

A well-shaped P-type body region 112 is formed over a wide range in the epitaxial layer 111 at the side of the front surface 111A (Si surface). The P-type impurity concentration of the body region 112 is 1e16 to 1e19 cm$^{-3}$. In the epitaxial layer 111, the region closer to the SiC substrate 110 (C surface) than the body region 112 is an N$^-$ type drain region 113 (drift region) in which a state after the epitaxial growth is maintained.

In the body region 112, an N$^+$ type (e.g., N-type impurity concentration is 1e18 to 1e21 cm$^{-3}$) source region 114 is formed over substantially the entire region at the side of the front surface 111A, and a P$^+$ type (e.g., P-type impurity concentration is 1e18 to 1e21 cm$^{-3}$) body contact region 115 is formed at the side closer to the SiC substrate 110 (lower side) than the source region 114. A large number of body contact regions 115 are formed in a matrix form. The source trenches 116 are formed in the same number as the body contact regions 115 so as to extend through the individual body contact region 115. Then, lattice-form gate trenches 117 are formed so as to surround each of the body contact regions 115 in which the source trench 116 is formed. Thus, a large number of unit cells 118, each functioning as a field effect transistor, are formed in the epitaxial layer 111. More specifically, the unit cell 118 is formed such that body contact region 115 surrounds the source trench 116, and furthermore, the body region 112 is formed so as to surround the body contact region 115. The side opposite to the body contact region 115 in the body region 112 is exposed to the side surface of the gate trench 117. Moreover, in the unit cell 118, the depth direction of the gate trench 117 is the gate length direction, and the peripheral direction of each unit cell 118 orthogonal to the gate length direction is the gate width direction.

The source trench 116 and the gate trench 117 both extend through the body region 112 from the front surface 111A of the epitaxial layer 111 and reach the drain region 113. In the present embodiment, the depth of the source trench 116 is equal to the depth of the gate trench 117. The distance D1 between the side surface 116a of the source trench 116 and the side surface 117a of the gate trench 117 is, for example, 0.5 μm to 3 μm. If the distance D1 is within the range of 0.5 μm to 3 μm, the increase in resistance value (on-resistance) when each unit cell 118 is turned on can be reduced, and the electric field applied to the bottom portion of the gate trench 117 can be reduced.

In the gate trench 117, the two end corner portions 117b in the direction orthogonal to the gate width at the bottom portion (opposing direction to adjacent unit cell 118) are curved toward the drain region 113 side, and the opposing side surfaces 117a and the bottom surface 117c has a U-shaped cross section continuous with the curved surface. Furthermore, in the same manner as the gate trench 117, the source trench 116 has a U-shaped cross section in which the opposing side surfaces 116a and the bottom surface 116b are continuous with the curved surface. Thus, when the unit cell 118 is turned off, the electric field applied to the two end corner portions 117b at the bottom portion of the gate trench 117 can be dispersed to portions other than the two end corner portions 117b. Therefore, dielectric breakdown of a portion (insulating film bottom portion 120 a) on the bottom surface 117c of the gate insulating film 120 described later can be reduced.

In the drain region 113, an implantation active layer 119 serving as an implantation layer formed by implantation of a P-type impurity (e.g., boron (B), aluminum (Al) etc.) is formed in a portion from the bottom surface 117c of the gate trench 117 to a middle portion in the thickness direction. The implantation active layer 119 is formed to have a lattice form overlapping the gate trench 117 in a plan view and is shaped to be narrower in width than the distance between the adjacent unit cells 118. The depth of the implantation active layer 119 in the present embodiment is, for example, 0.1 μm to 0.5 μm.

The implantation active layer 119 is a high resistance layer having a higher resistance value than the peripheral region (e.g., drain region 113) of the epitaxial layer 111. The resistance value of the implantation active layer 119 is, for example, several tens of kΩ/□ to several hundred kΩ/□. The P-type impurity concentration of the implantation active layer 119 is, for example, 1e16 to 1e21 cm$^{-3}$.

The gate insulating film 120 is formed on the inner surface of the gate trench 117 so as to cover the entire region. The gate insulating film 120 is an oxide film containing nitrogen, for example, a silicon nitride oxide film formed by thermal oxidation using gas containing nitrogen and oxygen. The nitrogen content (nitrogen concentration) in the gate insulating film 120 is, for example, 0.1 to 10%.

In the gate insulating film 120, a thickness T4 of a portion (insulating film bottom portion 120*a*) on the bottom surface 117*c* of the gate trench 117 is less than a thickness T3 of a portion (insulating film side portion 120*b*) on the side surface 117*a* of the gate trench 117. The ratio (T4/T3) of the thickness T4 to the thickness T3 is 0.3 to 1.0, and preferably 0.5 to 1.0. The thickness T3 is 300 to 1000 Å, and the thickness T4 is 150 to 500 Å. A gate electrode 121 is buried in the gate trench 117 by filling the inner side of the gate insulating film 120 with a polysilicon material heavily doped with an N-type impurity.

An inter-layer insulating film 122 made of silicon oxide ($SiO_2$) is stacked on the epitaxial layer 111. Contact holes 123 for exposing the front surfaces of the source trench 116 and the source region 114 of each unit cell 118 are formed in the inter-layer insulating film 122 and the gate insulating film 120.

A source wiring 124 is formed on the inter-layer insulating film 122. The source wiring 124 collectively enters the source trenches 116 of all of the unit cells 118 through each of the contact holes 123 and comes into contact with the drain region 113, the body contact region 115, and the source region 114 in order from the bottom side of source trench 116 in each unit cell 118. That is, the source wiring 124 is shared by all of the unit cells 118. An inter-layer insulating film (not shown) is formed on the source wiring 124, and the source wiring 124 is electrically connected to the source electrode pad 11*s* through the inter-layer insulating film. The gate electrode pad 11*g* is electrically connected to the gate electrode 121 through a gate wiring (not shown) drawn on the inter-layer insulating film (not shown).

The source wiring 124 includes a polysilicon layer 125, an intermediate layer 126, and a metal layer 127 in order from the side in contact with epitaxial layer 111.

The polysilicon layer 125 is a doped layer formed by using doped polysilicon doped with an impurity, and for example, is a high concentration doped layer doped with an impurity at a high concentration of 1e19 to 1e21 $cm^{-3}$. As an impurity when forming the polysilicon layer 125 as a doped layer (including high concentration doped layer), N-type impurity such as nitrogen (N), phosphorus (P) and arsenic (As) and P-type impurity such as aluminum (Al) and boron (B) can be used. The thickness of the polysilicon layer 125 is, for example, 5000 to 10000 Å.

The polysilicon layer 125 of the present embodiment is formed to cover the entire region of the front surface of the unit cell 118 exposed in the contact hole 123 and is in contact with the drain region 113, the body contact region 115, and the source region 114 in the source trench 116.

The source wiring 124 can be brought into Ohmic junction with both of the body contact region 115 and the source region 114, which are high concentration impurity regions, by using polysilicon for the layer contacting the drain region 113, the body contact region 115, and the source region 114 in the source wiring 124. Heterojunction junction having smaller junction failure than the diffusion potential of the body diode 128 (PN diode formed by the joining between body region 112 and drain region 113) internally existing in the MOSFET 11U can be formed in the low concentration drain region 113.

When current flows through the body diode 128 in the MOSFET 11U, holes transferred from the body region 112 to the drain region 113 re-bonds with the electrons in the drain region 113, and the bonding energy generated at that time may cause defects of the SiC crystal in the epitaxial layer 111 to spread in the plane. Since this crystal defect has a high resistance value, when the crystal defect expands toward the gate trench 117, the crystal defect interferes with the normal transistor operation, and the on-resistance may rise.

In this respect, as shown in FIG. 34, if the heterojunction junction is formed by the contact between the polysilicon layer 125 and the drain region 113, a reverse voltage is applied between the source and the drain, and the current can preferentially flow to the heterojunction junction side rather than the body diode 128 side even in a state the current is flowing to the body diode 128. As a result, the expansion of the crystal defect of SiC can be reduced, and a rise in the on-resistance can be reduced.

The intermediate layer 126 is stacked on the polysilicon layer 125, and includes a single layer of a layer containing titanium (Ti) or a plurality of layers including the layer. The layer containing titanium can be formed using titanium, titanium nitride (TiN), or the like. Furthermore, the thickness of the intermediate layer 126 is, for example, 200 to 500 nm.

The metal layer 127 is stacked on the intermediate layer 126 and formed using for example, aluminum (Al), gold (Au), silver (Ag), copper (Cu), molybdenum (Mo), or an alloy of these elements and a metal material containing these elements. The metal layer 127 forms the outermost layer of the source wiring 124. The thickness of the metal layer 127 is 1 to 5 μm.

A stacked structure (Poly-Si/Ti/TiN/Al) in which Poly-Si (polysilicon layer 125), Ti (intermediate layer 126), TiN (intermediate layer 126), and Al (metal layer 127) are stacked in order can be exemplified as a combination of the polysilicon layer 125, the intermediate layer 126, and the metal layer 127 described above.

A drain electrode 129 is formed on the back surface 110B of the SiC substrate 110 so as to cover the entire region. The drain electrode 129 is an electrode shared by all of the unit cells 118. For example, a stacked structure (Ti/Al) in which titanium (Ti) and aluminum (Al) are stacked in order from the SiC substrate 110 can be exemplified as the drain electrode 129.

When a predetermined voltage (voltage higher than or equal to gate threshold value voltage) is applied to the gate electrode pad 11*g* in a state where a predetermined potential difference is generated between the source electrode pad 11*s* (source wiring 124) and the drain electrode 129 (between source and drain), a channel is formed in the vicinity of the interface with the gate insulating film 120 in the body region 112 by the electric field from the gate electrode 121. Thus, current flows between the source wiring 124 and the drain electrode 129, and the MOSFET 11U is turned on.

Figure 35:
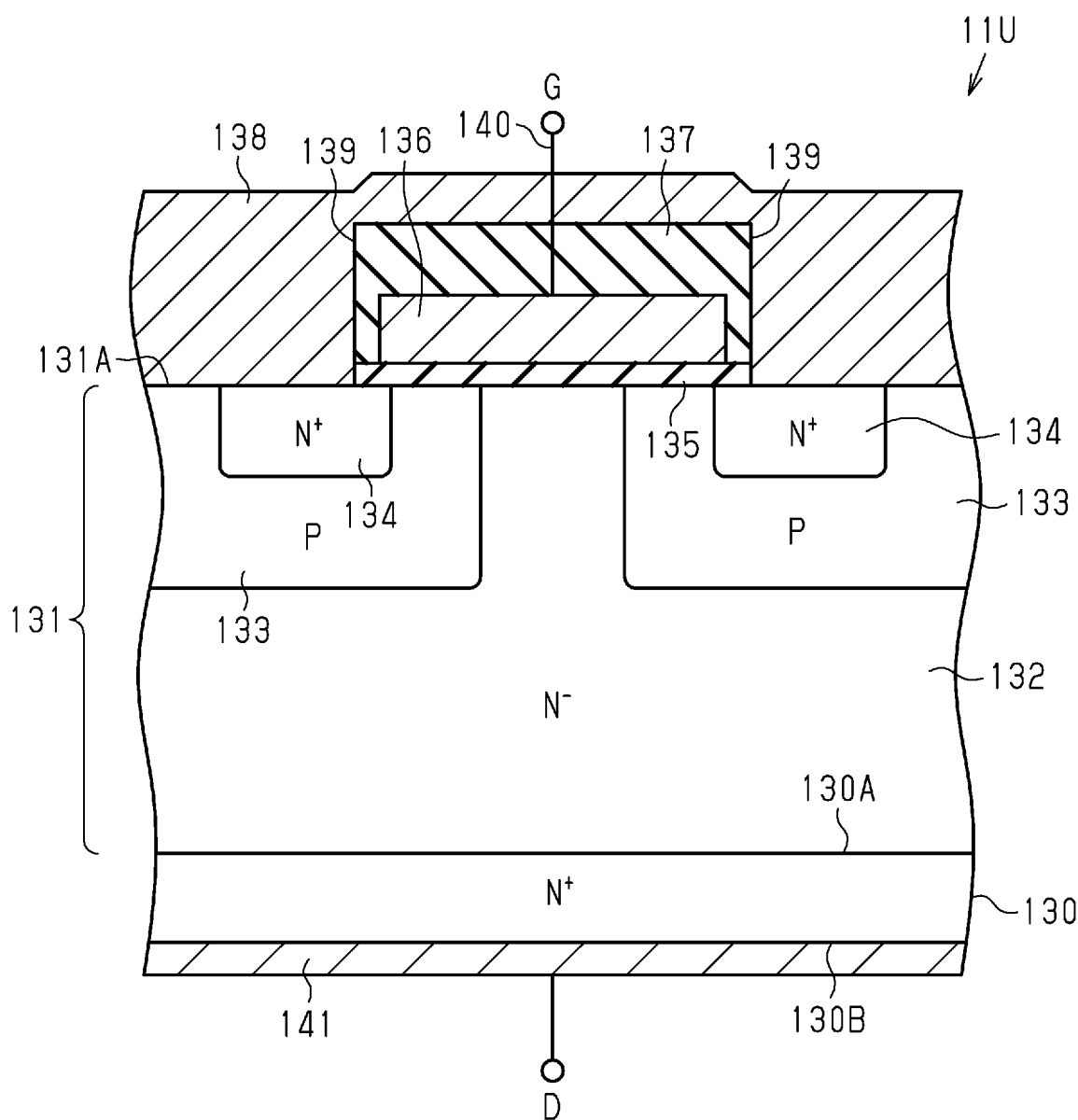
FIG. 35 is a cross-sectional view showing the structure of a MOSFET in accordance with a modified example.

(C2) As shown in FIG. 35, the MOSFET 11U includes the $N^+$ type SiC substrate 130. An N-type epitaxial layer 131 made of SiC doped with an N-type impurity at a lower concentration than the SiC substrate 130 is stacked on the front surface 130A of the SiC substrate 130. The front surface 131A of the epitaxial layer 131 is made of, for example, a (0001) plane of SiC.

An $N^-$ type drain region 132, in which a state after the epitaxial growth is maintained, is formed in the epitaxial layer 131. A P-type body region 133 is formed in the surface layer portion of the epitaxial layer 131. Although not shown in FIG. 35, a plurality of body regions 133 are formed at regular intervals and are extended in the same direction (direction perpendicular to the plane of drawing of FIG. 35) parallel to each other and are arranged, for example, in a stripe or matrix form (rows and columns). The drain region 132 is exposed between adjacent body regions 133. The surface layer portion of the body region 133 includes an N+ type source region 134 spaced apart from the peripheral edge.

A gate insulating film 135 is formed on the front surface 131A of the epitaxial layer 131 so as to extend across the drain region 132, the body region 133, and the source region 134. The gate insulating film 135 is made of, for example, silicon oxide ($SiO_2$). Then, a gate electrode 136 made of polysilicon doped with an N-type impurity at a high concentration is formed on the gate insulating film 135. The gate electrode 136 faces the drain region 132, the body region 133, and the source region 134 with the gate insulating film 135 interposed in between.

An inter-layer insulating film 137 made of silicon oxide ($SiO_2$) is stacked on the epitaxial layer 131. A source wiring 138 is formed on the inter-layer insulating film 137. The source wiring 138 is electrically connected to the body region 133 and the source region 134 through a contact hole 139 formed in the inter-layer insulating film 137.

Gate wiring 140 is electrically connected to the gate electrode 136 through a contact hole (not shown) formed in the inter-layer insulating film 137. Furthermore, a drain electrode 141 is formed on the back surface 130B of the SiC substrate 130.

When the potential of the gate electrode 136 is controlled while applying a positive voltage of an appropriate magnitude to the drain electrode 141, a channel can be formed in the vicinity of the interface with the gate insulating film 135 in the body region 133 by the electric field from the gate electrode 136. Thus, current can flow between the source wiring 138 and the drain electrode 141.

Figure 36:
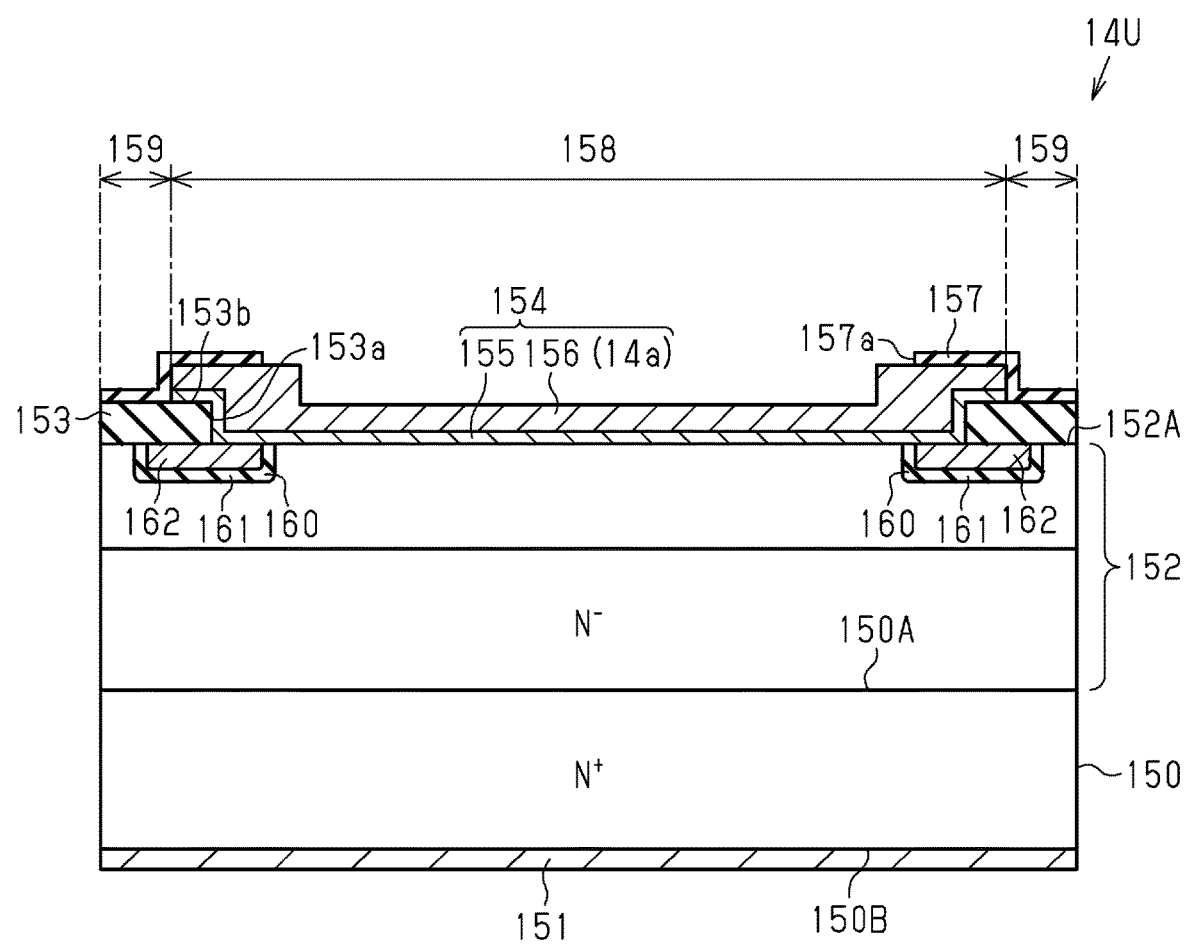
FIG. 36 is a cross-sectional view showing the structure of a diode in accordance with a modified example.

In the fourth and fifth embodiments described above, the structures of the diodes 14U, 14V, 14W and the diodes 15U, 15V, 15W can be changed in any manner. For example, the structures of the diodes 14U, 14V, 14W and the diodes 15U, 15V, 15W may be changed to a planar type structure as shown in FIG. 36. The diodes 14U, 14V, 14W and the diodes 15U, 15V, 15W have the same structure. Thus, the structure of the first diode 14U will now be described below, and the structures of the other diodes 14V, 14W, 15U, 15V, 15W will not be described.

As shown in FIG. 36, the first diode 14U includes a semiconductor substrate 150 made of N+ type (e.g., N-type impurity concentration is 1e18 to 1e21 $cm^{-3}$) silicon (Si). A cathode electrode 151 is formed on the back surface 150B of the semiconductor substrate 150 so as to cover the entire region. The cathode electrode 151 is made of a metal (e.g., gold (Au), nickel (Ni), silicide, cobalt (Co) etc.) in Ohmic contact with the N-type silicon.

An epitaxial layer 152 made of N− type (e.g., N-type impurity concentration is 1e15 to 1e17 $cm^{-3}$) silicon having a lower concentration than the semiconductor substrate 150 is stacked on the front surface 150A of the semiconductor substrate 150. The thickness of the epitaxial layer 152 is, for example, 2 to 10 μm.

A field insulating film 153 made of silicon oxide ($SiO_2$) is stacked on the front surface 152A of the epitaxial layer 152. The thickness of the field insulating film 153 is, for example, greater than or equal to 1000 Å, and preferably 7000 Å to 40,000 Å. The field insulating film 153 may be made of another insulator such as silicon nitride (SiN).

The field insulating film 153 includes an opening 153a for exposing the central portion of the epitaxial layer 152. An anode electrode 154 is formed on the field insulating film 153. The anode electrode 154 fills the inside of the opening 153a of the field insulating film 153 and bulged in the form of a flange toward the outside of the opening 153a so as to cover the peripheral edge portion 153b of the opening 153a in the field insulating film 153 from above. That is, the peripheral edge portion 153b of the opening 153a of the field insulating film 153 is sandwiched by the epitaxial layer 152 and the anode electrode 154 from the upper and lower sides over the entire periphery.

The anode electrode 154 of FIG. 36 has a multilayer structure (two-layer structure in FIG. 36) including a Schottky metal 155 joined to the epitaxial layer 152 in the opening 153a of the field insulating film 153, and an electrode metal 156 stacked on the Schottky metal 155.

The Schottky metal 155 is made of a metal (e.g., titanium (Ti), molybdenum (Mo), palladium (Pd) etc.) which forms a Schottky junction when joined with the N-type silicon. The Schottky metal 155 joined with the epitaxial layer 152 forms a Schottky barrier (potential barrier) of, for example, 0.52 eV to 0.9 eV with the silicon semiconductor forming the epitaxial layer 152. The thickness of the Schottky metal 155 is, for example, 0.02 to 0.20 μm.

The electrode metal 156 is a portion of the anode electrode 154 that is exposed from the outermost surface of the first diode 14U and joined with the first diode wire 65U and the like. That is, the electrode metal 156 forms the anode electrode pad 14a. The electrode metal 156 is made of, for example, aluminum (Al). The thickness of the electrode metal 156 is thicker than that of the Schottky metal 155, and is, for example, 0.5 to 5.0 μm.

A surface protective film 157 made of silicon nitride (SiN) is formed on the outermost surface of the first diode 14U. An opening 157a for exposing the electrode metal 156 is formed in the central portion of the surface protective film 157. The first diode wire 65U and the like are joined to the electrode metal 156 through the opening 157a.

A region where the Schottky metal 155 is in Schottky contact with the front surface 152A of the epitaxial layer 152 of the front surface 152A of the epitaxial layer 152 is defined as an active region 158, and a region surrounding the active region 158 is defined as an outer peripheral region 159. In the surface layer portion of the epitaxial layer 152, an outer peripheral trench 160 dug down from the front surface 152A of the epitaxial layer 152 is formed at the boundary portion between the active region 158 and the outer peripheral region 159. The outer peripheral trench 160 has an annular shape in a plan view, and is formed along the boundary between the active region 158 and the outer peripheral region 159 so as to cross the regions. The bottom surface of the outer peripheral trench 160 includes a flat surface that lies along the front surface 152A of the epitaxial layer 152 and the front surface 150A of the semiconductor substrate 150. Thus, the cross section of the outer peripheral trench 160 has a substantially rectangular shape.

An insulating layer 161 made of, for example, silicon oxide ($SiO_2$) is formed over the entire region of the inner wall surface (side surfaces and bottom surface) of the outer peripheral trench 160. The thickness of the insulating layer 161 is, for example, 0.2 to 0.5 μm.

In the outer peripheral trench 160, a conductor 162 made of polysilicon is provided which is connected to the Schottky metal 155 and faces the entire region of the inner wall surface (including side surfaces and bottom surface) of the outer peripheral trench 160 through the insulating layer 161. The conductor 162 may extend over the entire space in the outer peripheral trench 160 in which the insulating layer 161 is formed or may be a film formed along the inner surface of the insulating layer 161. Thus, the first diode 14U is a planar type Schottky barrier diode in which the front surface of the epitaxial layer 152 to which the Schottky metal 155 is in Schottky contact is flat.

In the second embodiment, the position of the diode 13 in the integrated circuit element 25L can be changed in any manner. The diode 13 is preferably disposed at the periphery of the source ground circuit 21a of each drive circuit 21UL, 21VL, and 21WL. Thus, the length of the limiting wiring 21e connecting the diode 13 and the output wiring 21d of the source ground circuit 21a can be shortened. The diode 13 is more preferably provided between the source ground circuit 21a of each of the drive circuits 21UL, 21VL, and 21WL and the output terminal 25a and the input terminal 25b in the second direction Y. Thus, the length of the limiting wiring 21e can be further shortened. Furthermore, the diode 13 may be provided as a semiconductor chip that differs from the integrated circuit element 25L.

In each of the embodiments described above, the semiconductor device 1 including the MOSFETs 11U to 11W and 12U to 12W of the first inverter circuit 10U, the second inverter circuit 10V, and the third inverter circuit 10W has been described. However, the configuration of the semiconductor device 1 is not limited in such manners. For example, as shown in FIGS. 37 and 38, the semiconductor device 1 may include one inverter circuit.

Figure 37:
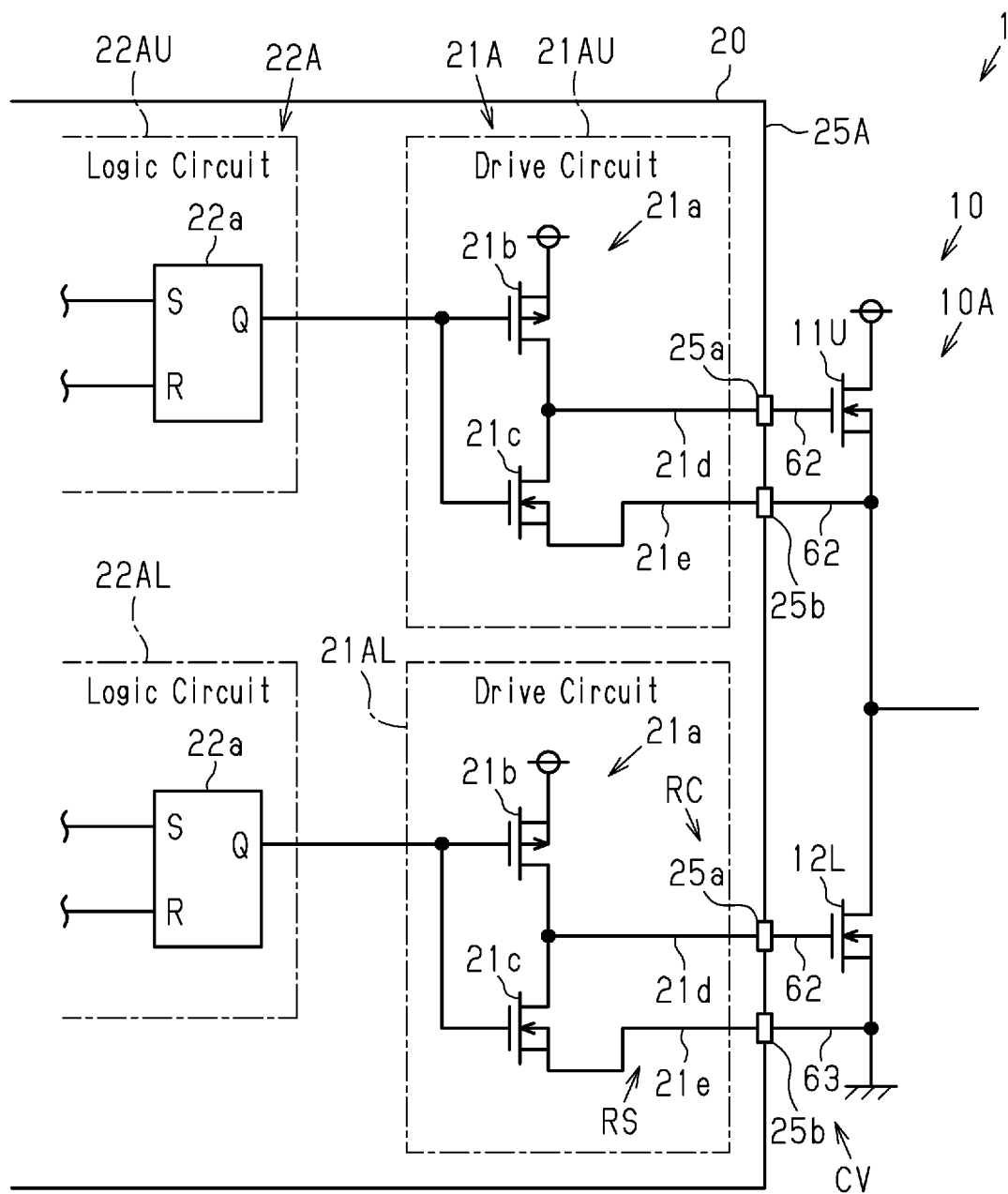
FIG. 37 is a block diagram showing the electrical configuration of a semiconductor device in accordance with a modified example.

More specifically, as shown in FIG. 37, the semiconductor device 1 includes one inverter circuit 10A as the drive unit 10, and one drive circuit 21A and one logic circuit 22A as the control circuit 20. The inverter circuit 10A includes a MOSFET 11U and a MOSFET 12L. The drain of the MOSFET 11U is connected to an external power supply, and the source of the MOSFET 11U is connected to the drain of the MOSFET 12L. The source of the MOSFET 12L is grounded. The drive circuit 21A includes a drive circuit 21AU and a drive circuit 21AL, and the logic circuit 22A includes a logic circuit 22AU and a logic circuit 22AL. The drive circuit 21AU is connected to the gate of MOSFET 11U and outputs a gate drive signal to the gate. The drive circuit 21AL is connected to the gate of the MOSFET 12L and outputs a gate drive signal to the gate. The logic circuit 22AU is connected to the drive circuit 21AU, and the drive circuit 21AU outputs a signal for generating a gate drive signal to the drive circuit 21AU. The logic circuit 22AL is connected to the drive circuit 21AL, and the drive circuit 21AL outputs a signal for generating a gate drive signal to the drive circuit 21AL.

Figure 38:
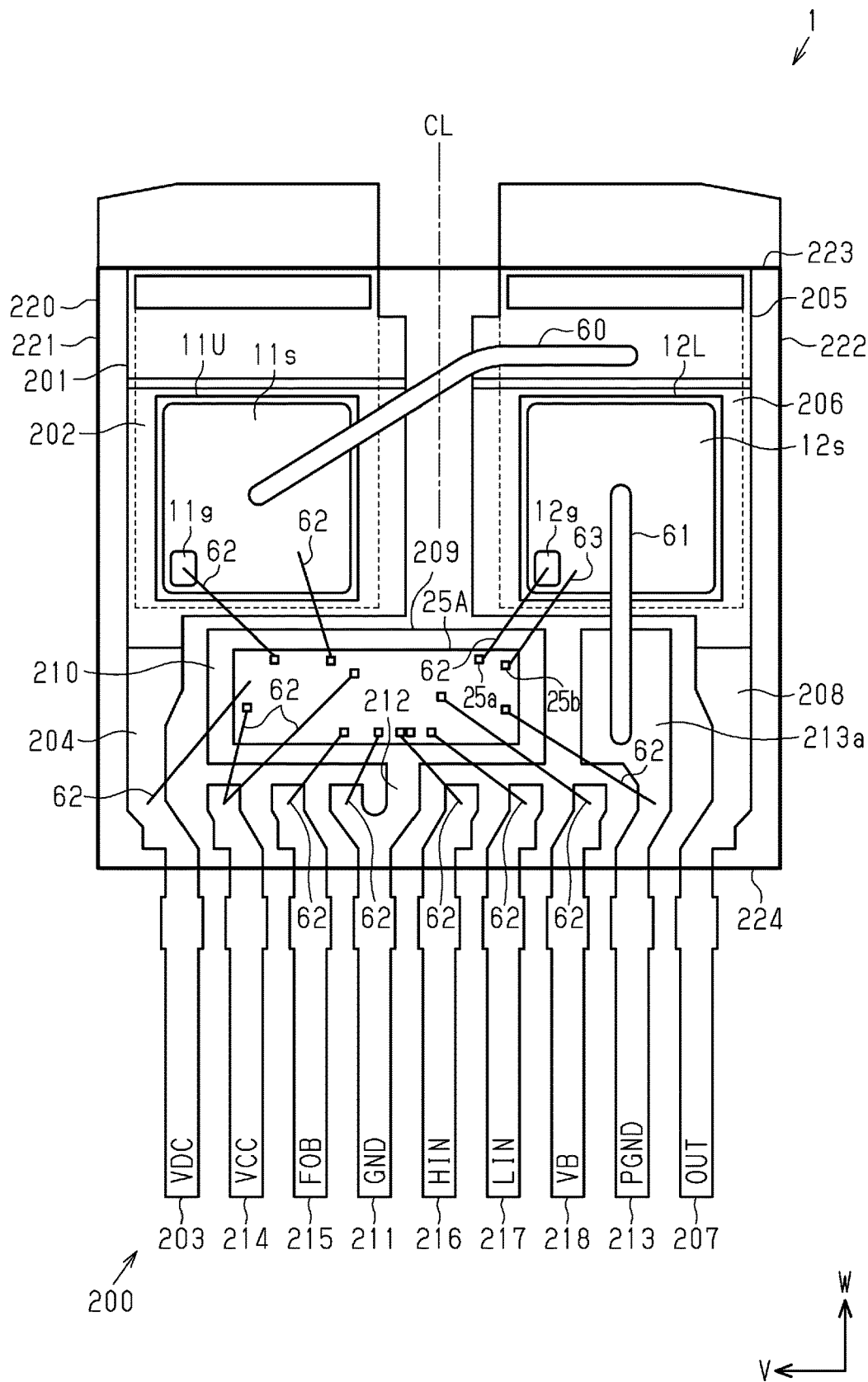
FIG. 38 is a plan view showing the layout inside the semiconductor device of FIG. 37.

As shown in FIG. 38, the semiconductor device 1 includes semiconductor chips, namely, the MOSFET 11U, the MOSFET 12L, and an integrated circuit element 25A including the drive circuit 21A and the logic circuit 22A. The semiconductor device 1 includes a lead 200 and an encapsulation resin 220. The MOSFET 11U, the MOSFET 12L, and the control circuit 20 are mounted on the lead 200. The encapsulation resin 220 for encapsulating the MOSFET 11U, the MOSFET 12L, and the integrated circuit element 25A. The encapsulation resin 220 is formed of, for example, a black epoxy resin, and is formed to a rectangular shape in a plan view. The encapsulation resin 220 includes a first side surface 221 and a second side surface 222, which serve as side surfaces lying in the longitudinal direction, and a third side surface 223 and a fourth side surface 224, which serve as side surfaces lying in the direction orthogonal to the longitudinal direction in a plan view. In the following description, the direction in the longitudinal direction of the encapsulation resin 220 is defined as "the first direction V", and the direction orthogonal to the first direction V in a plan view is defined as "the second direction W".

The lead 200 includes a frame 201, a frame 205, a control frame 209, and first to sixth terminal frames 213 to 218 as a plurality of terminal frames. The frame 201 is disposed on the side of one end (left end in FIG. 35) of the encapsulation resin 220 that is closer to the first side surface 221 in the first direction V, and the frame 205 is disposed on the side of the other end (right end in FIG. 35) of the encapsulation resin 220 that is closer to the second side surface 22s in the first direction V. The frame 201 and the frame 205 are formed so as to be line symmetrical with respect to a center line CL extending in the first direction V at the center of the encapsulation resin 220 in the second direction W. The control frame 209 and the first to sixth terminal frames 213 to 218 are disposed on the side of one end (lower end in FIG. 35) of the encapsulation resin 220 that is closer to the fourth side surface 224 in the first direction V.

The frame 201, which is a lead frame electrically connecting the drain of the MOSFET 11U to an external power supply, configures a VDC terminal. The frame 201 includes an island portion 202, a terminal portion 203, and a connecting portion 204. The island portion 202, the terminal portion 203, and the connecting portion 204 are integrally formed.

The frame 205, which is a lead frame for electrically connecting the drain of the MOSFET 12L and an apparatus or electronic component electrically connected to the semiconductor device 1, configures an output terminal (OUT terminal). The frame 205 includes an island portion 206, a terminal portion 207, and a connecting portion 208. The island portion 206, the terminal portion 207, and the connecting portion 208 are integrally formed.

The island portion 202 of the frame 201 and the island portion 206 of the frame 205 are disposed closer to the third side surface 223 of the encapsulation resin 220 in the second direction W. The island portion 202 of the frame 201 and the island portion 206 are arranged in the second direction W. The island portion 202 and the island portion 206 have a rectangular shape in which the second direction W is a longitudinal direction in a plan view. The island portion 202 and the island portion 206 project out toward the second direction W from the third side surface 223 of the encapsulation resin 220. The island portion 202 and the island portion 206 are line symmetrical with respect to the center line CL.

The connecting portion 204 of the frame 201 extends toward the fourth side surface 224 from the end of the encapsulation resin 220 in the island portion 202 at the first side surface 221 close to the fourth side surface 224. The terminal portion 203 of the frame 201 extends from the connecting portion 204 in the second direction W. The terminal portion 203 and the connecting portion 204 are disposed closer to the first side surface 221 of the encapsulation resin 220 than the frame 205, the control frame 209, and the first to sixth terminal frames 213 to 218.

The connecting portion 208 of the frame 205 extends toward the fourth side surface 224 from the end of the encapsulation resin 220 in the island portion 206 at the second side surface 222 close to the fourth side surface 224. The terminal portion 207 of the frame 205 extends from the connecting portion 208 in the second direction W. The terminal portion 207 and the connecting portion 208 are disposed closer to the second side surface 222 of the encapsulation resin 220 than the frame 201, the control frame 209, and the first to sixth terminal frames 213 to 218.

The control frame 209 and the first to sixth terminal frames 213 to 218 are disposed closer to the fourth side surface 224 of the encapsulation resin 220 than the island portion 202 of the frame 201 and the island portion 206 of the frame 205 in the second direction W, and are disposed between the connecting portion 204 of the frame 201 and the connecting portion 208 of the frame 205 in the second direction W.

The control frame 209, which is a lead frame for grounding the integrated circuit element 25A, configures a GND terminal. The control frame 209 includes an island portion 210, a terminal portion 211, and a connecting portion 212. The island portion 210, the terminal portion 211, and the connecting portion 212 are integrally formed.

The island portion 210 is rectangular in which the first direction V is a longitudinal direction. The island portion 210 is disposed closer to the first side surface 221 of the encapsulation resin 220 in the first direction V. The island portion 210 is disposed at a position that differs from the island portion 202 of the frame 201 and the island portion 206 of the frame 205 in the second direction W. Specifically, the island portion 210 is disposed closer to the fourth side surface 224 of the encapsulation resin 220 than the island portion 202 and the island portion 206. Further, the island portion 210 is disposed at a position overlapping the island portion 202 and the island portion 206 when viewed in the second direction W. The island portion 210 is disposed closer to the connecting portion 204 of the frame 201 than the connecting portion 208 of the frame 205 in the second direction W.

The connecting portion 212 of the control frame 209 extends substantially from the center of the island portion 210 in the first direction V toward the fourth side surface 224 of the encapsulation resin 220. The terminal portion 211 of the control frame 209 extends in the second direction W from the end of the connecting portion 212 close to the fourth side surface 224 of the encapsulation resin 220.

The first terminal frame 213 is a lead frame for grounding the source of the MOSFET 12L, and configures a PGND terminal. The second terminal frame 214 configures a VCC terminal which is an application terminal of the power supply voltage VCC. The third terminal frame 215 configures a power supply detection terminal (FOB terminal) for detecting a state in which a voltage applied to the OUT terminal (frame 205) is short-circuited to a high voltage application terminal (or a corresponding high potential terminal). The fourth terminal frame 216 configures an HIN terminal. A gate drive signal voltage applied to the HIN terminal is input to the gate of the MOSFET 11U from a gate drive circuit (not shown) outside the semiconductor device 1. The fifth terminal frame 217 configures a LIN terminal. A gate drive signal voltage applied to the LIN terminal is input to the gate of the MOSFET 12L from the gate drive circuit. The sixth terminal frame 218 configures a VB terminal which is an application terminal of a boost voltage VB obtained by boosting the power supply voltage VCC.

The first terminal frame 213 and the fourth to sixth terminal frames 216 to 218 are disposed between the connecting portion 212 of the control frame 209 and the connecting portion 208 of the frame 205 in the first direction V. The second terminal frame 214 and the third terminal frame 215 are disposed between the connecting portion 212 of the control frame 209 and the connecting portion 204 of the frame 201 in the first direction V.

The first terminal frame 213 includes a rectangular island portion 213a in which the second direction W is a longitudinal direction. The island portion 213a is disposed between the island portion 210 of the control frame 209 and the connecting portion 208 of the frame 205 in the first direction V. The island portion 213a is disposed so as to be adjacent to the island portion 206 of the frame 205 in the second direction W. The fourth to sixth terminal frames 216 to 218 are disposed closer to the fourth side surface 224 of the encapsulation resin 220 than the island portion 210 of the control frame 209 and the island portion 213a of the first terminal frame 213 in the second direction W. The second terminal frame 214 and the third terminal frame 215 are disposed closer to the fourth side surface 224 of the encapsulation resin 220 than the island portion 210 of the control frame 209.

The MOSFET 11U is mounted on a portion closer to the fourth side surface 224 of the encapsulation resin 220 in the island portion 202 of the frame 201 by solder or the like. That is, the drain of the MOSFET 11U is electrically connected to the island portion 202 of the frame 201. The MOSFET 11U is disposed such that the gate electrode pad 11g is located closer to the first side surface 221 and the fourth side surface 224 of the encapsulation resin 220.

The MOSFET 12L is mounted on a portion closer to the fourth side surface 224 of the encapsulation resin 220 in the island portion 206 of the frame 205 by solder or the like. That is, the drain of the MOSFET 12L is electrically connected to the island portion 206 of the frame 205. The MOSFET 12L is disposed such that its gate electrode pad 12g is close to the MOSFET 11U and the fourth side surface 224 of the encapsulation resin 220. That is, in FIG. 35, the orientation (arrangement position) of the MOSFET 11U and the orientation (arrangement position) of the MOSFET 12L are the same.

The integrated circuit element 25A is mounted on the island portion 210 of the control frame 209 by solder or the like. The integrated circuit element 25A is disposed closer to the MOSFET 11U than the MOSFET 12L in the second direction W.

The source electrode pad 11s of the MOSFET 11U and the frame 205 are electrically connected by the wire 60. Thus, the source of the MOSFET 11U and the drain of the MOSFET 12L are electrically connected. The wire 60 is connected to a portion closer to the third side surface 223 of the encapsulation resin 220 than the MOSFET 12L in the island portion 206 of the frame 205. The source electrode pad his of the MOSFET 11U and the integrated circuit element 25A are connected by the wire 62, and the gate electrode pad 11g of the MOSFET 11U and the integrated circuit element 25A are connected by the wire 62. The control wire 62 connected to the gate electrode pad 11g is disposed closer to the first side surface 221 of the encapsulation resin 220 than the wire 63 which is an example of the limiting wire connected to the source electrode pad 11s.

The source electrode pad 12s of the MOSFET 12L and the island portion 213a of the first terminal frame 213 are electrically connected by the wire 61. The wire 61 is connected to the island portion 213a of the first terminal frame 213. The gate electrode pad 12g of the MOSFET 12L and the integrated circuit element 25A are connected by the wire 62, and the source electrode pad 12s of the MOSFET 12L and the integrated circuit element 25A are connected by the sense wire 63. The wire 62 connected to the gate electrode pad 12g is disposed closer to the MOSFET 11U than the wire 63 connected to the source electrode pad 12s. The wire 63 is connected to the source of the second MOSFET 21*c* of the source ground circuit 21*a* in the drive circuit 21AL in the integrated circuit element 25A through the limiting wiring 21*e* (see FIG. 37). This obtains advantage (1-1) of the first embodiment.

The integrated circuit element 25A is connected to the frame 201, the control frame 209, and the first to sixth terminal frames 213 to 218 by the wires 62. Specifically, the integrated circuit element 25A and the connecting portion 204 of the frame 201 are connected by one wire 62. The integrated circuit element 25A and the connecting portion 212 of the control frame 209 are connected by one wire 62. The integrated circuit element 25A and a portion closer to the fourth side surface 224 of the encapsulation resin 220 than the island portion 213*a* in the first terminal frame 213 are connected by one wire 62. The integrated circuit element 25A and the second terminal frame 214 are connected by two wires 62. The third to sixth terminal frames 215 to 218 are each connected by one wire 62 to the integrated circuit element 25A.

As shown in FIGS. 37 and 38, the semiconductor device 1 includes a limiting unit CV that reduces fluctuation of the source-gate voltage of the MOSFET 12L based on the voltage fluctuation of the source of the MOSFET 12L. The limiting unit CV includes a limiting path RS that electrically connects the control path RC and the source of the MOSFET 12L. The limiting path RS includes a wire 63 connecting the source electrode pad 12*s* of the MOSFET 12L and the input terminal 25*b* of the integrated circuit element 25A, and limiting wiring 21*e* of the drive circuit 21AL. That is, the wire 63 forms part of the limiting path RS.

Furthermore, the semiconductor device 1 electrically connects the drive circuit 21AL and the gate of the MOSFET 12L and includes a control path RC (see FIG. 37) that transmits a drive signal of the drive circuit 21AL. The control path RC includes a wire 62, which connects the gate electrode pad 12*g* of the MOSFET 12L and the output terminal 25*a* of the integrated circuit element 25A, and output wiring 21*d* of the drive circuit 21AL. That is, the wire 62, which connects the gate electrode pad 12*g* of the MOSFET 12L and the output terminal 25*a*, forms part of the control path RC.

In the modified example shown in FIG. 38, a diode 13 may be added between the wire 62 connected to the source electrode pad 12*s* of the MOSFET 12L and the output wiring 21*d* of the drive circuit 21AL. This obtains advantage (2-1) of the second embodiment. The diode 13 may be provided inside the integrated circuit element 25A or be provided as a semiconductor chip separate from the integrated circuit element 25A.

Figure 39:
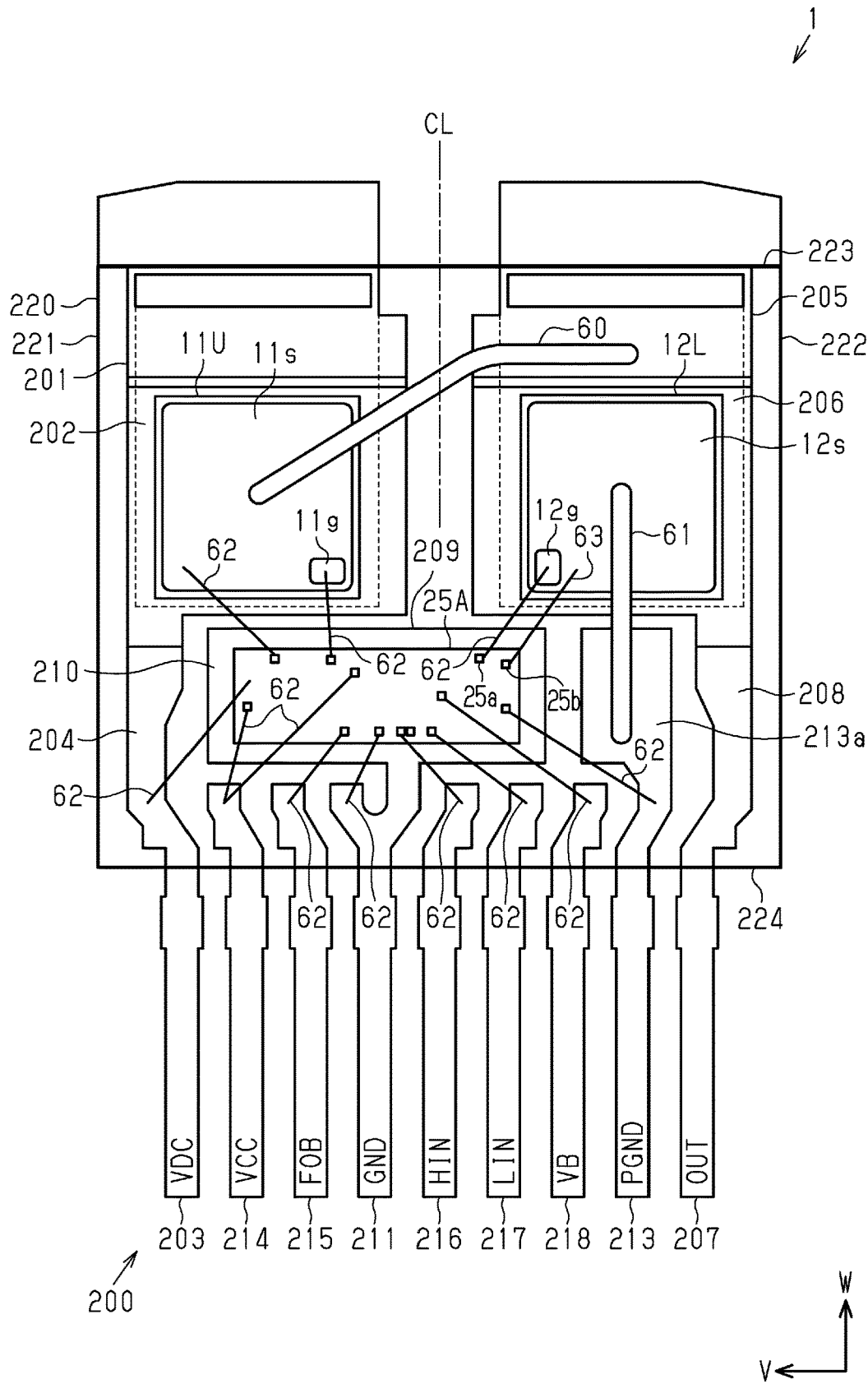
FIG. 39 is a plan view showing the layout inside a semiconductor device in accordance with a modified example.

In the modified example shown in FIG. 38, the orientations of the MOSFETs 11U and 12L can be changed in any manner. In one example, as shown in FIG. 39, the orientation of the MOSFET 11U is changed such that the gate electrode pad 11*g* of the MOSFET 11U approaches the control circuit 20. More specifically, the MOSFET 11U is disposed such that the gate electrode pad 11*g* of the MOSFET 11U is located close to the control circuit 20 and the MOSFET 12L on the front surface of the MOSFET 11U. In this case, the wire 62 connecting the control circuit 20 and the gate electrode pad 11*g* of the MOSFET 11U is disposed closer to the MOSFET 12L than the wire 62 connecting the control circuit 20 and the source electrode pad 11*s* of the MOSFET 11U. In the modified example shown in FIG. 39, the wire 62 connecting the source electrode pad 12*s* of the MOSFET 12L and the control circuit 20 may be omitted.

In each of the embodiments described above, the orientation (arrangement position) of the frames 31 of the MOSFETs 11U to 11W with respect to the island portion 31*a* can be changed in any manner. For example, the orientation (arrangement position) of the MOSFET 11U may be changed such that the gate electrode pad 11*g* of the MOSFET 11U approaches the integrated circuit element 25H. According to this configuration, the advantage of the third embodiment can be obtained.

The technical ideas which can be recognized from each of the embodiments described above and each of the modified examples described above will now be described.

Embodiment 1

A semiconductor device comprising:
an inverter circuit including
a first switching element supplied with a power supply voltage, and
a second switching element including
a first terminal connected to the first switching element,
a second terminal connected to ground, and
a control terminal;
a first control circuit that controls the first switching element;
a second control circuit that controls the second switching element; and
a limiting unit that reduces fluctuation in voltage between the second terminal and the control terminal based on voltage fluctuation at the second terminal of the second switching element.

Embodiment 2

The semiconductor device according to embodiment 1, further comprising:
an integrated circuit element spaced apart from the inverter circuit, wherein the second control circuit is mounted on the integrated circuit, and the integrated circuit includes an output terminal and an input terminal electrically connected to the second control circuit
a control wire that electrically connects the control terminal and the output terminal, and
the limiting unit includes a limiting wire that is separate from the control wire and electrically connected to the input terminal and the second terminal.

Embodiment 3

The semiconductor device according to embodiment 2, wherein the second control circuit includes a drive signal output circuit that outputs a drive signal, the semiconductor device comprising
a control path that electrically connects the drive signal output circuit and the control terminal and transmits the drive signal, wherein
the limiting unit includes a limiting path that electrically connects the control path and the second terminal of the second switching element,
the control wire forms part of the control path, and
the limiting wire forms part of the limiting path.

Embodiment 4

The semiconductor device according to embodiment 3, wherein the control path is provided in the integrated circuit element and includes output wiring that electrically connects the drive signal output circuit and the output terminal, and the limiting path is provided in the integrated circuit element and includes limiting wiring that electrically connects the input terminal of the integrated circuit element and the output wiring.

Embodiment 5

The semiconductor device according to embodiment 3 or 4, wherein the limiting unit includes a diode provided in the limiting path, the diode has an anode electrically connected to the second terminal of the second switching element, and the diode has a cathode electrically connected to the drive signal output circuit.

Embodiment 6

The semiconductor device according to embodiment 5 depending on embodiment 4, wherein the diode is mounted on the integrated circuit element and provided in the limiting wiring.

Embodiment 7

The semiconductor device according to embodiment 6, wherein the diode is disposed in a periphery of the drive signal output circuit in the integrated circuit element.

Embodiment 8

The semiconductor device according to embodiment 7, wherein the second control circuit further includes a logic circuit that controls the drive signal output circuit, in the integrated circuit element, the drive signal output circuit is disposed closer to the second switching element than the logic circuit, and the diode is disposed closer to the second switching element than the drive signal output circuit.

Embodiment 9

The semiconductor device according to any one of embodiments 2 to 8, wherein the second switching element includes a ground electrode pad serving as the second terminal and a control electrode pad serving as the control terminal, the control wire is connected to the output terminal of the integrated circuit element and the control electrode pad, and the limiting wire is connected to the ground electrode pad and the input terminal of the integrated circuit element.

Embodiment 10

The semiconductor device according to embodiment 9, wherein a power wire that connects the ground electrode pad to the ground is connected to the ground electrode pad, and the limiting wire has a smaller diameter than the power wire.

Embodiment 11

The semiconductor device according to embodiment 10, wherein the limiting wire is connected to an area closer to the integrated circuit element than an area in the ground electrode pad where the power wire is connected in a plan view.

Embodiment 12

The semiconductor device according to any one of embodiments 1 to 11, wherein the inverter circuit includes a first inverter circuit, a second inverter circuit, and a third inverter circuit connected in parallel to one another, the limiting unit includes a first limiting unit, a second limiting unit, and a third limiting unit the first limiting unit reduces fluctuation in voltage between the second terminal and the control terminal of the second switching element in the first inverter circuit based on a voltage fluctuation at the second terminal of the second switching element in the first inverter circuit, the second limiting unit reduces fluctuation in voltage between the second terminal and the control terminal of the second switching element in the second inverter circuit based on a voltage fluctuation at the second terminal of the second switching element in the second inverter circuit, and the third limiting unit reduces fluctuation in voltage between the second terminal and the control terminal of the second switching element in the third inverter circuit based on a voltage fluctuation at the second terminal of the second switching element in the third inverter circuit.

Embodiment 13

The semiconductor device according to embodiment 12, wherein the second control circuit is mounted on an integrated circuit element;

the second control circuit includes a third control circuit that controls a second switching element of the first inverter circuit, a fourth control circuit that controls a second switching element of the second inverter circuit, and a fifth control circuit that controls a second switching element of the third inverter circuit, the second switching element of the first inverter circuit, the second switching element of the second inverter circuit, and the second switching element of the third inverter circuit are each rectangular in a plan view and include a ground electrode pad serving as the second terminal and a control electrode pad serving as the control terminal, and the integrated circuit element includes a first input terminal and a first output terminal electrically connected to the third control circuit, a second input terminal and a second output terminal electrically connected to the fourth control circuit, and a third input terminal and a third output terminal electrically connected to the fifth control circuit, the semiconductor device comprising:

a first frame on which a second switching element of the first inverter circuit is mounted;

a second frame on which a second switching element of the second inverter circuit is mounted;

a third frame on which a second switching element of the third inverter circuit is mounted;
a first control wire that connects the control electrode pad of the second switching element of the first inverter circuit and the first output terminal;
a first limiting wire that connects the ground electrode pad of the second switching element of the first inverter circuit and the first input terminal;
a second control wire that connects the control electrode pad of the second switching element of the second inverter circuit and the second output terminal;
a second limiting wire that connects the ground electrode pad of the second switching element of the second inverter circuit and the second input terminal;
a third control wire that connects the control electrode pad of the second switching element of the third inverter circuit and the third output terminal; and
a third limiting wire that connects the ground electrode pad of the second switching element of the third inverter circuit and the third input terminal,
the first frame, the second frame, and the third frame are spaced apart from one another and are lined along a layout direction of the third control circuit, the fourth control circuit, and the fifth control circuit such that the first frame and the third frame sandwich the second frame, and
the second frame is disposed such that the second frame faces the integrated circuit element in a direction orthogonal to the layout direction in a plan view.

Embodiment 14

The semiconductor device according to embodiment 13, wherein
the control electrode pad of the second switching element of each of the first inverter circuit, the second inverter circuit, and the third inverter circuit is formed at any one of four corners of the second switching element in a plan view, and
at least one of the second switching element of the first inverter circuit and the second switching element of the third inverter circuit is disposed in an arrangement position different from an arrangement position of the second switching element of the second inverter circuit such that the control electrode pad of the second switching element approaches the integrated circuit element.

Embodiment 15

A semiconductor device comprising:
an inverter circuit including
 a first switching element supplied with a power supply voltage, and
 a second switching element including
  a first terminal connected to the first switching element,
  a second terminal connected to ground, and
  a control terminal; and
a limiting unit that reduces fluctuation in potential at the second terminal of the second switching element when the first switching element is turned on.

Embodiment 16

The semiconductor device according to embodiment 15, comprising:
a frame serving as the ground, wherein
the limiting unit includes a second diode, a second power wire, and a second diode wire,
the second diode is separate from the second switching element and includes a cathode electrically connected to the first terminal of the second switching element and an anode electrically connected to the frame,
the second diode wire electrically connects the second terminal of the second switching element and the frame, and
the second diode wire electrically connects the anode of the second diode and the frame.

Embodiment 17

The semiconductor device according to embodiment 16, wherein the second diode is a Schottky barrier diode.

Embodiment 18

The semiconductor device according to embodiment 16 or 17, wherein the second power wire and the second diode wire are connected to the frame at different positions.

Embodiment 19

The semiconductor device according to any one of embodiments 16 to 18, wherein the first switching element includes a first terminal supplied with a power supply voltage and a second terminal connected to the first terminal of the second switching element, the semiconductor device further comprising:
a first diode, wherein the first diode is separated from the first switching element and includes a cathode electrically connected to the first terminal of the first switching element and an anode electrically connected to the second terminal of the first switching element.

Embodiment 20

The semiconductor device according to embodiment 19, further comprising:
a lead frame on which the second switching element and the second diode are mounted, and to which the first terminal of the second switching element and the cathode of the second diode are electrically connected;
a first power wire that electrically connects the second terminal of the first switching element and the lead frame; and
a first diode wire that electrically connects the anode of the first diode and the lead frame.

Embodiment 21

The semiconductor device according to embodiment 20, wherein the first power wire and the first diode wire are connected to the lead frame at different positions.

Embodiment 22

The semiconductor device according to any one of embodiments 15 to 21, wherein
the inverter circuit includes a first inverter circuit, a second inverter circuit, and a third inverter circuit connected in parallel to one another,
the limiting unit includes a first limiting unit, a second limiting unit, and a third limiting unit the first limiting unit reduces fluctuation in a potential of a second terminal of a second switching element of the first inverter circuit at a time when the first switching element of the first inverter circuit is turned on, the second limiting unit reduces fluctuation in a potential of the second terminal of the second switching element of the second inverter circuit at a time when a first switching element of the second inverter circuit is turned on, and the third limiting unit reduces fluctuation in a potential of a second terminal of a second switching element of the third inverter circuit when the first switching element of the third inverter circuit is turned on.

Embodiment 23

The semiconductor device according to embodiment 22, further comprising:
a second diode separate from the second switching element and including a cathode electrically connected to the first terminal of the second switching element and an anode electrically connected to a frame serving as the ground; and
a lead frame on which the second switching element and the second diode are mounted and electrically connected to the first terminal of the second switching element and the cathode of the second diode, wherein
the lead frame includes a first frame, a second frame, and a third frame,
the second diode includes a sixth diode, a seventh diode, and an eighth diode,
the sixth diode includes a cathode that is electrically connected to the first terminal of the second switching element of the first inverter circuit and an anode that is electrically connected to the second terminal of the second switching element,
the seventh diode includes a cathode that is electrically connected to the first terminal of the second switching element of the second inverter circuit and an anode electrically connected to the second terminal of the second switching element,
the eighth diode includes a cathode that is electrically connected to the first terminal of the second switching element of the third inverter circuit and an anode that is electrically connected to the second terminal of the second switching element,
the second switching element of the first inverter circuit and the sixth diode are mounted on the first frame,
the second frame is spaced apart from the first frame,
the second switching element of the second inverter circuit and the seventh diode are mounted on the second frame,
the third frame is spaced apart from the first frame and the second frame,
the second switching element of the third inverter circuit and the eighth diode are mounted on the third frame,
the frame includes a first ground frame, a second ground frame, and a third ground frame spaced apart from one another,
the first limiting unit includes
the sixth diode,
a fourth power wire that electrically connects the second terminal of the second switching element of the first inverter circuit and the first ground frame, and
a fourth diode wire that electrically connects the anode of the sixth diode and the first ground frame, the second limiting unit includes
the seventh diode,
a fifth power wire that electrically connects the second terminal of the second switching element of the second inverter circuit and the second ground frame, and
a fifth diode wire that electrically connects the anode of the seventh diode and the second ground frame, and the third limiting unit includes
the eighth diode,
a sixth power wire that electrically connects the second terminal of the second switching element of the third inverter circuit and the third ground frame, and
a sixth diode wire that electrically connects the anode of the eighth diode and the third ground frame.

Embodiment 24

The semiconductor device according to embodiment 23, further comprising:
a third diode separate from the first switching element of the first inverter circuit and including a cathode electrically connected to the first terminal of the first switching element and an anode electrically connected to the second terminal of the first switching element;
a first power wire that electrically connects the second terminal of the first switching element of the first inverter circuit and the first frame;
a fourth diode separate from the first switching element of the second inverter circuit and including a cathode electrically connected to the first terminal of the first switching element and an anode electrically connected to the second terminal of the first switching element;
a second power wire that electrically connects the second terminal of the first switching element of the second inverter circuit and the second frame;
a fifth diode separate from the second switching element of the third inverter circuit, and including a cathode electrically connected to the first terminal of the second switching element and an anode electrically connected to the second terminal of the second switching element; and
a third power wire that electrically connects the second terminal of the first switching element of the third inverter circuit and the third frame.

Embodiment 25

The semiconductor device according to embodiment 24, further comprising:
a first diode wire that electrically connects the anode of the third diode and the first frame;
a second diode wire that electrically connects the anode of the fourth diode and the second frame; and
a third diode wire that electrically connects the anode of the fifth diode and the third frame.

Embodiment 26

The semiconductor device according to any one of embodiments 1 to 25, wherein a current flowing to the second switching element is less than 30 A.

Embodiment 27

The semiconductor device according to any one of embodiments 1 to 26, wherein the second switching element is a SiC MOSFET.

DESCRIPTION OF REFERENCE CHARACTERS 1) semiconductor device; 10A) inverter circuit; 10U) first inverter circuit; 10V) second inverter circuit; 10W) third inverter circuit; 11) first switching element; 11U, 11V, 11W) MOSFET (first switching element); 12) second switching element; 12U, 12V, 12W) MOSFET (second switching element); 12s) source electrode pad (ground electrode pad); 12g) gate electrode pad (control electrode pad); 13) diode; 14U) first diode (second diode, sixth diode); 14V) second diode (second diode, seventh diode); 14W) third diode (second diode, eighth diode); 15U) first diode (first diode, third diode); 15V) second diode (first diode, fourth diode); 15W) third diode (first diode, fifth diode); 21) drive circuit (drive signal output circuit); 21UU) drive circuit (first control circuit); 21VU) drive circuit (first control circuit); 21WU) drive circuit (first control circuit); 21UL) drive circuit (second control circuit, third control circuit); 21VL) drive circuit (second control circuit, fourth control circuit); 21WL) drive circuit (second control circuit, fifth control circuit); 21a) source ground circuit; 21d) output wiring; 21e) limiting wiring; 22) logic circuit; 22UU) logic circuit (first control circuit); 22VU) logic circuit (first control circuit); 22WU) logic circuit (first control circuit); 22UL) logic circuit (second control circuit, third control circuit); 22VL) logic circuit (second control circuit, fourth control circuit); 22WL) logic circuit (second control circuit, fifth control circuit); 25L) integrated circuit element (integrated circuit element of second control circuit); 25a) output terminal; 25au) first output terminal (output terminal); 25au) second output terminal (output terminal); 25aw) third output terminal (output terminal); 25b) input terminal; 25bu) first input terminal (input terminal); 25bv) second input terminal (input terminal); 25bw) third input terminal (input terminal); 32U) first frame; 32V) second frame; 32W) third frame; 35U) frame (ground frame, first ground frame); 35V) frame (ground frame, second ground frame); 35W) frame (ground frame, third ground frame); 60) wire; 60U) first wire (first power wire); 60V) second wire (second power wire); 60W) third wire (third power wire); 61) wire; 61U) first wire (fourth power wire); 61V) second wire (fifth power wire); 61W) third wire (sixth power wire); 62) control wire; 62U) first wire; 62V) second wire; 62W) third wire; 63) wire (limiting wire); 63U) first wire (first limiting wire); 63V) second wire (second limiting wire); 63W) third wire (third limiting wire); 64U) first diode wire (fourth diode wire); 64V) second diode wire (fifth diode wire); 64W) third diode wire (sixth diode wire); 65U) first diode wire; 65V) second diode wire; 65W) third diode wire; RC) control path; RC1) first control path; RC2) second control path; RC3) third control path; RS) limiting path; RS1) first limiting path; RS2) second limiting path; RS3) third limiting path; CV) limiting unit; CV1) first limiting unit; CV2) second limiting unit; CV3) third limiting unit; CP1) first limiting unit; CP2) second limiting unit; CP3) third limiting unit

The invention claimed is:

1. A semiconductor device comprising:
   an insulated substrate having a front surface and a back surface;
   a first conductive layer arranged on the front surface of the insulated substrate;
   a switching element arranged on a front surface of the first conductive layer;
   a first lead terminal electrically connected to the first conductive layer and/or the switching element;
   a second conductive layer arranged above the front surface of the insulated substrate;
   an integrated circuit element arranged on a front surface of the second conductive layer and controlling an operation of the switching element;
   a second lead terminal electrically connected to the integrated circuit and arranged away from the first conductive layer; and
   an encapsulation resin that encapsulates the switching element, the integrated circuit element, and at least a part of the insulated substrate; wherein
   the integrated circuit element is arranged at a position that differs from a position of the switching element in a thickness direction of the semiconductor device.

2. The semiconductor device according to claim 1, wherein the second conductive layer is arranged such that a part of the second conductive layer overlap with the insulated substrate in a plan view.

3. The semiconductor device according to claim 2, wherein the first conductive layer is joined with the insulated substrate by an adhesive, and the second conductive layer is arranged at a position that is away from the insulated substrate in the thickness direction of the semiconductor device.

4. The semiconductor device according to claim 1, further comprising:
   a first wire connected to a front surface electrode of the switching element and the first lead terminal; and
   a second wire that electrically connects between the integrated circuit element and the switching element, wherein
   a material of the first wire differs from a material of the second wire.

5. The semiconductor device according to claim 4, wherein the first wire is made of aluminum, and the second wire is made of gold or copper.

6. The semiconductor device according to claim 1, wherein the insulated substrate is made of ceramic.

7. The semiconductor device according to claim 1, wherein the first lead terminal extends to directly connect with the first conductive layer.

8. The semiconductor device according to claim 1, wherein the switching element includes a high-voltage side switching element and a low-voltage side switching element that are connected in series between a first power source including one end to which a high voltage is connected and a second power source including one end to which a low voltage is connected.

9. The semiconductor device according to claim 8, wherein the integrated circuit element includes a first integrated circuit element that controls an operation of the high-voltage side switching element and a second integrated circuit element that controls an operation of the low-voltage side switching element.

10. The semiconductor device according to claim 9, wherein the semiconductor device further comprises a boot diode electrically connected to the first integrated circuit element.

11. The semiconductor device according to claim 9, wherein
   the second lead terminal is one of a plurality of second lead terminals, at least a part of the second lead terminals are electrically connected to the first integrated circuit element, and the encapsulation resin includes a recess arranged between the second lead terminals that are electrically connected to the first integrated circuit element.

12. The semiconductor device according to claim 1, wherein the switching element is one of a plurality of switching elements, each of the switching elements has an orientation and an arrangement position, and at least one of (a) the orientation of at least one of the switching elements differs from the orientation of the other switching element and (b) the arrangement position of at least one of the switching elements differs from the arrangement position of the other switching element is satisfied.

13. The semiconductor device according to claim 1, wherein the first lead terminal is one of a plurality of first lead terminals, and an outer one of the first lead terminals includes a portion that is covered with the encapsulation resin and extends toward inside of the semiconductor device.

14. The semiconductor device according to claim 1, wherein the switching element is a silicon carbide MOSFET.

15. The semiconductor device according to claim 1, wherein the first lead terminal separates from the first conductive layer.

\* \* \* \* \*